United States Patent
Yang et al.

(10) Patent No.: US 11,306,983 B2
(45) Date of Patent: Apr. 19, 2022

(54) SINGLE AND MULTI-LAYER MESH STRUCTURES FOR ENHANCED THERMAL TRANSPORT

(71) Applicant: The Regents of the University of Colorado, a body corporate, Denver, CO (US)

(72) Inventors: Ronggui Yang, Boulder, CO (US); Rongfu Wen, Boulder, CO (US); Shanshan Xu, Canton, MI (US); Yung-Cheng Lee, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 17/251,127

(22) PCT Filed: Jun. 11, 2019

(86) PCT No.: PCT/US2019/036516
§ 371 (c)(1),
(2) Date: Dec. 10, 2020

(87) PCT Pub. No.: WO2019/241223
PCT Pub. Date: Dec. 19, 2019

(65) Prior Publication Data
US 2021/0131753 A1    May 6, 2021

Related U.S. Application Data

(60) Provisional application No. 62/814,066, filed on Mar. 5, 2019, provisional application No. 62/683,362, filed on Jun. 11, 2018.

(51) Int. Cl.
*F28F 13/18*    (2006.01)
*F25B 39/04*    (2006.01)
(Continued)

(52) U.S. Cl.
CPC ............ *F28F 13/182* (2013.01); *F25B 39/04* (2013.01); *F28D 15/046* (2013.01); *F28F 13/185* (2013.01); *H01L 23/427* (2013.01)

(58) Field of Classification Search
CPC ...... F28F 13/182; F28F 13/185; F28F 21/081; F25B 39/04; F28D 15/046; F28D 15/0283; F28D 15/04; H01L 23/427
(Continued)

(56) References Cited

U.S. PATENT DOCUMENTS 5,692,095 A    11/1997    Koung
7,871,578 B2*   1/2011    Schmidt ............... B01J 19/0093
                                              422/198
(Continued)

FOREIGN PATENT DOCUMENTS

CN    1672258 A    9/2005
CN    1887037 A    12/2006
(Continued)

OTHER PUBLICATIONS

Adera et al., "Design of Micropillar Wicks for Thin-Film Evaporation", "International Journal of Heat and Mass Transfer", 2016, pp. 280-294, vol. 101, Publisher: Elsevier.
(Continued)

*Primary Examiner* — Jon T. Schermerhorn, Jr.
(74) *Attorney, Agent, or Firm* — Neugeboren O'Dowd PC

(57) ABSTRACT

This disclosure describes single and multi-layer woven meshes designed to enable sucking flow condensation and capillary-driven liquid film boiling, respectively, for instance, in use in heat spreaders. The single-layer woven meshes can include a nanostructure coating and a hydrophobic coating, while the multi-layer meshes can include a microcavity coating and optionally a hydrophilic coating.

20 Claims, 39 Drawing Sheets

(51) Int. Cl.
  H01L 23/427    (2006.01)
  F28D 15/04     (2006.01)
(58) Field of Classification Search
  USPC .................................................. 165/104.21
  See application file for complete search history.

(56) References Cited

U.S. PATENT DOCUMENTS

| | | | |
|---|---|---|---|
| 9,250,025 | B2* | 2/2016 | Lee .................. F28D 15/046 |
| 2004/0104012 | A1 | 6/2004 | Zhou et al. |
| 2006/0090882 | A1 | 5/2006 | Sauciuc |
| 2006/0124280 | A1* | 6/2006 | Lee ................ F28D 15/0233 |
| | | | 165/104.26 |
| 2007/0107875 | A1* | 5/2007 | Lee ................ F28D 15/0233 |
| | | | 165/104.26 |
| 2008/0210407 | A1* | 9/2008 | Kim ................. F28D 15/046 |
| | | | 165/104.26 |
| 2010/0084113 | A1* | 4/2010 | Lee .................. F28D 15/046 |
| | | | 165/46 |
| 2011/0017431 | A1 | 1/2011 | Ronggui et al. |
| 2011/0210458 | A1 | 9/2011 | Brodbeck et al. |
| 2016/0076820 | A1* | 3/2016 | Lewis ............... F28D 15/046 |
| | | | 165/104.26 |
| 2017/0299277 | A1 | 10/2017 | Yang et al. |

FOREIGN PATENT DOCUMENTS

| | | |
|---|---|---|
| CN | 205579718 U | 9/2016 |
| CN | 106871675 A | 6/2017 |

OTHER PUBLICATIONS

Andrukh et al., "Meniscus Formation in a Capillary and the Role of Contact Line Friction", "Soft Matter", 2014, pp. 1-7, Publisher: Royal Society of Chemistry.

Attinger et al., "Surface Engineering for Phase Change Heat Transfer: a Review", "MRS Energy and Sustainability", Sep. 2014, pp. 1-85.

Bar-Cohen et al., "Thermal Management of On-Chip Hot Spot", "Journal of Heat Transfer", May 2012, pp. 1-11, vol. 134, Publisher: ASME.

Bodla et al., "Evaporation Analysis in Sintered Wick Microstructures", "International Journal of Heat and Mass Transfer", 2013, pp. 1-42, Publisher: CTRC Research Publications.

Cho et al., "Nanoengineered Materials for Liquidvapour Phase-Change Heat Transfer", "Nature Reviews", 2016, pp. 1-17, vol. 2, No. 16092, Publisher: Macmillian Publishers Limited.

Coso et al., "Enhanced Heat Transfer in Biporous Wicks in the Thin Liquid Film Evaporation and Boiling Regimes", "Journal of Heat Transfer", Oct. 2012, pp. 101501-1-101501-11, vol. 134, Publisher: ASME.

Copenhaver, Blaine R., "International Search Report Regarding International Application No. PCT/2019/036516", Aug. 26, 2019, p. 7, Published in: US.

Dai et al., "Micromembrane-Enhanced Capillary Evaporation", "International Journal of Heat and Mass Transfer", 2013, pp. 1101-1108, vol. 64, Publisher: Elsevier.

Dhillon et al., "Critical Heat Flux Maxima During Boiling Crisis on Textured Surfaces", "Nature Communications", Sep. 8, 2015, pp. 1-12, Publisher: Macmillan Publishers Limited.

Duan et al., "Evaporation-Induced Cavitation in Nanofluidic Channels", "PNAS", Mar. 6, 2012, pp. 3688-3693, vol. 109, No. 10.

Hanks et al., "Nanoporous Membrane Device for Ultra High Heat Flux Thermal Management", "Micorsystems & Nanoengineering", 2018, pp. 1-10, vol. 4, No. 1.

Ji et al., "Switchable Heat Transfer Mechanisms of Nucleation and Convection by Wettability Match of Evaporator and Condenser for Heat Pipes: Nanostructured Surface Effect", "Nano Energy", Jun. 2017, pp. 313-325, vol. 38, Publisher: Elsevier.

Jia et al., "Rich Mesostructures Derived From Natural Woods for Solar Steam Generation", "Joule", Nov. 15, 2017, pp. 588-599, vol. 1, Publisher: Elsevier Inc.

Li et al., "Evaporation/Boiling in Thin Capillary Wicks (I)—Wick Thickness Effects", "Journal of Heat Transfer", Dec. 2006, pp. 1312-1319, vol. 128, Publisher: ASME.

Li et al., "Exploring Ultimate Water Capillary Evaporation in Nanoscale Conduits", "Nano Letters", Jul. 18, 2017, pp. 4813-4819, Publisher: American Chemical Society.

Liu et al., "Solar Water Evaporation by Black Photthermal Sheets", "Nano Energy", Sep. 2017, pp. 1-52.

Lu et al., "An Ultrathin Nanoporous Membrane Evaporator", "Nano Letters", Sep. 2017, pp. 6217-6220, vol. 17, No. 10, Publisher: American Chemical Society.

Mahian et al., "Nanofluids Effects on the Evaporation Rate in a Solar Still Equipped With a Heat Exchanger", "Nano Energy", Apr. 2017, pp. 134-155, vol. 36, Publisher: Elsevier.

Montazeri et al., "Microscopic Analysis of Thin-Film Evaporation on Spherical Pore Surfaces", "International Journal of Heat and Mass Transfer", 2018, pp. 59-68, vol. 122, Publisher: Elsevier.

Narayanan et al., "Gas-Assisted Thin-Film Evaporation From Confined Spaces for Dissipation of High Heat Fluxes", "Nanoscale and Microscale Thermophysical Engineering", 2009, pp. 30-53, vol. 13, No. 1, Publisher: Taylor & Francis.

Ni et al., "Steam Generation Under one sun Enabled by a Floating Structure With Thermal Concentration", "Nature Energy", Sep. 2016, pp. 1-7, vol. 1.

Plawsky et al., "Nano and Microstructure for Thin-Film Evaporation—A Review", "Nanoscale and Microscale Thermophysical Engineering", 2014, pp. 251-269, vol. 18, Publisher: Taylor & Francis.

Ranjan et al., "Analysis of the Wicking and Thin-Film Evaporation Characteristics of Microstructures", "Journal of Heat Transfer", Oct. 2009, pp. 101001-1-101001-11, vol. 131, Publisher: ASME.

Ranjan et al., "Assessment of Nanostructured Capillary Wicks for Passive Two-Phase Heat Transport", "Nanoscale and Microscale Thermaophysical Engineering", 2011, pp. 179-194, vol. 15, Publisher: Taylor & Francis.

Roth et al., "Capillary Evaporation in Pores", "Journal of Physics: Condensed Matter", 2006, pp. 6517-6530, vol. 18, Publisher: Institute of Physics Publishing.

Semenic et al., "Use of Biporous Wicks to Remove High Heat Fluxes", "Applied Thermal Engineering", 2008, pp. 278-283, vol. 28, Publisher: Elsevier.

Sharma et al., "Evaporation Rate of Water in Hydrophobic Confinement", "PNAS", Mar. 20, 2012, pp. 4365-4370, vol. 109, No. 12.

Stark et al., "An R&D Strategy to Decouple Energy From Water", "Joule", Nov. 15, 2017, pp. 416-420, vol. 1, Publisher: Esevier Inc.

Wang et al., "Wettability Modification to Further Enhance the Pool Boiling Performance of the Micro Nano Bi-Porous Copper Surface Structure", "International Journal of Heat and Mass Transfer", 2018, pp. 333-342, vol. 119.

Wang et al., "Ultrahigh Flux Thin Film Boiling HEA Transfer Through Nanoporous Membranes", "Nano Letters", 2018, pp. 3096-3103, vol. 18, Publisher: ACS Publications.

Weibel et al., "Visualization of Vapor Formation Regimes During Capillary-Fed Boiling in Sintered-Powder Heat Pipe Wicks", "International Journal of Heat and Mass Transfer", 2012, pp. 1-36, Publisher: CTRC Research Publications.

Weibel et al., "Characterization of Evaporation and Boiling From Sintered Powder Wicks fed by Capillary Action", "International Journal of Heat and Mass Transfer", 2010, pp. 4204-4215, vol. 53, Publisher: Elsevier.

Wen et al., "Capillary-Driven Liquid Film Boiling Heat Transfer on Hybrid Mesh Wicking Structures", "Nano Energy", Jun. 21, 2018, pp. 373-382, vol. 51.

Wen et al., "Droplet Departure Characteristic and Dropwise Condensation Heat Transfer at low Steam Pressure", "Journal of Heat Transfer", Jul. 2016, pp. 071501-1-071501-8, vol. 138, Publisher: ASME.

(56) References Cited

OTHER PUBLICATIONS

Wen et al., "Enhanced Bubble Nucleation and Liquid Rewetting for Highly Efficient Boiling Heat Transfer on Two-Level Hierarchical SUR", "Nano Energy", May 2017, pp. 59-65, vol. 38, Publisher: Elsevier.

Wen et al., "Sustaining Enhanced Condensation on Hierarchical Mesh-Covered Surfaces", "National Science Review", Sep. 13, 2018, pp. 878-887, vol. 5.

Wilke et al., "Parametric Study of Thin Film Evaporation From Nanoporous Membranes", "Applied Physics Letters", 2017, pp. 171603-1-171603-5, vol. 111, Publisher: AIP Publishing.

Xiao et al., "Negative Pressures in Nanoporous Membranes for Thin Film Evaporation", "Applied Physics Letters", 2013, pp. 1-5, vol. 102, No. 123103.

Xue et al., "Water-Evaporation Induced Electricity With Nanostructured Carbon Materials", "Nature Nanotechnology", Apr. 2017, pp. 1-6, vol. 12.

Yu et al., "Synchrotron X-Ray Imaging Visualization Study of Capillary-Induced Flow and Critical Heat Flux on Surfaces With Engineered Micropillars", "Science Advances", Feb. 23, 2018, pp. 1-10, vol. 4.

Zhao et al., "Measurement Techniques for Thermal Conductivity and Interfacial Thermal Conductance of Bulk and Thin Film Materials", "J. Electron. Packag.", 2016, pp. 1-64, vol. 138.

Zhao et al., "Highly Efficient Solar Vapour Generation Via Hierarchically Nanostructured Gels", "Nature Nanotechnology", Jun. 2018, pp. 489-495, vol. 13.

CNIPA, "First Office Action Regarding Chinese Application No. 201980039624.5", dated Jan. 26, 2022, pp. 31, Published in: CN.

EPO, "Extended European Search Report Regarding Application No. 19819926.7", dated Feb. 18, 2022, pp. 8, Published in: EP.

\* cited by examiner

A  Commercial copper mesh

B  Superhydrophobic hi-mesh

C  Nanostructures on mesh

A

B

C

SINGLE AND MULTI-LAYER MESH STRUCTURES FOR ENHANCED THERMAL TRANSPORT

CLAIM OF PRIORITY UNDER 35 U.S.C. § 119

The present Application for Patent is a national stage application of International Application No. PCT/US19/36516 entitled "SINGLE AND MULTI-LAYER MESH STRUCTURES FOR ENHANCED THERMAL TRANSPORT" filed Jun. 11, 2019, which claims priority to Provisional Application No. 62/683,362 entitled "SINGLE AND MULTI-LAYER MESH STRUCTURES FOR ENHANCED THERMAL TRANSPORT" filed Jun. 11, 2018, and Provisional Application No. 62/814,066 entitled "THIN FILM BOILING ENABLED ULTRA-HIGH CONDUCTANCE AND HIGH FLUX HEAT SPREADS" filed Mar. 5, 2019, which are assigned to the assignee hereof and hereby expressly incorporated by reference herein.

FIELD OF THE DISCLOSURE

The present disclosure relates generally to thermal transport structures. In particular, but not by way of limitation, the present disclosure relates to systems, methods, and apparatuses for micro-mesh structures that enhance thermal transport via phase-change processes such as condensation or evaporation/boiling.

DESCRIPTION OF RELATED ART

Condensation

Condensation is a ubiquitous phase-change phenomenon that is of vital importance in a broad range of industrial applications such as thermal power generation, water desalination and treatment, chemical processing, and thermal management of electronics. It is well known that dropwise condensation on hydrophobic surfaces (FIG. 1 and FIG. 3A), where the frequent roll-off of condensed droplets, e.g. on a vertical surface due to gravity, helps to refresh the surface for exposing to vapor and has an order of magnitude higher heat transfer efficiency than that of filmwise condensation on hydrophilic surfaces (FIG. 3B). Enhancing dropwise condensation by surface topology modification and coatings has thus been of great interest since its discovery. However, the long-standing challenge for better heat transfer performance is to improve simultaneously both surface refreshing and droplet growth on the same surface. Compared to other water-repellent nanostructured materials for improving self-cleaning and anti-fogging, it is extremely challenging to create large-area structured surfaces cost-effectively on high thermal conductivity substrates to fulfill both fluid mechanics and thermal requirements.

Boiling and Evaporation

Evaporation is a ubiquitous phase-change phenomenon that is of vital importance in a broad range of industrial applications. Many of these thermal systems with high power density require the removal of large amounts of heat to maintain adequate performance and to ensure system reliability. For a given temperature difference between the solid surface and the liquid, defined as superheat, capillary evaporation on wicking structures can dissipate up to two orders-of-magnitude larger heat flux when compared to single-phase liquid convection. During capillary evaporation (FIG. 2), heat is conducted through the saturated wicking structures and dissipated at the liquid-vapor interface through liquid vaporization. Most of the heat is dissipated through evaporation of thin liquid film (a few micrometers in thickness) near the tri-phase contact line. To improve heat dissipation rate, the meniscus area and thin film region can be increased by extending the specific surface area for evaporation through utilizing high porosity materials, such as micro/nano-membranes.

Ultra-thin wicking structures offer an avenue to enhance evaporation heat transfer coefficient (HTC) by increasing the interfacial area for evaporation and reducing the conduction resistance of the liquid film. The capillary-driven mass flow rate of the liquid supply plays a critical role in the critical heat flux (CHF) where a thick and high permeability wicking structure is desirable. This, on the other hand, increases the thermal resistance for heat transferring through the saturated wicking structures to the evaporation front, and thus reducing the HTC. Apparently, these approaches based on pure thin film evaporation suffer from intrinsic tradeoffs between the required high wicking flow rate for liquid supply and the low thermal resistance for heat flow to the evaporation front, which makes it challenging to optimize both the CHF and HTC on the same wicking structure. Moreover, most of the known wicking structures require delicate nanofabrication, which is challenging to cost-effectively scale.

Heat Spreaders

Breakthroughs in many of today's cutting-edge electronic and photonic applications are becoming increasingly dependent on the ability to dissipate an enormous amount of waste heat generated in extremely small areas. Thermal management challenges in electronics arise primarily from the exponential increase of power densities and non-uniform distribution of heat sources, with sub-millimeter hotspots with ultra-high heat fluxes in excess of $10^3$ W/cm$^2$ over a planar area of smaller than 10 mm$^2$. Heat spreaders are widely used to dissipate heat and to reduce hotspot temperature. The common heat spreader materials are copper and aluminum, while commercially available expensive alternatives include diamond, SiC, and composites such as diamond/AlN/Mo substrates, which are limited to special applications. The search for ultra-high thermal conductivity materials with a thermal conductivity higher than copper (400 W/mK), including diamond and BAs, has been a long pursuit.

Passive two-phase heat spreaders such as heat pipes and vapor chambers, enabled by efficient liquid-vapor phase-change processes taking advantage of latent heat but without requiring power input, are attractive due to their high performance but potentially low-cost. However, the passive strategies in common two-phase heat spreaders based on liquid film evaporation are limited by capillary dry-out, a phenomenon that occurs when a capillary pumping capability of the wicking structure cannot overcome the viscous flow resistance. A considerable amount of bi-porous wicking structures have been developed to address the conflicting demands on large capillarity and high permeability, however, liquid film evaporation is still limited by the liquid supply and the thermal resistance through the saturated wicking structures. Even for water, the highest performance fluid with high surface energy and high latent heat relative to its viscosity, the CHF and HTC of thin film evaporation are far below the requirements of high-power electronics.

As seen, while the above-noted phase-change heat transfer processes can be put into practice with costly and small-scale micro and nanofabrication techniques, means are needed to allow new phase-change heat transfer schemes, including efficient sucking flow condensation and capillary liquid film boiling to be implemented in practical and scalable systems.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Some embodiments of the disclosure may be characterized as a single-layer mesh system for vapor condensation. The system can include a woven mesh, an interconnected microchannel, and a thin hydrophobic coating. The woven mesh can be bonded onto a thermally conducting substrate and having a plurality of nanostructured features to increase condensation nucleation sites. The interconnected microchannel can be formed between the woven mesh and the substrate for the sucking flow of liquid condensate to be removed from the surface. The thin hydrophobic coating covering the surface of the mesh layer and the substrate. Thermal transport from the vapor outside the mesh to the substrate is increased via sucking flow condensation in a wide range of surface subcooling.

Other embodiments of the disclosure may also be characterized as a multi-layer mesh system for capillary thin film boiling. The system can include three or more layers of woven mesh, multi-layer interconnected microchannels, and microchannels comprising mesh pores. The layers of woven mesh can be bonded to each other and to a thermally conducting substrate and can have a plurality of microstructured features to increase boiling nucleation sites. The multi-layer interconnected microchannels can be formed within the three or more layers and between the mesh and the substrate for capillary liquid wicking. The microchannels can comprise mesh pores in the three or more layers, the mesh pores arranged substantially perpendicularly to a surface of the substrate for vapor to escape from the multi-layer mesh system. A critical heat flux and a heat transfer coefficient are increased via capillary liquid film boiling with an onset of nucleate boiling at a small surface superheat.

Other embodiments of the disclosure can be characterized as a multi-layer mesh system with gradient channels for capillary liquid film boiling enhancement. The system can include three or more layers of woven mesh, multi-layer interconnected microchannels, and self-aligned gradient microchannels. The three or more layers of woven mesh can have increasing mesh pore size and can be bonded to each other and to a thermally conducting substrate. They can have a plurality of microstructured features to increase boiling nucleation sites. The multi-layer interconnected microchannels can be formed within the three or more layers and between the mesh and the substrate for capillary liquid wicking. Each of the self-aligned gradient microchannels can include mesh pores of increasing size from the three or more layers. The microchannels can be arranged substantially perpendicularly to a surface of the substrate to promote vapor escape from the multi-layer mesh system. A critical heat flux and a heat transfer coefficient are further increased via capillary liquid film boiling enhancement with accelerated vapor escape for delaying surface dry out.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

DETAILED DESCRIPTION

Figure 1:
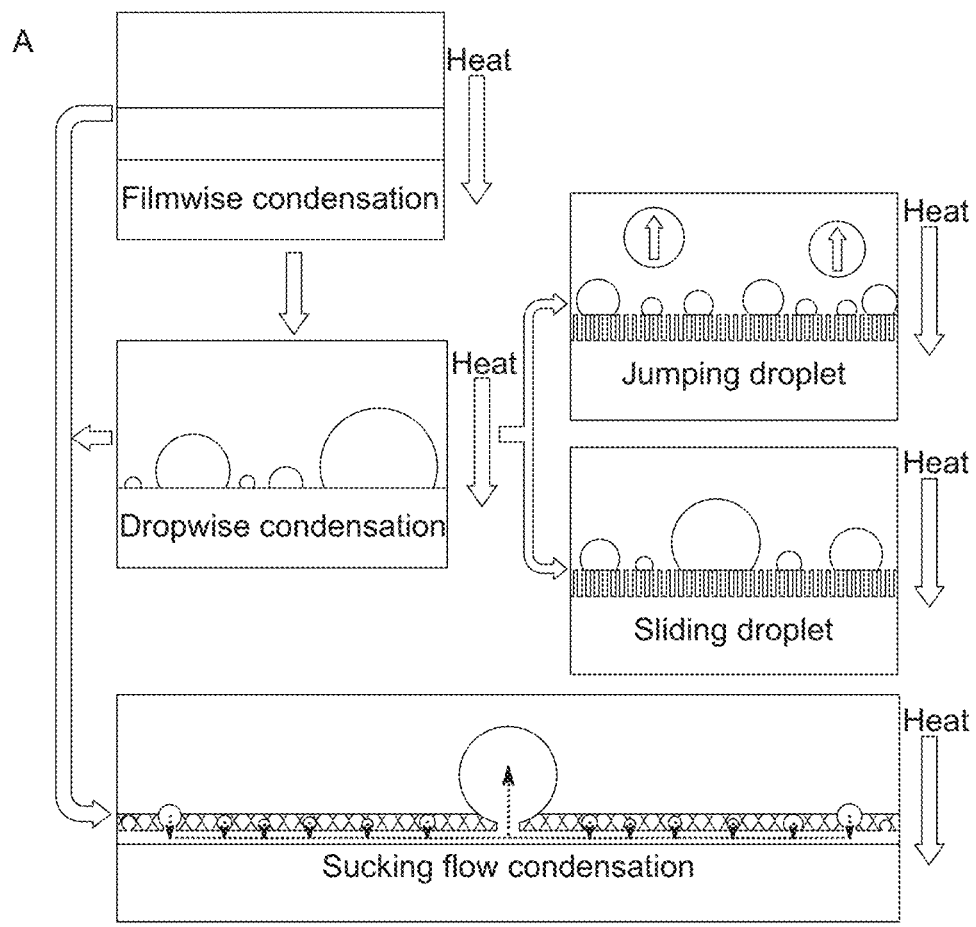
FIG. 1A illustrates various condensation heat transfer modes.
FIG. 1B illustrates a chart comparing the heat transfer coefficient and practical achievability of the condensation schemes shown in FIG. 1A.
Figure 1:
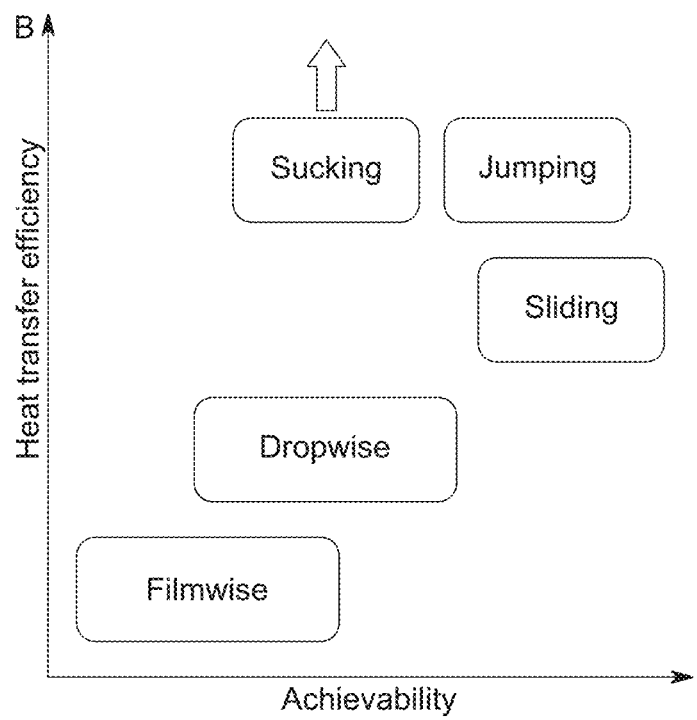

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods, and computer program products according to various embodiments of the present invention. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

DEFINITIONS

For the purposes of this disclosure, a "mesh" is a single-layer structure that has not been bonded to a substrate and has not been processed to form micro/nanostructures on the surface.

For the purposes of this disclosure, a "mesh-covered surface" describes a structure comprising the mesh bonded to a substrate.

For the purposes of this disclosure, a "hi-mesh surface" describes a mesh-covered surface that has been processed to form nanostructures on all surfaces of the substrate and the mesh, and further processed via hydrophobic functionalization to form a self-assembled hydrophobic coating.

For the purposes of this disclosure, a "thick mesh", or "thick mesh wicking structure," will refer to any mesh having 3 or more layers, or a mesh with any number of layers that achieves predominantly liquid film boiling rather than pure capillary evaporation.

For the purposes of this disclosure, a "hybrid mesh wicking structure" is a mesh-covered surface having microcavities on surfaces of the mesh and optionally the substrate, for instance, formed via nanostructure growth followed by etching or removing of the nano structures.

For the purposes of this disclosure, a "micro-grad-mesh" is a hybrid mesh where each mesh layer has increasing mesh pore size and is stacked and bonded onto the substrate from the bottom to top, such that gradient channels (expanding from the first toward the second surface or side of the hybrid mesh) are formed perpendicular to the substrate by self-aligned overlap.

For the purposes of this disclosure, a "porous" material includes any material having micropores between two opposing sides that promote liquid wicking between the two sides and also includes variations in the two surfaces that allow liquid flow along a surface of the porous material that is adjacent to a substrate. Meshes of various topologies represent one example of a porous material, and though meshes are frequently referred to in this disclosure, other porous materials having the above structure can also be implemented.

Single Layer Micro-Mesh Surfaces for Sucking Flow Condensation

Intro

Some condensation heat transfer modes are illustrated in FIG. 1A along with a chart, FIG. 1B, comparing the heat transfer coefficient and practical achievability of different condensation schemes shown in FIG. 1A. This portion of the disclosure describes structures and method of fabrication for practically achieving sucking flow condensation.

While the use of closely-packed (e.g., <25 nm spacing) hydrophilic gold nanowires with hydrophobic ends can promote droplet coalescence by a liquid film in the nanowires (i.e., droplets can merge via the liquid film without direct contact), the effective distance of this coalescence between droplets is less than 100 µm. The present disclosure, in contrast, uses a hi-mesh surface or other microporous materials to achieve an effective distance of larger than 2 mm for droplet coalescence via the sucking flow of a liquid film, thus achieving far larger heat transfer enhancement.

In particular, this disclosure describes the use of a single-layer hi-mesh or other microporous material (see 1502 in FIG. 1), having nanostructures thereon, for condensation heat transfer enhancement. In some embodiments, the nanostructures can have a hydrophobic coating. This structure enables "sucking flow condensation" to remove condensate liquid in contact with a thermal output or heat sink (e.g., the substrate 1510), along a first surface 1504 of the single layer 1502 in a liquid film followed by sucking flow of the liquid film through the single layer 1502 to a second side 1506 where droplets 1508 form and expand, eventually falling off from the second side 1506 via the force of gravity. The falling droplets carry thermal energy with them, which can be deposited at a thermal output. An interconnected microchannel 1520 is formed between the woven mesh 1502 and the substrate 1510 for the sucking flow of liquid condensate to be removed from the surface.

Figure 3:
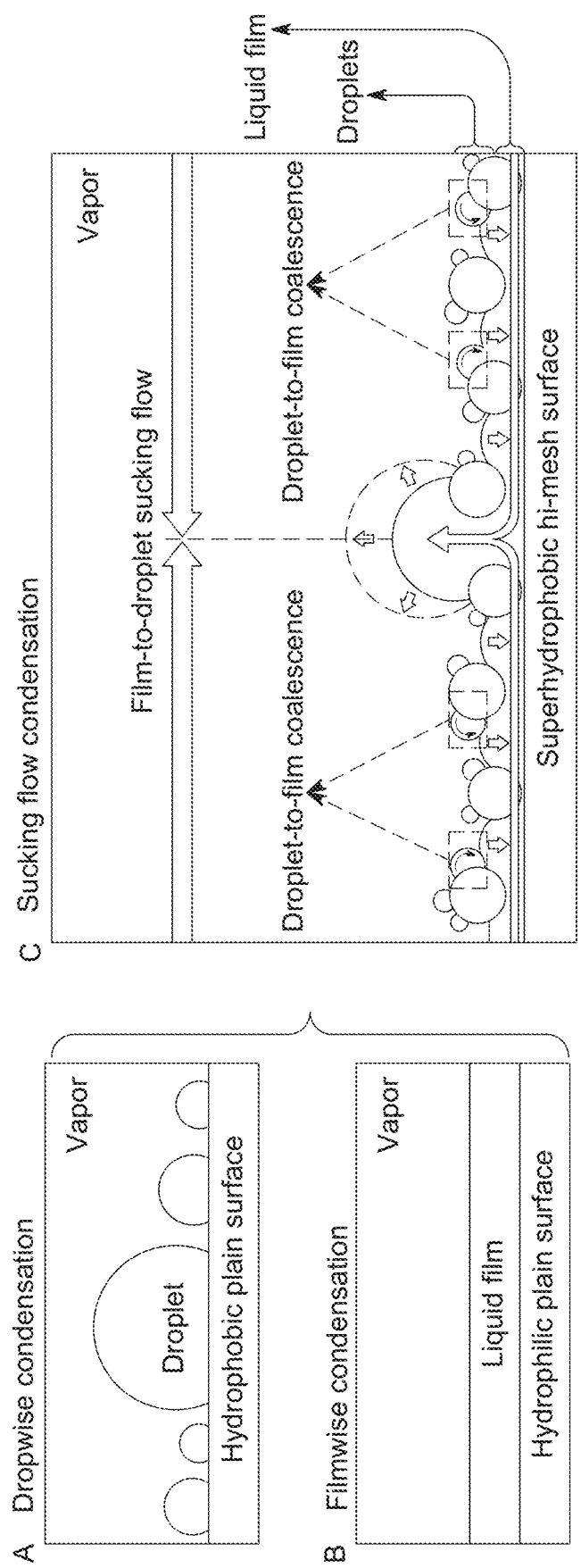
FIG. 3A shows a diagrammatic representation of dropwise condensation.
FIG. 3B shows a diagrammatic representation of filmwise condensation.
FIG. 3C shows a diagrammatic representation of sucking flow condensation.

In some embodiments, the single layer can be formed from a micromesh (e.g., micro woven mesh) such as a copper or other metal mesh having high thermal conductivity. However, the heat transfer mechanism is primarily the removal of condensate liquid from the surface, not only the conduction through the mesh layer, and thus mesh or porous material selection will focus more on surface wettability than thermal conduction. Brass, bronze, aluminum, and steel are just a few other preferable materials. When an appropriate mesh or porous layer is used, droplet growth and surface refreshing are expedited as shown in FIG. 3C.

Structure

Figure 4:
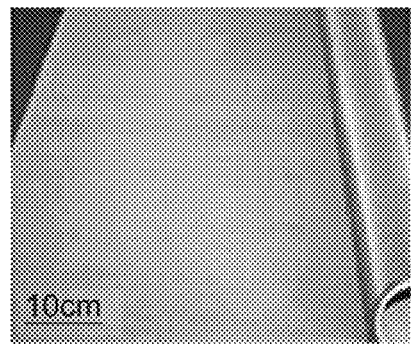
FIG. 4 shows photographs and SEM images of a commercial copper mesh (a), a superhydrophobic hi-mesh (b), and nanostructures (c) on the hi-mesh of (b)
Figure 4:
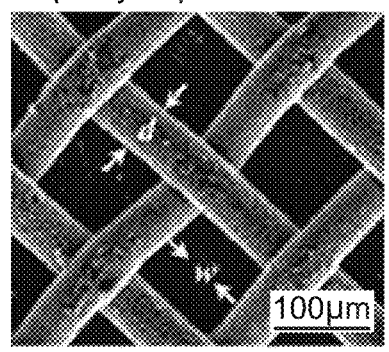
Figure 4:
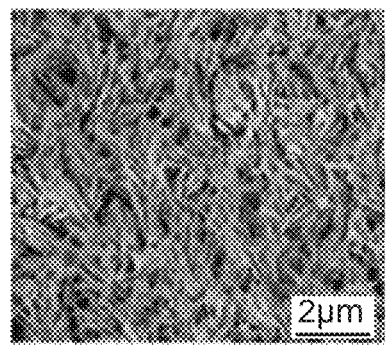
Figure 5:
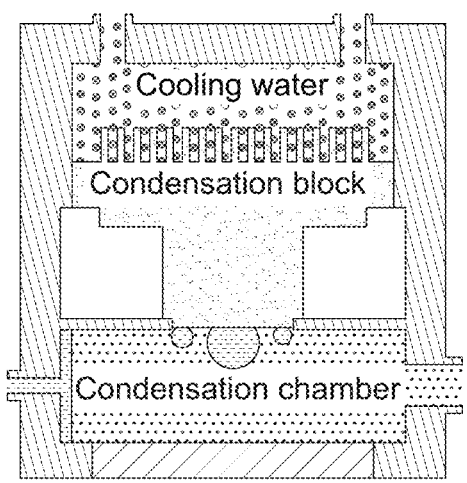
FIG. 5 shows an exemplary test setup used to make measurements of samples of the single layer and hi-mesh woven meshes.

In an embodiment, a mesh with a wire diameter d of between 20 µm and 100 µm (e.g., 65 µm), and a spacing between parallel wires w of between 10 µm and 500 µm (e.g., 65 µm, 130 µm, and 195 µm) can be bonded to a substrate. These dimensions correspond to w/d ranges of 0.5 to 5 (e.g., w/d=1, 2, and 3). The substrate can comprise a material having a high thermal conductivity (e.g., copper) and the bonding can take place via, for instance, thermal diffusion or electroplating, to name two non-limiting examples. However, the mesh and substrate need not be made from the same material, nor does the substrate have to have high thermal conductivity. However, in many cases, a thermal input is coupled to the substrate, and thus high thermal conductivity will be desired in these cases. High-density knife-like nanostructures can then be formed on all surfaces of the mesh and optionally the substrate to complete the manufacture of the hi-mesh surface. The nanostructures need not have a knife-like shape though. Other shapes that can be described as elongated can also be effective. In other words, high aspect ratio shapes can be used to good effect. In an embodiment, the nanostructures can have a tip size of between 5 nm and 25 nm (e.g., ~10 nm), a height of between 800 nm and 1.5 µm (e.g., ~1 µm), and a pitch of between 200 nm and 400 nm (e.g., ~300 nm). The height can be measured from a surface of the mesh wire to the tip of a nanostructure. Both the tip size and the height vary from nanostructure to nanostructure, and thus the above-noted ranges can refer to an average size for nanostructures measured across a portion of the mesh. FIG. 4C illustrates rough dimensions of an embodiment of the nanostructures on a mesh-covered surface. In an embodiment, the nanostructures can have a height of larger than 200 nm, and a height-to-width ratio larger than 2. The nanostructures can have various shapes including, but not limited to, a sheet, a tube, a pore, and a gap.

In an embodiment, the smallest droplet departure radius, the highest rate of surface refreshing, and the largest condensation heat transfer enhancement are obtained on a hi-mesh surface with w/d=3.

Methods of Fabrication

Figure 9:
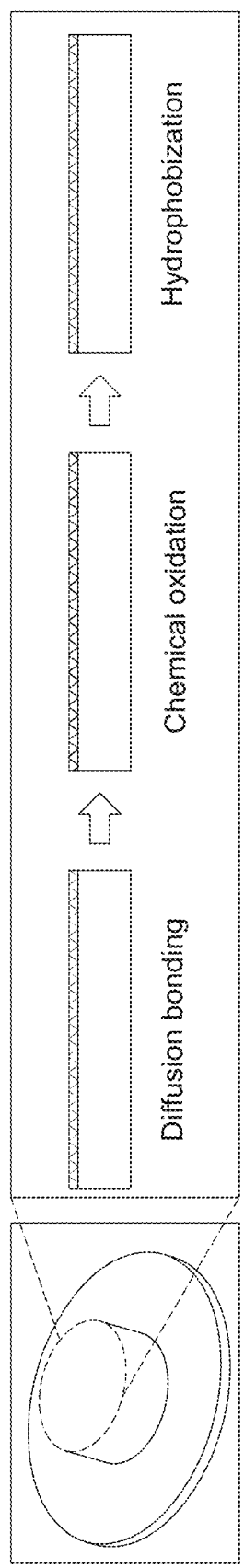
FIG. 9 shows exemplary steps for fabricating a hi-mesh surface.
Figure 33:
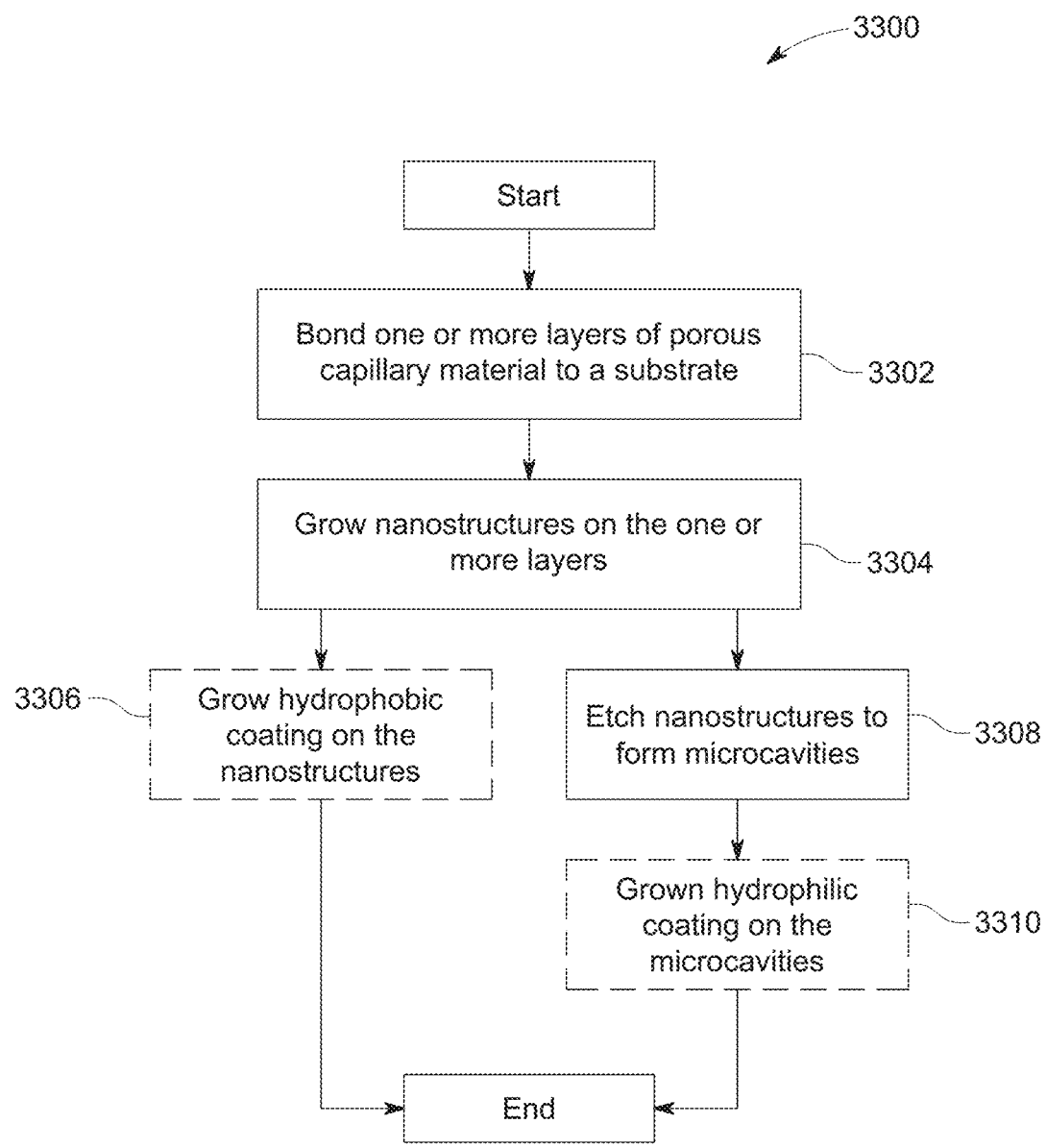
FIG. 33 illustrates methods of fabricating single or multi-layer structures for enhanced thermal transport.

In an embodiment, the nanostructures can be formed via self-limiting chemical oxidation, the details of which will be described below. The goal of nanostructure fabrication in the present disclosure is to increase droplet nucleation sites. Further a hydrophobic coating is used to increase water repellency of the mesh-covered surface. Due to the broad applications of copper in thermal and energy systems, high purity copper (99.9% purity) was used to fabricate the test samples in this work (although brass, bronze, aluminum, steel, and other materials can also be used for either or both of the substrate and mesh). As shown in FIG. 9, the hi-mesh surfaces can be fabricated through bonding woven mesh (e.g., copper woven mesh (e.g., from TWP Inc.)) onto a flat substrate (e.g., metal, copper) through diffusion bonding or electroplating (Block 3302 in FIG. 33). Nanostructures (e.g., copper oxide) can then be synthesized on the mesh wires (Block 3304), and optionally on the substrate, that will be directly exposed to vapor.

More specifically, prior to the bonding, both the substrate and wire mesh can be cleaned in an ultrasonic bath with a solvent (e.g., acetone) to remove organic contaminants, and then rinsed with an alcohol (e.g., a secondary alcohol such as isopropyl alcohol) and deionized (DI) water. An acid solution (e.g., hydrochloric acid (e.g., 2.0 M)) can be used to remove the native oxide film on the substrate and mesh wires, followed by the rinse with DI water. After that, the mesh can be placed on top of the substrate, pressed by a fastening device, and can be put into a vacuum oven at between 250° C. to 400° C. for more than 4 hours (e.g., 4 hours) to form the mesh-covered surface (Block 3302).

Nanostructures (e.g., copper oxide) can then be fabricated to cover the mesh-covered surface by self-limiting chemical oxidization, chemical etching, plasma etching, chemical deposition, electrodeposition, and anodization, to name a few non-limiting examples (Block 3304). The mesh-covered surface can be dipped into a variety of chemical etching solutions. For instance, the mesh-covered surface can be dipped an alkaline solution (e.g., $NaClO_2$, NaOH, $Na_3PO_4 \cdot 12H_2O$ and DI water (e.g., 3.75:5:10:100 wt. %)) at a temperature between 60° C. and 95° C. (e.g., 80° C.) for between 5 minutes and 45 minutes (e.g., 20 minutes). In another embodiment, the mesh-covered surface can be dipped in a 30% hydrogen peroxide ($H_2O_2$) solution for 3.5-8 hours. In yet another non-limiting embodiment, the mesh-covered surface can be dipped in an aqueous solution of 2.5 M NaOH and 0.1 M $(NH_4)_2S_2O_8$ for 5-60 minutes. In the oxidation process, a thin copper oxide layer forms on the mesh-covered surface.

Figure 8:
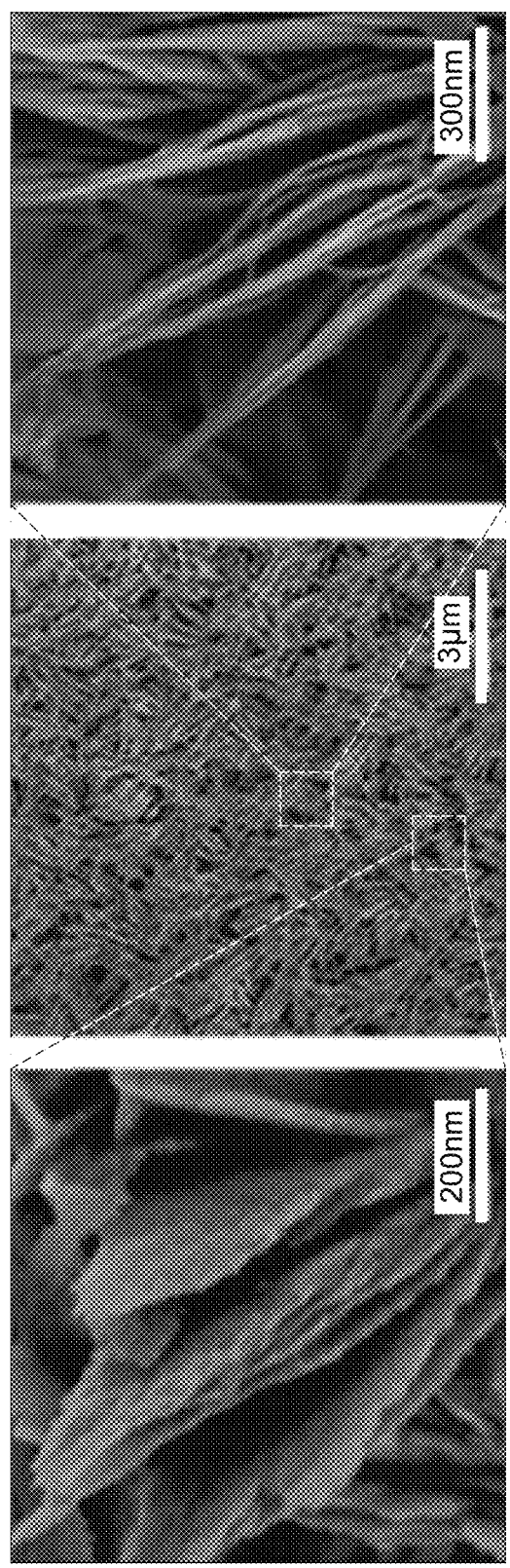
FIG. 8 shows the surface topology of the nanograss on the mesh-covered surface at different crops.

The nanostructure layer promises a low parasitic conduction thermal resistance due to thinness and the relatively high thermal conductivity of copper oxides. The nanostructure layer can include nanograss (elongated nanostructures growing generally perpendicularly from the surface), nanoparticles, and nanotubes, to name just a few other non-limiting examples. Any nanostructure that enhances droplet nucleation sites and heat transfer area can be implemented. In an embodiment, FIG. 8 shows the surface topology of the nanograss on the mesh-covered surface. A tapered nanogap can be formed between two adjacent nanosheets with the wider opening on the top. The densely packed nanosheets can compose a plexiform nanocluster on the entire surface. The scale of tapered nanogaps can range from a few nanometers at the bottom to several hundred nanometers at the top. The characteristic height of a nanosheet is about 1 μm and the spacing between two adjacent nanosheets on the top surface, i.e., the width of the formed tapered nanogaps is between 200-300 nm.

Further processing can achieve hydrophobic functionalization of the mesh-covered surface with nanostructures (optional Block 3306). This can be achieved through chemical vapor deposition, monolayer adsorption, and spraying, to name three non-limiting examples. In a specific example, the hydrophobic coating can be achieved, for instance, by dipping into an ethanol solution (e.g., 2.5 mM n-octadecanethiol (96% n-octadecyl mercaptan, Sigma-Aldrich)) at a temperature of between 60° C. and 95° C. (e.g., 70° C.) for between 45 minutes and 120 minutes (e.g., 1 hour). In another embodiment, the mesh-covered surface can be dipped in a 0.5 wt % hexane solution of 1H,1H,2H, 2H-perfluorodecyltriethoxysilane at room temperature for around 1 hour. In another embodiment, the mesh-covered surface can be vapor coated with fluorinated silane (trichloro(1H,1H, 2H,2H-perfluorooctyl)-silane) that is deposited on the surface in the vapor phase. The resulting self-assembled hydrophobic coating (e.g., n-octadecanethiol) may thicken the surface by between 1 nm and 10 nm (e.g., ~3 nm), though the surface morphology remains unchanged.

For comparison, the hydrophobic plain and superhydrophobic flat nanostructured (superhydrophobic nano) surfaces are also prepared for condensation experiments. FIG. 10A shows scanning electron microscopy (SEM) images of the three superhydrophobic hi-mesh surfaces with different width-to-diameter ratios. On the surfaces of substrate and mesh wires that will be exposed to vapor, high-density knife-like nanostructures, with ~10 nm in the tip dimension, ~1 μm in height, and 200-400 nm in pitch, can be formed during the oxidization step (FIG. 10B). These nanostructures are expected to increase the solid-liquid heat transfer area for the growth of condensed droplets. FIG. 10C shows the SEM image of the hydrophobic plain surface, which is smooth without obvious roughness except for some polished traces. FIG. 10D shows the SEM image of the Superhydrophobic nano surface that is only covered by high-density knife-like nanostructures. The surface wettability of the five test surfaces was measured using an optical imaging system by dispersing a 5 μL water droplet on the test surfaces. The contact angle and the contact angle hysteresis were measured and averaged over five measurements at different positions on the sample surface. All three hi-mesh surfaces showed superhydrophobicity. Table S1 lists the geometry details and wettability (contact angle and contact angle hysteresis) of the test surfaces.

TABLE S1

Geometric parameters and surface wettability

| Type | d (μm) | w (μm) | $\theta_A$ (°) | $\Delta\theta$ (°) |
|---|---|---|---|---|
| Hydrophobic plain | | | 119 ± 5 | 30 ± 5 |
| Superhydrophobic nano | | | 152 ± 1 | 5 ± 4 |
| Superhydrophobic hi-mesh w/d = 1 | 65 | 65 | 153 ± 2 | 5 ± 3 |
| Superhydrophobic hi-mesh w/d = 2 | 65 | 130 | 157 ± 2 | 4 ± 3 |
| Superhydrophobic hi-mesh w/d = 3 | 65 | 195 | 160 ± 2 | 4 ± 3 |

Theory of Sucking Flow Condensation

When water vapor condenses on a high surface energy (hydrophilic) surface such as a copper substrate, it forms a continuous liquid film which accumulates and grows in thickness along the gravitational direction, termed as filmwise condensation (FIG. 3B). The continuous liquid condensate film can be as thick as several hundred micrometers, significantly increasing thermal resistance between a vapor at the film surface and the substrate at the opposing film surface due to the low thermal conductivity of liquid water. To improve liquid condensate removal, various low-surface energy (hydrophobic) coatings have been developed to promote the formation of discrete droplets on the condensing surface, termed as dropwise condensation (FIG. 3A). These droplets can grow through either direct vapor condensation or coalescence to a critical departure size that can be removed by gravity. Despite the fact that these discrete droplets accelerate surface refreshing for dropwise condensation compared to the thick continuous liquid film for filmwise condensation, the large droplets (>50 μm in radius) that occupy 90% of the surface coverage contribute less than 10% of the overall heat flux due to the increased thermal resistance for large droplets. The key to enhancing dropwise condensation heat transfer is thus increasing droplet growth and surface refreshing simultaneously. In other words, a structure is needed that rapidly grows droplets, but also quickly removes small droplets from the surface by sucking them into a liquid film away from the surface, thereby allowing a new vapor condensation scheme on the surface.

When the herein disclosed porous or woven mesh materials covered with nanostructures are exposed to water vapor, the nanostructures serve as nucleate sites for droplet formation and growth. Between the substrate and the woven mesh, the hi-mesh has a multitude of interconnected channels (or "microgaps") which provide passages for the flow of liquid condensate (FIG. 3C). The roughly square-shaped openings between adjacent wires form micropores, though other porous materials can also form micropores. The channels allow fluid to flow laterally (or parallel to the substrate surface), while the microgaps allow fluid to flow away from the substrate to the hi-mesh surface (or the second side of the mesh) (e.g., see FIG. 15). During vapor condensation, the nucleated droplets on the substrate surface rapidly grow and coalesce to form a thin liquid film in the interconnected channels between the substrate and the mesh or other porous material. Droplets also grow on the mesh wires, and when these droplets coalesce with the thin liquid film (see FIG. 15), they can be efficiently removed by being pulled into the thin liquid film, accelerating surface refreshing for droplet re-nucleation and growth on the mesh wires. With continuous droplet-to-film coalescence, the interweaving channels can be filled with liquid condensate. Once the liquid film overcomes the Laplace pressure and grows through the micropores and out of the woven mesh layer, the surrounding liquid condensate accumulated in the interweaving channels can be continuously drawn out due to the interconnected liquid film, resulting in rapid surface refreshing. By coupling the high-performance dropwise condensation on mesh wires, or another porous material, and thin liquid film condensation in the interweaving channels, the resulting sucking flow condensation provides a new and highly effective means to simultaneously improve droplet growth and surface refreshing simultaneously. This combination unexpectedly outperforms both filmwise and dropwise condensation (see FIGS. 3B and 3A, respectively).

Figure 11:
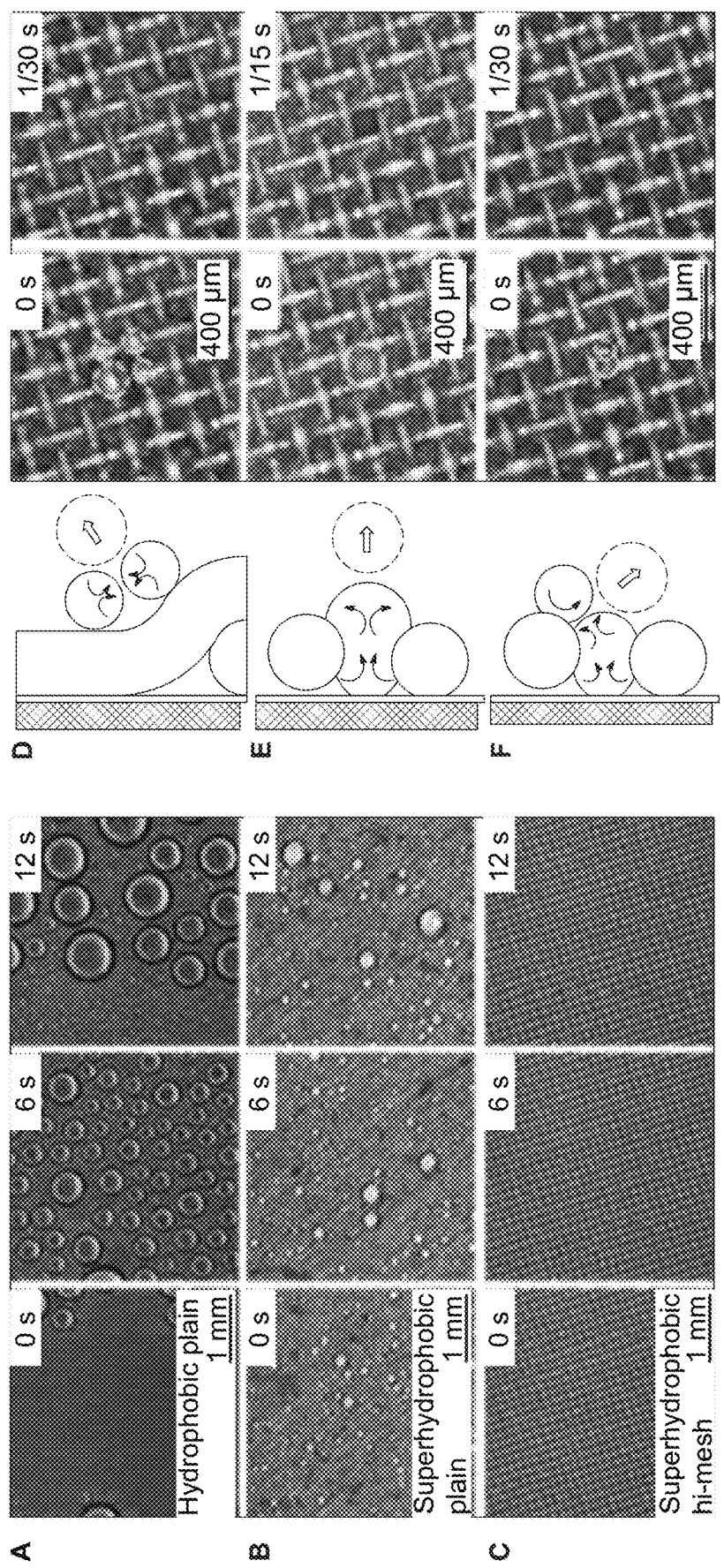
FIG. 11 shows three time-lapse photographs of a hydrophobic plain surface at $\Delta T=1$ K along with corresponding diagrammatic representations of droplet dynamics and zoomed in views of the mesh.

Theory of Jumping-Droplet-Enhanced Dropwise Condensation at Small Surface Subcooling To gain an in-depth understanding of the jumping-droplet enhanced condensation heat transfer mechanism on the hi-mesh surfaces at small surface subcooling, the inventors quantitatively characterized the droplet dynamics through visualization experiments. FIG. 11A shows three time-lapse photographs of a hydrophobic plain surface at $\Delta T=1$ K. The sliding of the droplets on the vertical surface is driven by gravity when the droplet size approaches the capillary length to overcome the contact line pinning force. Droplets with a size ranging from nanometers to millimeters are discrete on the plain hydrophobic surface. This is referred to as the "conventional" dropwise condensation that has attracted much attention since its discovery due to the advantage of the rapid removal of liquid condensate compared to that of filmwise condensation. However, FIGS. 11B and 11C show that both a flat superhydrophobic nano and hi-mesh surface are covered by high-density small droplets (with diameters<300 μm) at $\Delta T=1$ K, respectively. In other words, for these two designs, droplets are removed at smaller sizes than is seen for the plain hydrophobic surface. This significantly reduced droplet departure size can be understood from droplet removal modes: the droplets on the flat superhydrophobic nano and hi-mesh surfaces can rapidly leave the surface at a smaller size through "self-propelled jumping," rather than mere gravitational release, due to smaller surface adhesion, while the droplets on the hydrophobic plain surface keep growing to a larger size until being removed by gravity.

According to nucleation theory, condensation starts from the initial nucleation of nanoscale droplets in the nanostructures. At small surface subcooling, the coalescence of the droplets in the suspended Cassie states results in the self-propelled jumping. Different from the single mode coalescence-induced droplet jumping on the flat superhydrophobic nano surface (FIG. 11B), at small surface subcooling ($\Delta T=1$ K) three kinds of droplet jumping modes happen on the hi-mesh surfaces. For the droplets forming on the top of mesh wires (FIG. 11D), their growth is not confined, which is similar to the growth of droplets on the flat nanostructured surface. When droplets grow large enough to coalesce with the neighboring droplets, coalescence-induced droplet jumping is observed. For the droplets forming on the substrate (in the micropores among mesh wires, FIG. 11E), they can rapidly grow to a critical dimension where the droplet size is comparable to the micropores. With the further growth of the droplets, the lower part of the droplets is confined by the surrounding mesh wires and remains under a higher pressure with a small radius. Meanwhile, the upper part of the droplets expands and the pressure inside decreases, which is due to the increased radius. As a result, the outward Laplace pressure can push the growing droplet out of the micropores for self-propelled jumping. In addition, the expansion of solid-liquid contact area can promote the rapid growth of droplets in the micropores compared to the droplets on the flat surface. When the droplets on the mesh wires grow large enough to coalesce with the droplets in the micropores (FIG. 11F), the released surface energy can drive the merged droplet to jump off. Due to the diverse droplet jumping modes at small surface subcooling, the superhydrophobic hi-mesh surfaces are rapidly refreshed for continuous vapor condensation.

Figure 10:
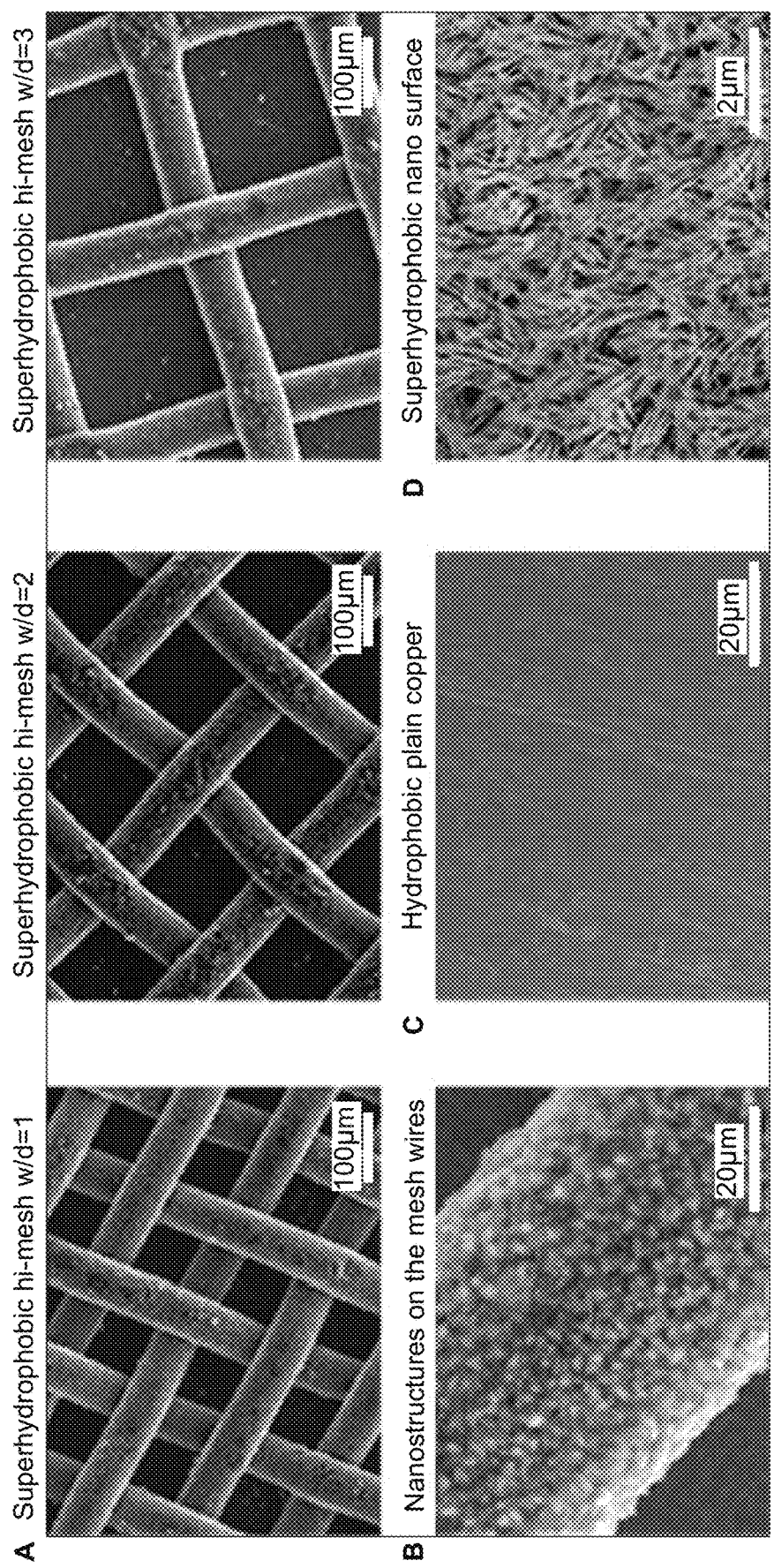
FIG. 10 shows SEM imagery of three different superhydrophobic hi-mesh surfaces with different width-to-diameter ratios, a hydrophobic plain surface, a superhydrophobic nano surface.
Figure 12:
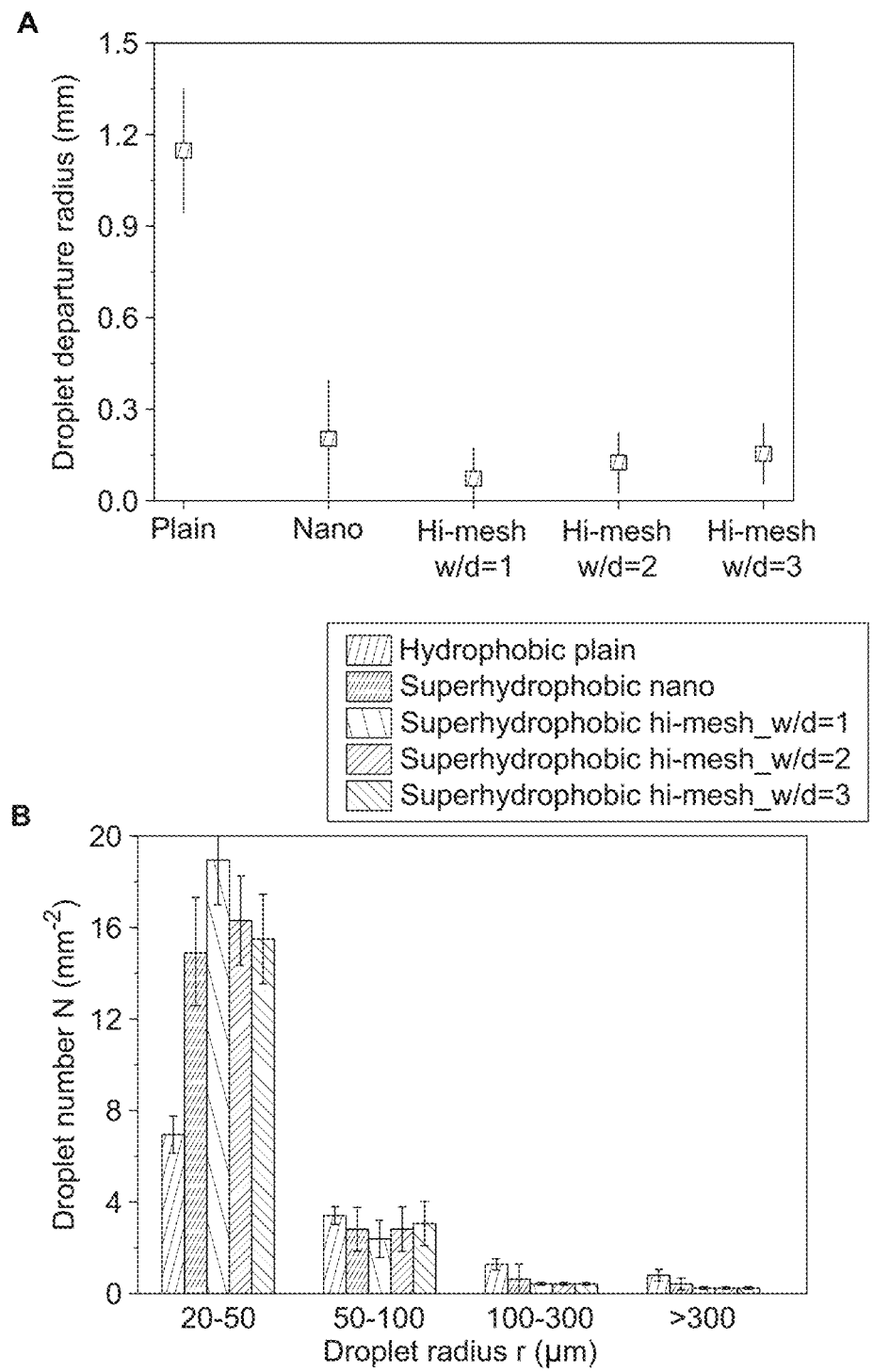
FIG. 12 shows quantitative analysis of droplet departure radius at small surface subcooling ($\Delta T=1$ K) on the five test surfaces.

FIG. 12A shows the quantitative analysis of the droplet departure radius at small surface subcooling ($\Delta T=1$ K) on the five test surfaces (see FIG. 10). Due to the self-propelled droplet jumping, the departure radius of droplets on the three hi-mesh surfaces is smaller than 300 μm, which is far less than a radius of 1-1.2 mm on the hydrophobic plain surface. As a result, the smallest departure is obtained on the hi-mesh surface with w/d=1, which is because denser mesh wires (smaller micropores between mesh wires) provide greater possibilities for droplet jumping with a smaller size. As expected, the rapid droplet removal on the hi-mesh surfaces leads to a higher density of small droplets (FIG. 12B) and the highest density of small droplets (<50 μm) is achieved on the hi-mesh surface with w/d=1. These improved condensation characteristics, including faster droplet removal and higher density of small droplets, lead to significantly enhanced condensation heat transfer under small surface subcooling on superhydrophobic hi-mesh surfaces.

Theory of Sucking Flow Condensation on Hi-Mesh Structures

To further enhance droplet removal at a smaller size than the gravity-driven droplet removal in "conventional" dropwise condensation on vertical hydrophobic surfaces, here, a superhydrophobic hi-mesh surface promotes sucking flow condensation, which takes advantage of both enhanced dropwise condensation on mesh wires, or other porous material, and thin film condensation between the substrate and mesh wires, or other porous material. In an embodiment, the hi-mesh surface can be formed by bonding a commercial woven mesh (e.g., copper and other metals and thermal materials, e.g., polymers) onto a plain substrate (e.g., copper and other metals and thermal materials, e.g., polymers). Between the substrate and mesh layer, there are plenty of interconnected channels (microgaps) which provide passages for the flow of liquid condensate that is accommodated in the adjacent micropores. The micropores surrounded by mesh wires are connected with the microgaps, which can serve as the outlets for draining the liquid condensate. High-density nanostructures (e.g., knife-like) that are directly exposed to the vapor cover the surfaces of mesh wires (and optionally the substrate). As a result, droplets can nucleate on the entire surface including both the mesh wires and the substrate.

Figure 15:
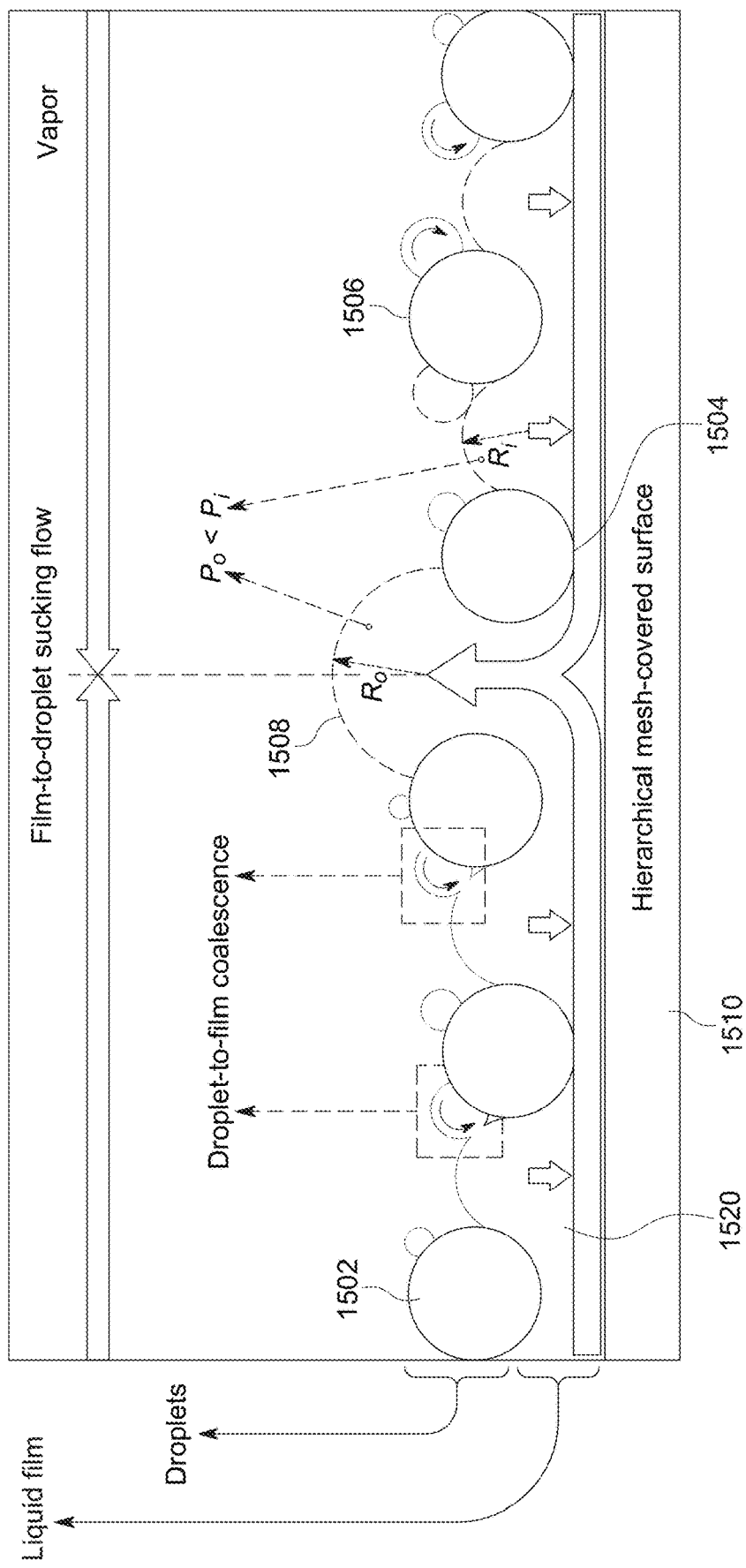
FIG. 15 illustrates sucking flow condensation on a hi-mesh surface.

During condensation under large surface subcooling, the liquid condensate tends to immerse into the nanostructures, which reduces the additional thermal resistance compared to that of the suspended droplets on the nanostructures. As a result, small droplets rapidly grow after the nucleation in the nanostructures (FIG. 15). With the coalescence of the immersed droplets on the substrate (in the micropores among mesh wires), the micropores are filled with liquid condensate and a thin liquid film is formed between the substrate and mesh layer. When the small droplets on the mesh wires grow large enough to contact the liquid film, they are sucked into the thin liquid film. This is because of larger surface adhesion of the liquid film between the interconnected channels compared to that of the small droplets on the mesh wires. The continuous suction of small droplets from the mesh wires to the liquid film ensures rapid and continuous local surface refreshing of the second surface of the mesh for re-nucleation.

Dramatically different from the flooding phenomena at large surface subcooling on other micro/nanostructured surfaces developed for condensation enhancement, the accumulated liquid condensate in the mesh micropores due to the droplet-to-liquid sucking can be removed by the following film-to-droplet sucking flow. With the continuous droplet-to-film coalescence, the interweaving channels can be filled with liquid condensate. Once the liquid film overcomes the Laplace pressure $P_i$ and grows out of the mesh layer, the pressure of the droplets will rapidly reduce from $P_i$ to $P_o$ due to the increasing surface curvature from $R_i$ to $R_o$. Driven by the pressure difference $P_i-P_o$, a film-to-droplet sucking flow can be activated, which greatly accelerates the droplet growth rate compared to that on the plain hydrophobic surface purely due to droplet coalescence. Most importantly, this film-to-droplet sucking flow results in a large-area surface refreshing for continuous vapor condensation.

FIG. 15 illustrates sucking flow condensation on hi-mesh surfaces. The thin liquid film between the woven mesh layer and substrate (on a first side of the mesh layer) removes small droplets from a second side of the mesh by droplet-to-film sucking during coalescence and provides interconnected channels for continuous film-to-droplet sucking flow. This sucking flow generates medium-sized droplets on the surface that fall away due to gravity faster than their larger counterparts seen on plain hydrophobic surfaces.

Test Results

For the "conventional" dropwise condensation on a hydrophobic surface, the falling of the droplets off the vertical surface is driven by gravity (see FIG. 11A, time-lapse dropwise condensation on a hydrophobic plain surface). However, the superhydrophobic nano surface is covered with high-density small condensed droplets where droplet jumping plays the most important role in droplet removal (see FIG. 11B, time-lapse jumping-droplet condensation on a flat superhydrophobic nano surface). Compared to the superhydrophobic nano surface, three kinds of droplet jumping modes are observed on the superhydrophobic hi-mesh surfaces (see FIG. 11C, time-lapse condensation of droplets on a superhydrophobic hi-mesh surface with w/d=2): coalescence-induced droplet jumping on mesh wires, self-jumping of a single droplet in micropores, and mixed jumping of droplets inside and outside of micropores (FIGS. 11D-F). FIG. 11D shows coalescence-induced droplet jumping on the mesh wires, which is attributed to released surface energy. FIG. 11E shows self-jumping of a confined droplet in the micropores. FIG. 11F shows mixed jumping of droplets inside and outside of the micropores. As a result, the departure radius of droplets on the superhydrophobic nano and hi-mesh surfaces are greatly decreased, compared to that on the hydrophobic plain surface (FIG. 12A, showing measured droplet departure radius on the five test surfaces). A larger number of small droplets on the superhydrophobic nano and hi-mesh surfaces (FIG. 12B, showing a histogram of droplet size distribution on the five test surfaces) significantly reduce the thermal resistance of liquid condensate. The increased surface refreshing and reduced thermal resistance for vapor condensation together can enhance condensation heat transfer under small surface subcooling.

As the surface subcooling increases ($\Delta T>4.5$ K), significantly different condensation phenomenon is observed for the first time here on the superhydrophobic hi-mesh surfaces. FIGS. 6A-C show the condensation phenomenon on a hydrophobic plain, a superhydrophobic nano surface, and a superhydrophobic hi-mesh surface at a surface subcooling of 15 K, respectively. Compared to the dropwise condensation on the hydrophobic plain surface (FIG. 6A) and flooding condensation on the superhydrophobic nano surface (FIG. 6B), an unprecedented condensation mode of sucking flow is observed on the hi-mesh surface (FIG. 6C). At short times after droplet departure at 0.1 s, all the three test surfaces are covered by lots of newly nucleated small droplets. Such high-density small droplets transfer heat more efficiently from the vapor to the surface. However, the differences become apparent after 2.5 s: the droplets on the hydrophobic plain and superhydrophobic nano surfaces continue to grow and coalesce with neighboring droplets to a bigger size to cover the surface, while most of the surface area on the hi-mesh surface is kept to be covered by the newly generated small droplets.

Figure 6:
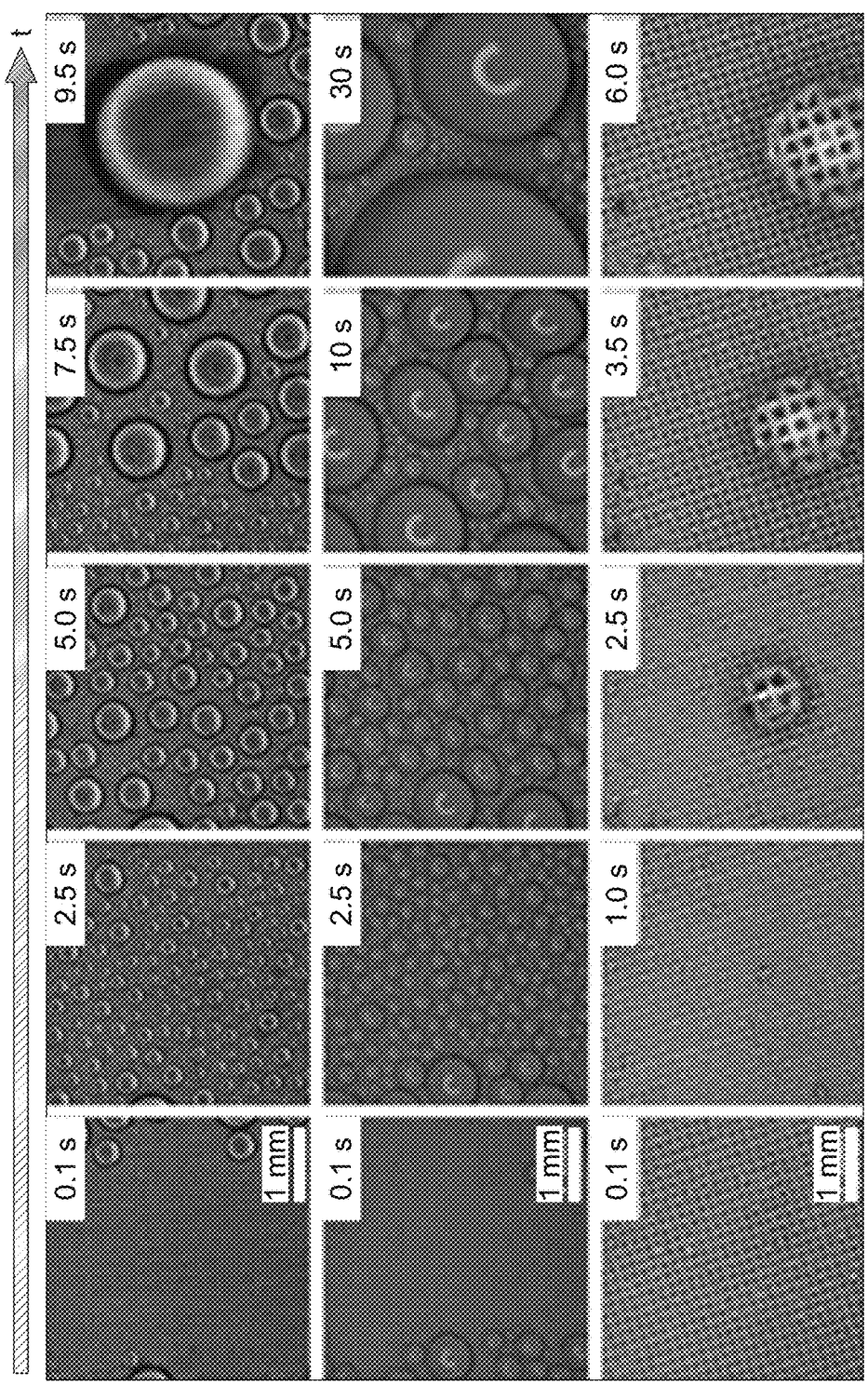
FIG. 6A shows a diagrammatic representation and time-lapse photographs of surface condensation on a hydrophobic plain surface.
FIG. 6B shows a diagrammatic representation and time-lapse photographs of surface condensation on a superhydrophobic nano surface.
FIG. 6C shows a diagrammatic representation and time-lapse photographs of surface condensation on a superhydrophobic hi-mesh surface.

FIG. 6 illustrates condensation phenomena for different surface preparations. FIG. 6A shows a time-lapse of condensation on a hydrophobic plain surface. One sees that the whole surface is covered by growing droplets before being removed by gravity. FIG. 6B shows a time-lapse of condensation on a superhydrophobic nano surface. Here, the pinned droplets on the nanostructures result in the previously-noted flooding phenomenon (the failure of superhydrophobicity). FIG. 6C shows a time-lapse of condensation on a superhydrophobic hi-mesh surface with w/d=2. One sees here that most of the surface area is covered by small droplets (<50 μm) due to rapid surface refreshing by sucking flow condensation.

Figure 7:
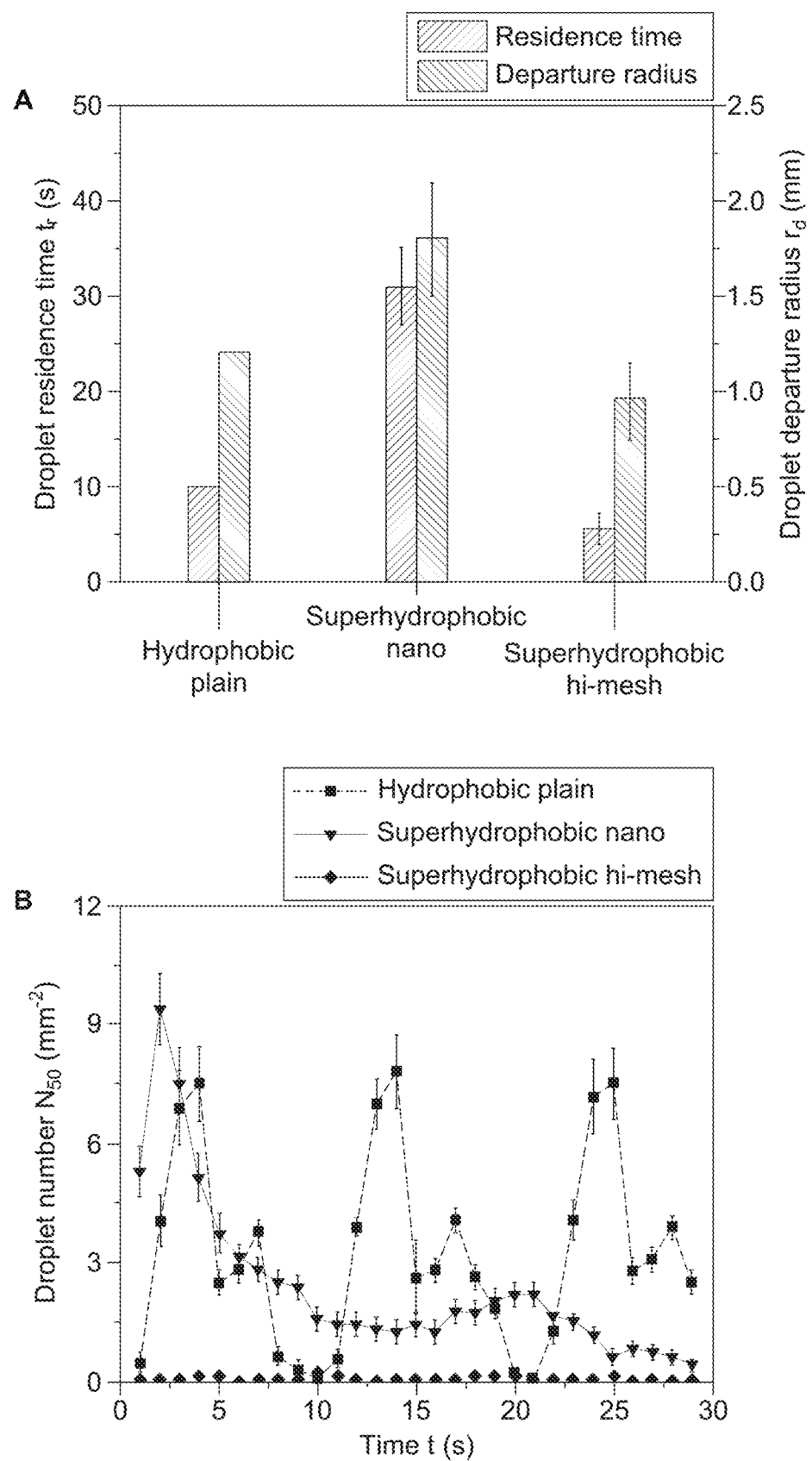
FIG. 7A quantitatively shows the residence time, $t_r$, (from droplet formation to removal) and departure radius, $r_d$, of droplets on three test surfaces.
FIG. 7B shows a time evolution of the density of large droplets with a radius of >50 µm in a 4 mm×4 mm area over a period of 30 s on the three test surfaces.

FIG. 7A quantitatively shows the residence time, $t_r$, (from droplet formation to removal) and departure radius, $r_d$, of droplets on three test surfaces. This data was obtained by averaging residence time and departure radius of twenty measured droplets from each test surface. Compared to the droplets on the hydrophobic plain surface, the residence time of droplets on the superhydrophobic hi-mesh surfaces is reduced from 9.5 s to 6 s, which is only one-fifth of that on the superhydrophobic nano surface ($t_r$=30 s). In addition, the droplet departure radius on the hi-mesh surface (0.8-1.1 mm) is decreased to 75% of that on the hydrophobic plain surface (1.0-1.3 mm) and 53% of that on the superhydrophobic nano surface (1.5-2.1 mm). The significantly increased residence time and departure radius of droplets on the superhydrophobic-nano surface are due to the strongly pinned droplet wetting state while the rapid droplet removal on the hi-mesh surface is attributed to continuous sucking flow in the interweaving channels, which greatly accelerates surface refreshing.

FIG. 7B shows a time evolution of the density of large droplets with a radius of >50 μm in a 4 mm×4 mm area over a period of 30 s on the three test surfaces. For the dropwise condensation on the hydrophobic plain surface, the density of large droplets (>50 μm) rapidly increases as new droplets nucleate and grow after the departure of old droplets (0-4 s). Due to the coalescence of large droplets, the density of large droplets reduces (4-5 s). As vapor further condensates on the exposed surface area caused by droplet coalescence, new droplets nucleate and grow, resulting in the density of large droplets to increase again (5-7 s). When the droplets grow large enough (1-1.2 mm) to be removed by gravity, the surface is refreshed and the density of large droplets greatly decreased (7-10 s). The repeated droplet cycle from the nucleation to departure, results in the periodic increase and decrease in the number of large droplets. Compared to the hydrophobic plain surface, the density of large droplets on superhydrophobic nano surface increases similarly with the nucleation and growth of new droplets after the departure of old droplets (0-2 s). The further coalescence of droplets reduces the density of large droplets (2-30 s) until the droplets are removed by gravity. Significantly different from the hydrophobic plain and superhydrophobic nano surfaces, the density of large droplets on the superhydrophobic hi-mesh surface remains very small over time. Such a small density of large droplets is attributed to both the droplet-to-film coalescence and film-to-liquid sucking flow on the hi-mesh surfaces. The droplet-to-film coalescence can rapidly remove the droplets on the mesh wires at a smaller size (<50 μm) compared to the gravity-driven droplet removal size (1.0-1.3 mm) on the hydrophobic plain surface. The further film-to-droplet sucking flow between the substrate and woven mesh layer can effectively drain the liquid condensate accumulated in the interweaving channels.

Figure 13:
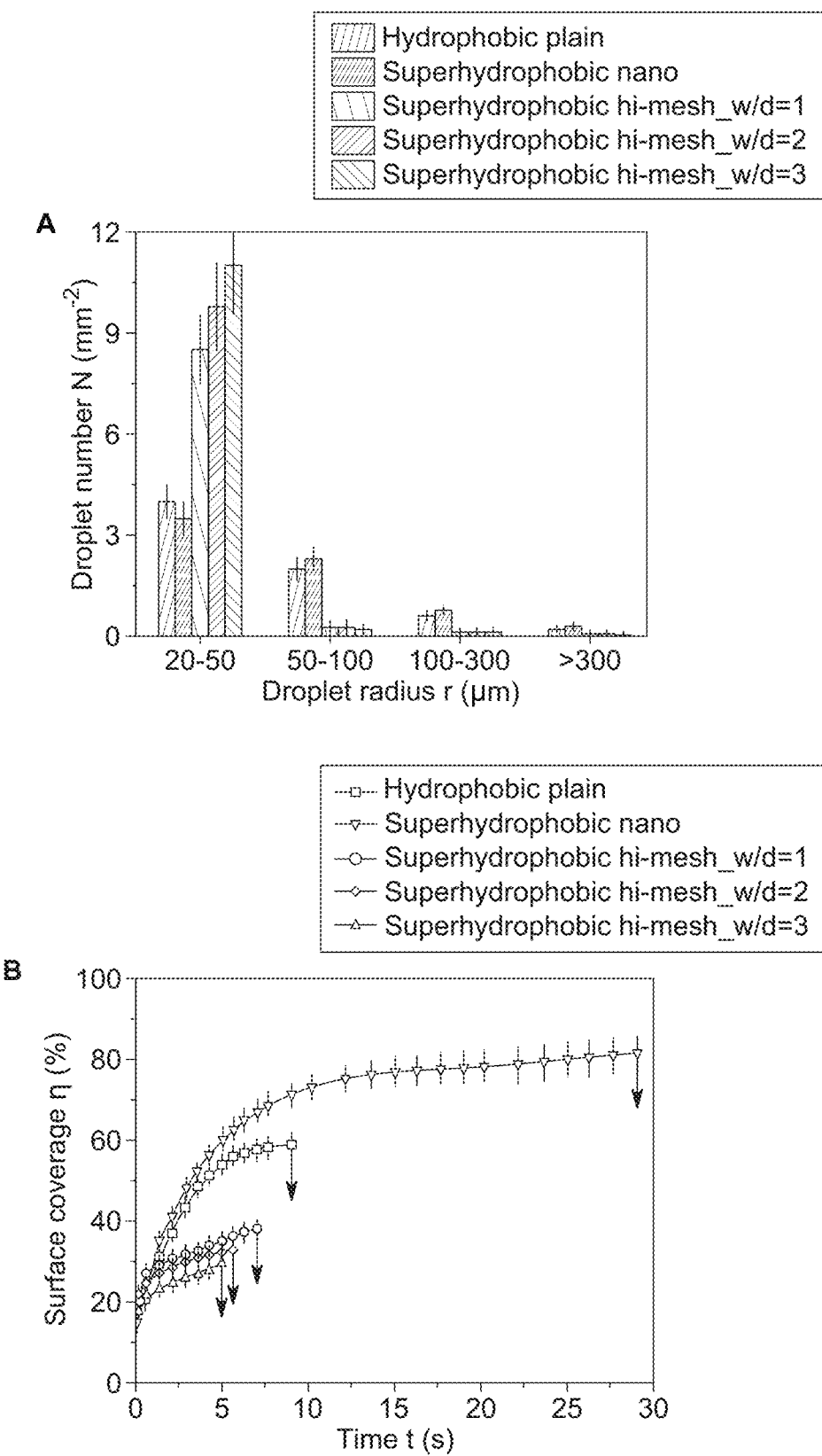
FIG. 13 quantitatively shows the droplet behaviors on the hydrophobic plain, superhydrophobic nano, and three superhydrophobic hi-mesh surfaces.
Figure 13:
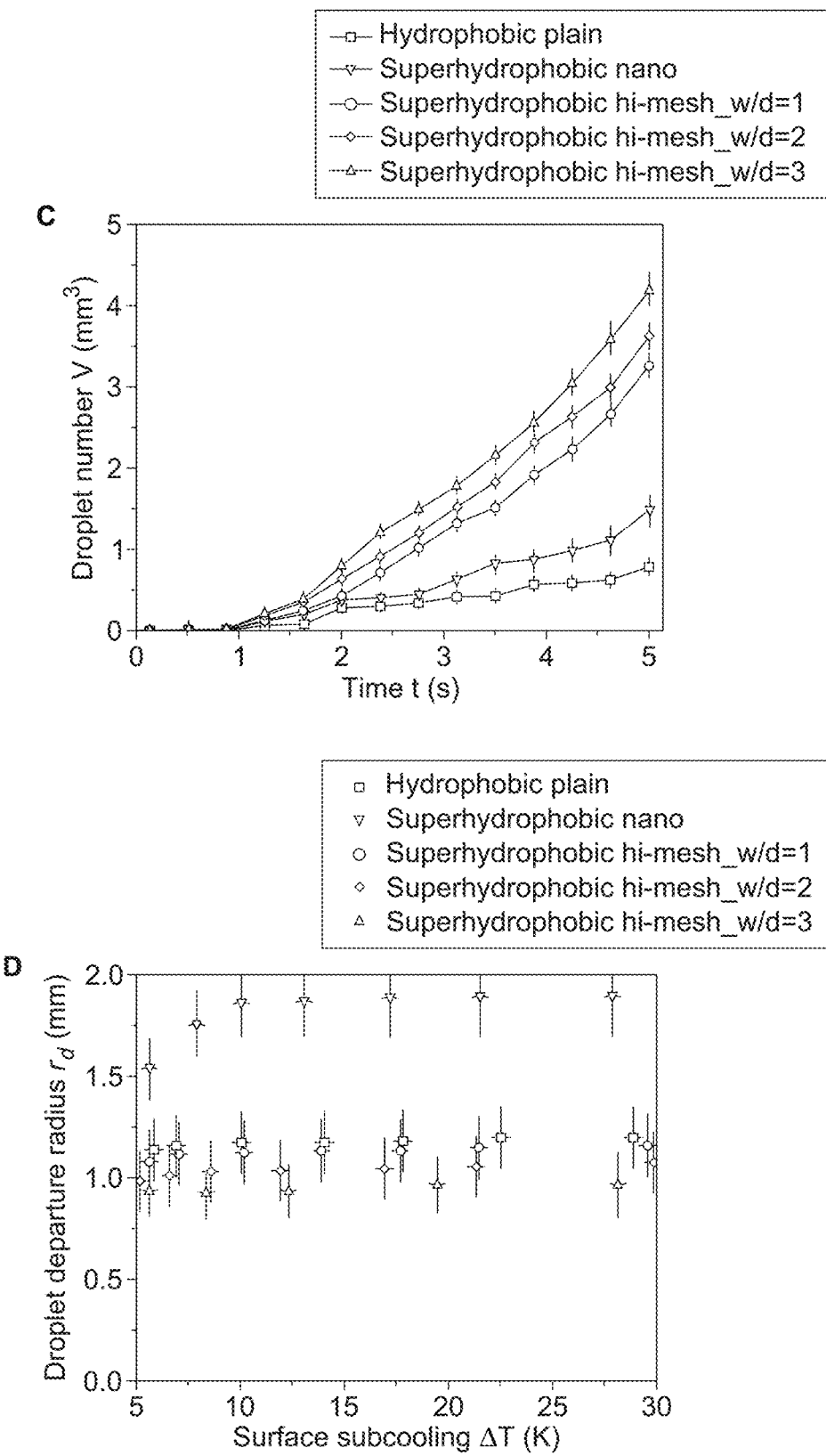

To further explore the effect of porous and mesh structures on the condensation performance, FIG. 13 quantitatively shows the droplet behaviors on the hydrophobic plain, superhydrophobic nano, and three superhydrophobic hi-mesh surfaces. FIG. 13A shows the droplet size distribution on the five test surfaces at ΔT=15 K. The droplet counts were averaged over five images recorded during a droplet cycle within the time between two departure of droplets. On the superhydrophobic hi-mesh surfaces, the number of small droplets (<50 μm) has more than doubled while the number of large droplets (>50 μm) is greatly decreased compared to that on the hydrophobic plain and superhydrophobic nano surfaces. The increased number of small droplets on the hi-mesh surfaces significantly reduces the thermal resistance of condensate layer. For the three hi-mesh surfaces, the surface with w/d=3 has the largest number of small droplets and the smallest number of large droplets, which renders the best condensation heat transfer enhancement. FIG. 13B shows the surface coverage of the five test surfaces as a function of time after surface refreshing (droplet departure). Due to the growing droplets by coalescing with neighboring droplets, the surface coverage of the hydrophobic plain surface and superhydrophobic nano surfaces increases rapidly up to 60% and 80%, respectively, until being refreshed by the next droplet departure. However, the droplet coverage on the hi-mesh surfaces is found to be kept at a small value (less than 40%) during the condensation. Such a low droplet coverage on the hi-mesh surfaces provides more areas of fresh surface for vapor condensation. FIG. 13C shows the droplet growth rate on the five test surfaces at the surface subcooling of 15 K. After droplet departure at 0 s, the average volume of new droplets in the fresh surface area is measured. At short times (<1 s) after droplet departure, the small droplets grow by direct vapor condensation on the droplet surface. Once the droplets coalesce with adjacent droplets (>1 s), the droplet coalescence becomes the dominant mechanism for droplet growth, since the droplet growth rate contributed by direct vapor condensation decreases due to the increased thermal resistance between droplet surface and substrate. The droplets on all the three hi-mesh surfaces have much larger growth rate than that on the hydrophobic plain surface and superhydrophobic nano surface. More importantly, the hi-mesh surfaces show a unique accelerated droplet growth rate (increased slope dV/dt with time t), which is significantly different from the reduced growth rate for growing droplets on other plain and structured surfaces. Among the three hi-mesh surfaces, the largest droplet growth rate is obtained on the hi-mesh surface with w/d=3, which is five times that on the hydrophobic plain surface. FIG. 13D shows the departure radius of droplets on the five test surfaces as a function of surface subcooling. As expected, the departure radius of droplets on the hydrophobic plain surface is maintained at 1.0-1.3 mm, which is comparable to the capillary length of water. Due to the increased surface adhesion caused by the pinned wetting state at large surface subcooling, the droplets on the superhydrophobic nano surface grow larger than 1.5 mm before being removed by gravity. For all the superhydrophobic hi-mesh surfaces, droplet departure radius decreases to 0.8-1.1 mm and the smallest droplet departure radius is obtained on the hi-mesh surface with w/d=3. These improved condensation characteristics, under large surface subcooling (5-30 K), including faster droplet growth, smaller droplet departure radius, higher density of small droplets, and more frequent surface refreshing together provide great potential for condensation heat transfer enhancement.

FIG. 13A shows a histogram of droplet size distribution (averaged for a duration of 60 s of condensation) on the five test surfaces. A larger number of small droplets (<50 μm) on the superhydrophobic hi-mesh surfaces reduce the thermal resistance of the liquid condensate layer. FIG. 13B shows a time evolution of surface coverage η from the droplet formation to departure on the five test surfaces. The surface coverage is averaged for the measurements for three droplet cycles on the same surface. FIG. 13C shows a time evolution of the volume of growing droplets V showing the enhanced droplet growth on the superhydrophobic hi-mesh surfaces. The droplet volume is the average for three measured droplets on the same surface. FIG. 13D shows quantification of the departure radius of droplets $r_d$ on the five test surface as a function of surface subcooling ΔT. The droplet departure radius is averaged for an interval of 60 s of condensation. The departure radius of droplets on the superhydrophobic hi-mesh surfaces is decreased compared to that on the hydrophobic plain surface and superhydrophobic nano surface.

Figure 14:
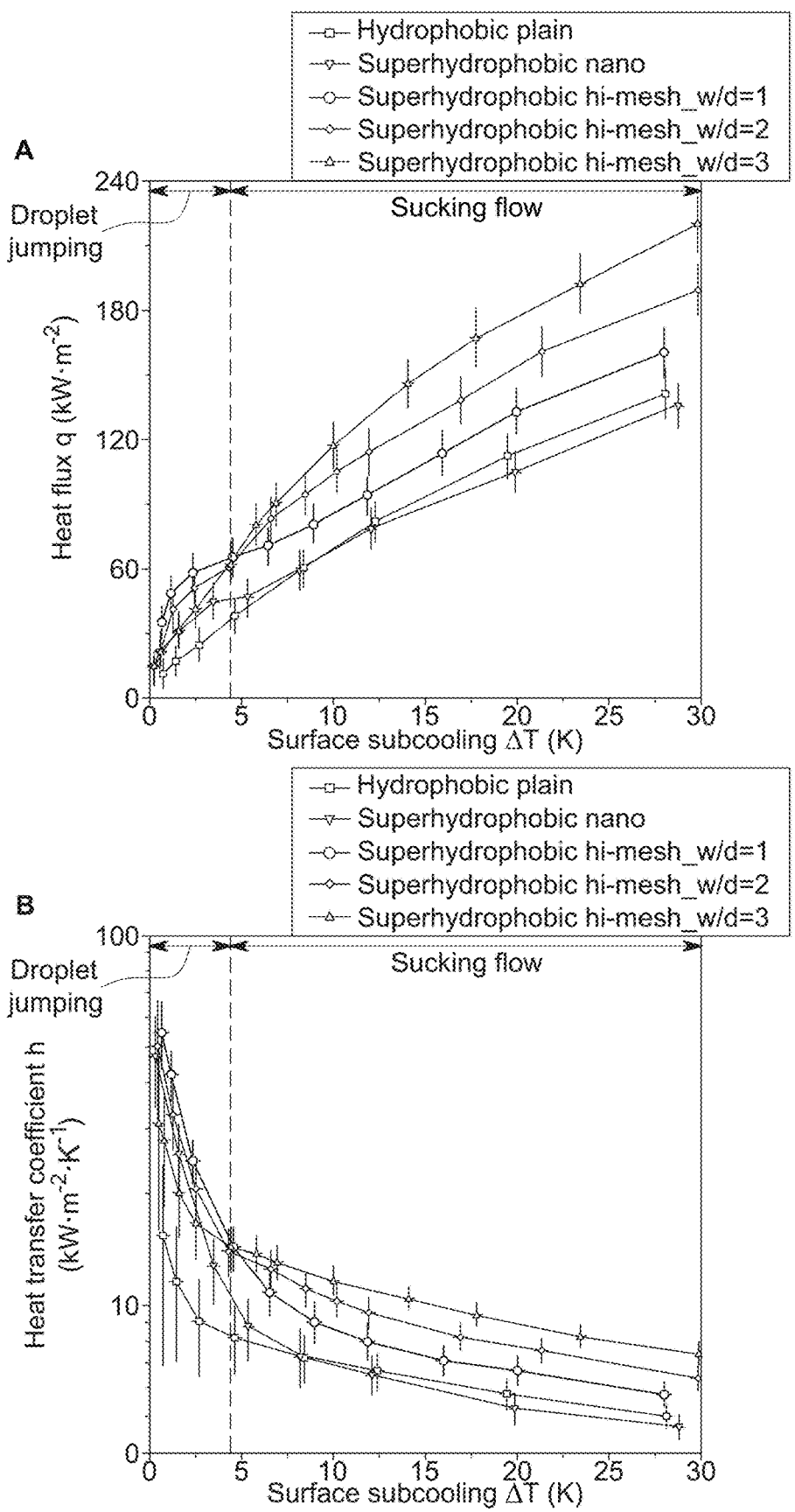
FIG. 14A shows the total condensation heat flux as a function of surface subcooling on five test surfaces.
FIG. 14B shows heat transfer coefficient on the five test surfaces as a function of surface subcooling.

FIG. 14 shows condensation heat transfer performance. In particular, FIG. 14 shows the total condensation heat flux q as a function of surface subcooling ΔT on five test surfaces: (1) the hydrophobic plain; (2) superhydrophobic nano; (3) superhydrophobic hi-mesh with w/d=1; (4) superhydrophobic hi-mesh with w/d=2; and (5) superhydrophobic hi-mesh with w/d=3. FIG. 14A shows heat flux q and FIG. 14B shows heat transfer coefficient h on the five test surfaces as a function of surface subcooling ΔT, respectively. At each surface subcooling, the heat flux on the three hi-mesh surfaces is significantly enhanced in comparison with the hydrophobic plain copper surface. More interestingly, the unprecedented sustaining heat transfer enhancement is achieved in a wide range of surface subcooling, up to 30 K, compared to that on the superhydrophobic nano surface. Obviously, there exists a transition point at the surface subcooling of 4.5 K, where the heat flux curves of the hi-mesh surfaces can be divided into two regimes based on different condensation phenomenon: droplet jumping (ΔT<4.5 K) and sucking flow (ΔT>4.5 K). This transition of condensation mode from jumping droplet condensation to sucking flow condensation is attributed to the wetting transition of condensed droplets from the suspended Cassie state to the immersed Wenzel state caused by the uncontrolled nucleation within the nanostructures under large surface subcooling. On the superhydrophobic nano surface, when the surface subcooling increases, the nucleation size of droplets significantly decreases while the nucleation site density greatly increases, which result in the change of droplet removal from the self-propelled jumping mode to the gravity-driven sliding mode. It is worth noting that the wetting transition on the hi-mesh surfaces does not lead to the flooding phenomena that has often been observed to occur on other micro/nanostructured superhydrophobic surfaces developed for condensation enhancement (N. Miljkovic, R. Enright, Y. Nam, K. Lopez, N. Dou, J. Sack, E. N. Wang, Jumping-droplet-enhanced condensation on scalable superhydrophobic nanostructured surfaces. Nano Lett. 13, 179-187 (2013))(R. F. Wen, Q. Li, J. F. Wu, G. S. Wu, W. Wang, Y. F. Chen, X. H. Ma, D. L. Zhao, R. G. Yang, Hydrophobic copper nanowires for enhancing condensation heat transfer. Nano Energy 33, 177-183 (2017))(R. D. Narhe, D. A. Beysens, Nucleation and growth on a superhydrophobic grooved surface. Phys. Rev. Lett. 93, 076103 (2004)).

Based on condensation characteristics, the heat transfer curves of superhydrophobic hi-mesh surfaces can be divided into two regimes: droplet jumping under small surface subcooling (ΔT<4.5 K) and sucking flow under large surface subcooling (ΔT>4.5 K). The change of condensation modes from droplet jumping mode to sucking flow mode is due to the wetting transition of droplets from the suspended state to the immersed state, which is due to nucleation in the nanostructures. Enhanced condensation heat transfer in the droplet jumping regime (ΔT<4.5 K) is attributed to the increased surface refreshing frequency. Heat transfer enhancement sustained under large surface subcooling (ΔT>4.5 K, up to 30 K) is due to the sucking-flow-enhanced droplet growth and surface refreshing.

By further comparing the heat flux curves of the three superhydrophobic hi-mesh surfaces, the largest heat transfer enhancement in the two regimes appears on different surfaces: the largest heat transfer enhancement in the droplet jumping regime is obtained on the hi-mesh surface with w/d=1, while the highest heat flux in the sucking flow condensation regime is achieved on the hi-mesh surface with w/d=3. This is because the hi-mesh surface with w/d=1 provides smaller and denser micropores for rapid droplet jumping under small surface subcooling (<4.5 K) while the hi-mesh surface with w/d=3 has lower flow resistance of film-to-droplet sucking under large surface subcooling (>4.5 K). Compared to that on the hydrophobic plain surface, FIG. 14B shows 254% and 74% higher heat transfer coefficient are achieved on the hi-mesh surface with w/d=1 in the droplet jumping regime at the surface subcooling of 0.7 K and 4.5 K, respectively. This significant difference can be understood from the enhanced surface refreshing by the reduced droplet departure size: the jumping droplets on the hi-mesh surfaces can rapidly leave the surface with a smaller size (r<300 μm) while the droplets on the hydrophobic plain surface keep growing to a larger size (r>1 mm) until being removed by gravity. More importantly, compared to that on the hydrophobic plain surface, 70% and 53% higher heat transfer coefficient are obtained on the hi-mesh surface with w/d=3 at the surface subcooling of 8.3 K and 28.1 K, respectively. Such a significant and sustaining condensation heat transfer enhancement under large surface subcooling is attributed to a new condensation mode of sucking flow on the superhydrophobic-hi-mesh surfaces.

To demonstrate the sucking-flow-enhanced condensation heat transfer on the superhydrophobic hi-mesh surfaces, further testing was performed comparing the heat transfer performance and condensation modes on six test surfaces including a hydrophilic plain copper surface, a hydrophilic copper mesh-covered surface, a superhydrophilic hi-mesh surface, a hydrophobic plain copper surface, a superhydrophobic nano surface, and a superhydrophobic hi-mesh surface.

Figure 16:
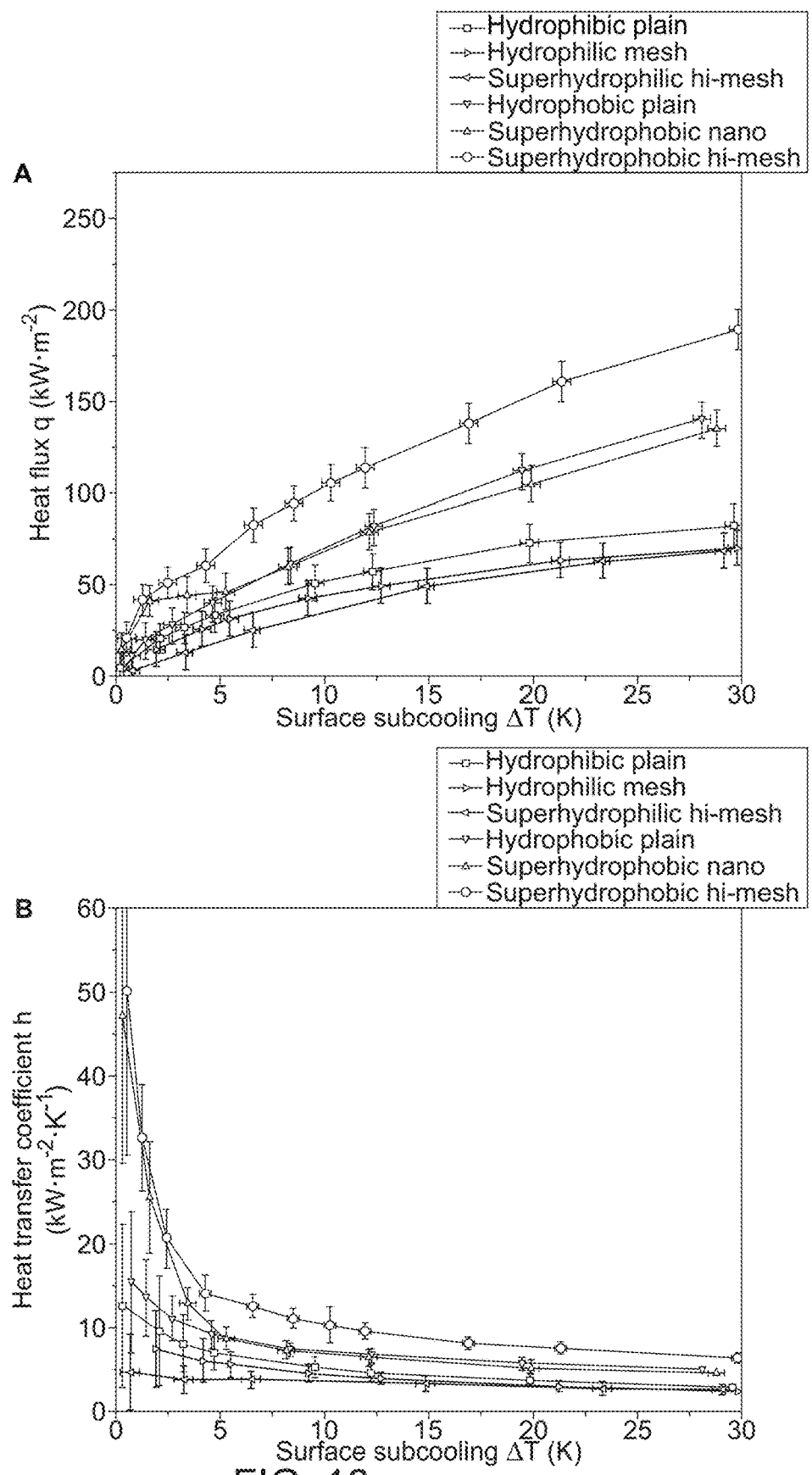
FIG. 16A compares the total condensation heat flux of the six test surfaces as a function of surface subcooling.
FIG. 16B compares the heat transfer coefficient of the six test surfaces as a function of surface subcooling.
Figure 17:
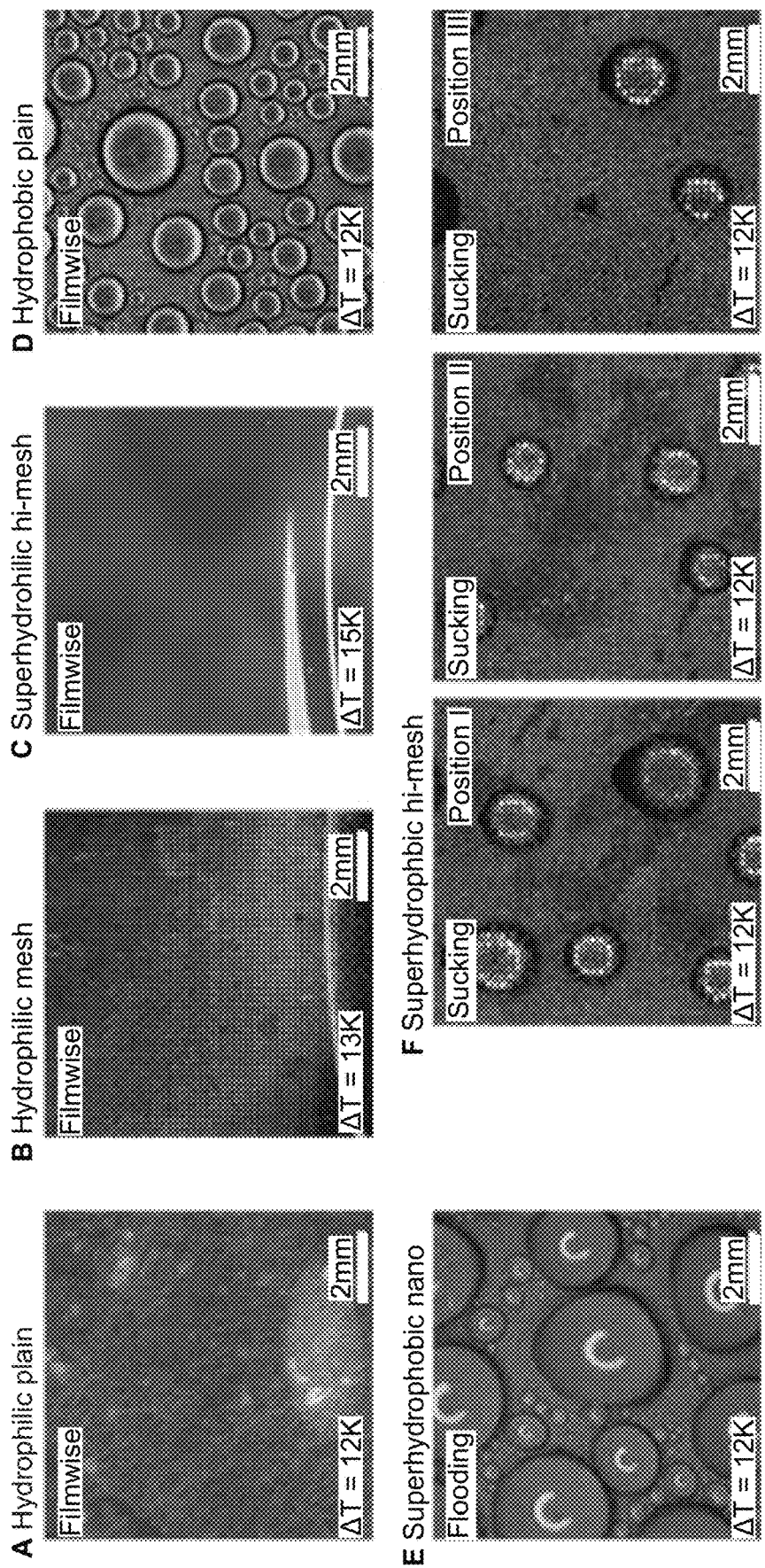
FIG. 17 shows various woven mesh surfaces and condensation phenemena associated with those meshes.

FIGS. 16A and 16B show condensation heat flux and heat transfer coefficient as a function of surface subcooling on the six test surfaces, respectively. For the hydrophilic plain surface (FIG. 17A), the heat flux increases monotonically with the increase of surface subcooling. This is due to the dominant thermal resistance of the liquid condensate film. As the surface subcooling increases, the temperature difference between the vapor and liquid film surface increases, which increases the driving force for vapor condensation. Similar to the hydrophilic plain surface, filmwise condensation is also observed on the hydrophilic mesh surface (FIG. 17B) and superhydrophilic hi-mesh surface (FIG. 17C). Despite that the heat flux increases with the increase of surface subcooling, the heat flux on the hydrophilic mesh surface and superhydrophilic hi-mesh surface are smaller than that on the hydrophilic plain surface. This is because the copper mesh layer is completely submerged by the liquid film, which makes the increased area by copper mesh ineffective. Even more unfortunately, the mesh layer hinders the flow of the liquid film and increases the thickness of the liquid film. Thus, the heat flux of the hydrophilic mesh surface is smaller than that of the hydrophilic plain surface. Compared to the hydrophilic mesh surface, the superhydrophilic hi-mesh surface covered by nanostructures further increases the contact area between the liquid film and mesh layer, which results in larger flow resistance of the liquid film. As a result, a smaller heat flux occurs on the superhydrophilic hi-mesh surface due to the increased thermal resistance. For the hydrophobic plain surface, discrete droplets roll off the surface due to gravity and they sweep off other droplets to clean the surface for re-nucleation (FIG. 17D). As expected, the heat flux on the hydrophobic plain surface is greatly improved over that of the filmwise condensation on the hydrophilic plain, hydrophilic mesh, and superhydrophilic hi-mesh surfaces. However, the heat flux on the superhydrophobic nano surface is highly dependent on the condensation mode under different surface subcooling. Under small surface subcooling, jumping-droplet condensation greatly increases droplet removal and improves condensation heat flux. However, when the surface subcooling increases to the point of flooding, the heat flux reduces below that of the dropwise condensation on the hydrophobic plain surface but remains above that of filmwise condensation. This is due to the droplet pinning on the surface, which greatly hinders surface refreshing (FIG. 17E). Compared to the other five surfaces, an enhanced dropwise heat flux is sustained on the superhydrophobic hi-mesh surface under large surface subcooling. Similar to that on the superhydrophobic nano surface, jumping-droplet condensation can greatly improve surface refreshing by rapid droplet removal and enhance heat flux under small surface subcooling (<4.5 K). However, the unique sucking flow condensation mode is only observed on the superhydrophobic hi-mesh surface under large surface subcooling (>4.5 K, FIG. S6H). Benefiting from the rapid droplet growth and surface refreshing, the liquid sucking flow significantly enhances condensation heat flux in a wide range of surface subcooling, up to 30 K (FIG. 16A). FIG. 16B compares the heat transfer coefficient of the six test surfaces as a function of surface subcooling. The filmwise condensation on the hydrophilic plain, hydrophilic mesh, and superhydrophilic hi-mesh surfaces shows the lower heat transfer coefficient due to the thermal resistance caused by liquid condensate film. When plain copper is covered by a hydrophobic coating, dropwise condensation obviously improves heat transfer coefficient compared to filmwise condensation. Jumping-droplet condensation on the superhydrophobic nano surface shows improved heat transfer coefficient in small surface subcooling compared to the conventional dropwise condensation on the hydrophobic plain surface. A sustaining enhancement of heat transfer coefficient is achieved on the superhydrophobic hi-mesh surface even under large surface subcooling, which is attributed to the simultaneously enhanced droplet growth and surface refreshing.

Multi-Layer Micro-Meshes for Capillary Liquid Film Boiling

Intro

Figure 2:
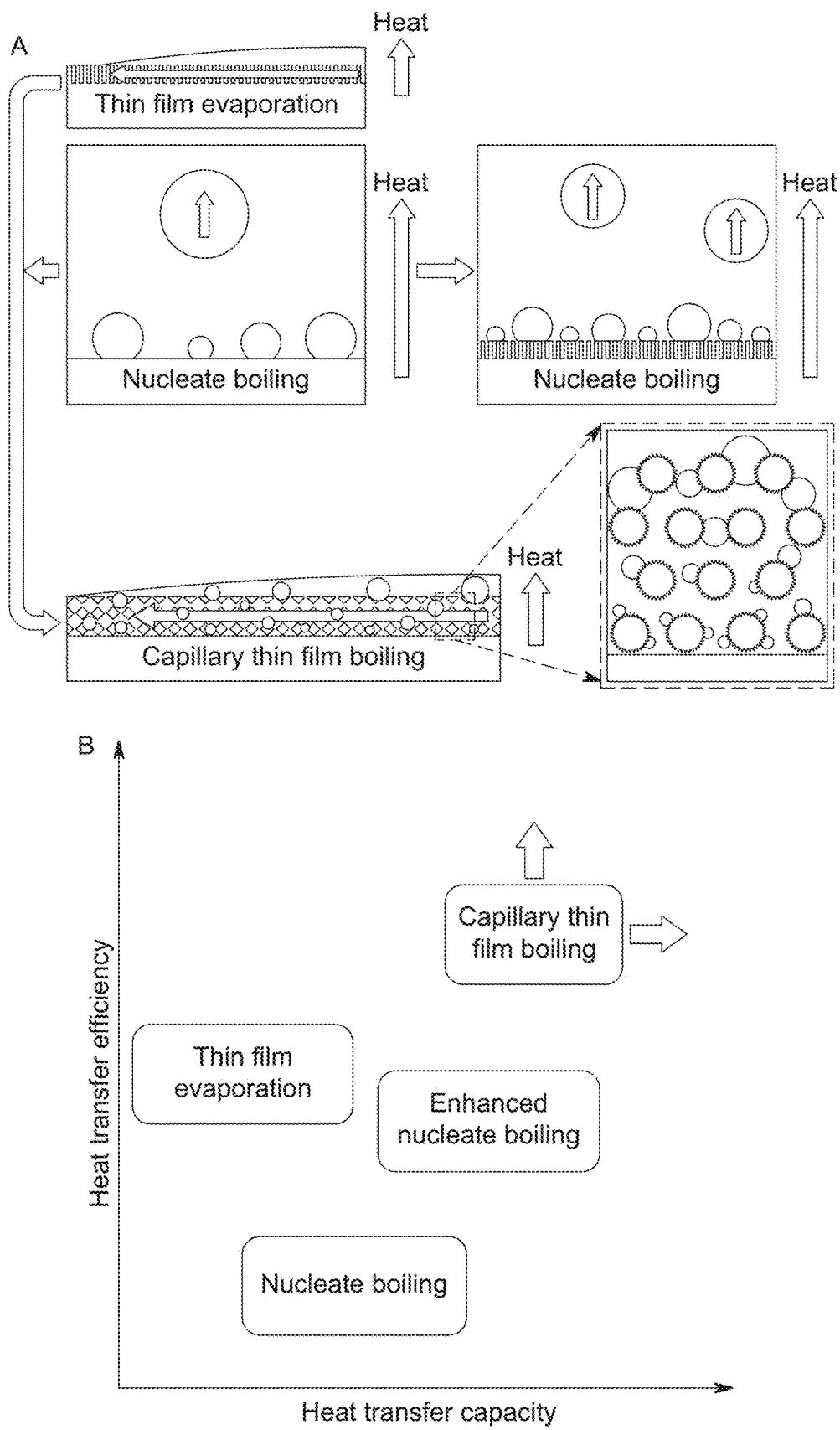
FIG. 2A illustrates various evaporation/boiling heat transfer modes.
FIG. 2B illustrates a chart comparing the heat transfer efficiency as a function of heat transfer capacity for the evaporation/boiling schemes shown in FIG. 1A.

FIG. 2A shows various methods of achieving evaporation/boiling for heat transfer. A comparison of the heat transfer efficiency (HTC) as a function of heat transfer capacity (CHF) is shown in FIG. 2B.

This portion of the disclosure describes a low-cost hybrid mesh wicking structure with bonded multi-layer woven meshes (e.g., a metal such as copper), or other porous materials, covered by chemically etched microcavities (and optionally a hydrophilic coating) to enable capillary thin film boiling for enhancing both CHF and HTC. Testing on samples formed from the methods disclosed herein revealed the following:

(1) A sharp increase in the heat flux vs. surface superheat is observed on a "thick mesh wicking structure" (n>2 layers) corresponding to the activation of liquid film boiling. This is attributed to the increased evaporation area of nucleated bubbles when the heat transfer mode transitions from single capillary evaporation on the top of a statured wicking structure to a regime where this evaporation is supplemented by additional boiling within the thick mesh wicking structure.

(2) Both the nanograsses and microcavities on the thick mesh wicking structures can increase wicking capability to improve the liquid supply for high CHF. However, the microcavities provide a large number of effective nucleation sites for early onset of nuclear boiling (ONB), which results in higher HTC; an advantage that nanograsses do not provide.

(3) 82% enhanced CHF (145.7 W/cm$^2$) and 69% increased HTC (133 kW/m$^2$ K) are observed due to more than twice the flow rate for liquid supply and more than one third reduced superheat for ONB on the hybrid mesh wicking structure (thick mesh wicking structure with microcavities), compared to the thick plain mesh wicking structure with the same mesh layers.

Structure

When multiple layers of woven mesh material (e.g., metal such as copper), or other porous layers or even a single thick porous material (e.g., metal foams), are bonded to each other and to a substrate, the primary means of thermal transport changes from condensation (as described relative to the single-layer disclosure earlier in this document) to boiling within this multi-layer or thick mesh (FIG. 18D) and evaporation on an outermost (or "second") layer of the multi-layer mesh (FIG. 18B). Thicker meshes can reduce the liquid wicking times, which can resupply liquid faster to delay surface dry out (see FIG. 24A). Heat transfer may be optimized at greater than 2 layers since liquid film boiling processes take over, whereas capillary evaporation dominates for 1 and 2-layer meshes (see FIG. 25). As such, for the purposes of this disclosure, a "thick mesh" will refer to any mesh having 3 or more layers, or a mesh with any number of layers that achieves predominantly liquid film boiling rather than capillary evaporation. However, the optimum number of mesh layers can vary based on mesh size, liquid flow, bubble removal, and effective heat transfer area. Multi-layer interconnected microchannels can be formed within the three or more layers of woven mesh and between the mesh and the substrate for capillary liquid wicking. This structure can cause a critical heat flux and a heat transfer coefficient to increase via capillary liquid film boiling with an onset of nucleate boiling at a small surface superheat, as compared to the prior art.

The mesh can have spacings between parallel wires between 10 μm and 500 μm (e.g., 65 μm, 130 μm, or 195 μm), and the wires making up the mesh can be between 20 μm and 100 μm in diameter (e.g., 65 μm in diameter).

Heat transfer can be further enhanced by growing nanostructures, such as nanograss (or any elongated nanostructure) on the meshes, and optionally also on the substrate. In part, this is due to increased wicking velocity resulting from nanostructure coatings (see FIG. 24C). These nanostructures can have a feature size of <1 μm, in one embodiment.

Heat transfer can be even further enhanced by then chemically removing/etching the nanostructures to form microcavities on the surfaces of the mesh wire and the substrate (FIGS. 18C and 18E). Microcavities also enhance liquid wicking, but to a greater extent than the nanograsses (FIG. 24C). Aside from improved liquid wicking, these microcavities also extend the thin film surface area on a top of the mesh, which enhances surface evaporation (FIG. 18C), and improve bubble nucleation within the multi-layer mesh, which promotes nucleate boiling within the multi-layer mesh (FIG. 18E). In an embodiment, the microcavities can have a feature size of 1-10 μm in diameter in diameter, when water is used as the working fluid. However, when low surface tension fluids are used, the microcavity size could change based on the effective size of the nucleation site for the fluids (e.g., diameter can be 0.1 μm-1 μm in diameter). Thus, the microcavity diameter can depend on the fluid used. Water is a preferred fluid due to high latent heat, but other FC fluids can also be used. Given the microcavity surface structure of these thick meshes, these will be referred to as "hybrid meshes" or "hybrid mesh wicking structures," and the assumption is that hybrid meshes include 3 or more layers. The height-to-width ratio of these microcavities can be in the range of 2-10.

Figure 34:
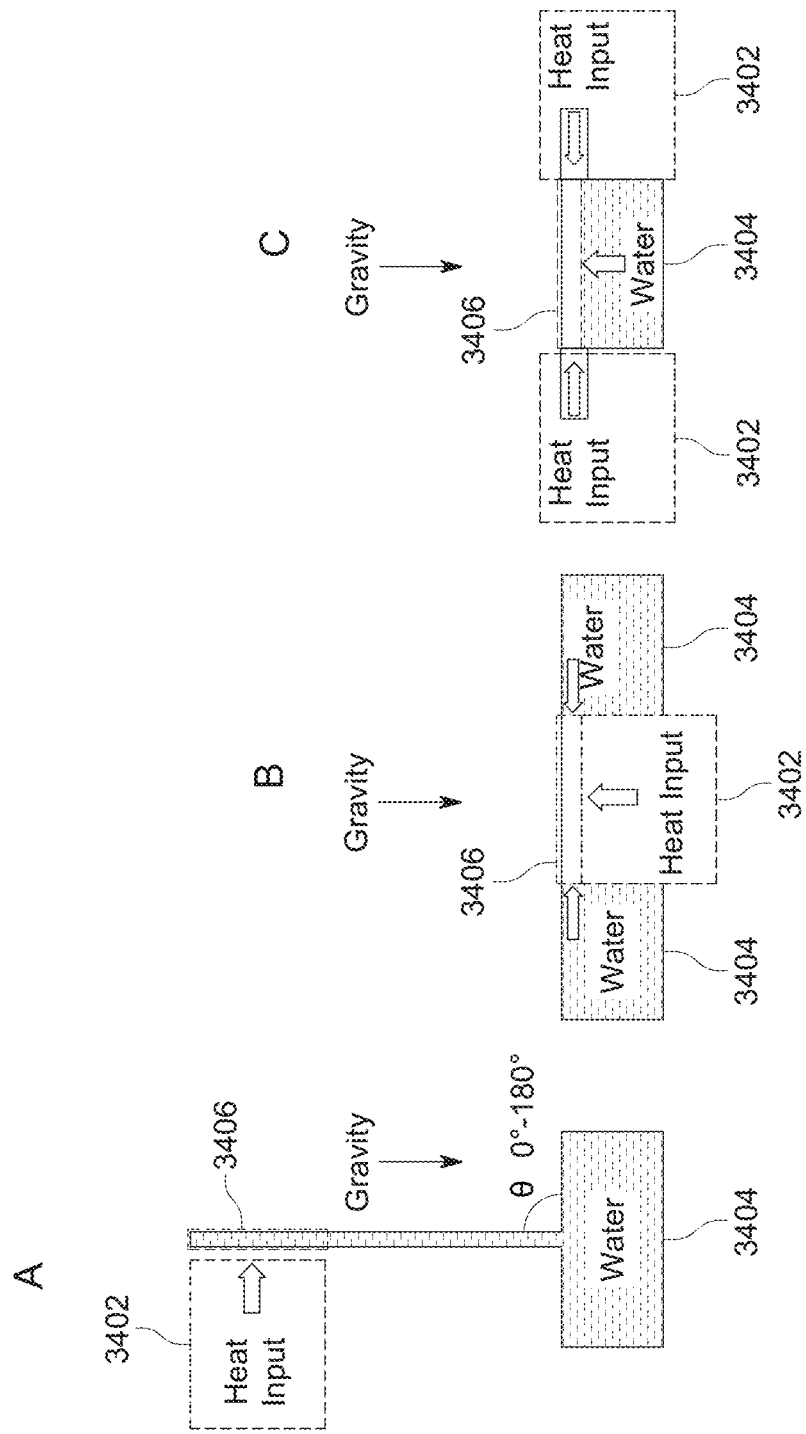
FIG. 34A illustrates a first embodiment of a heat transfer structure.
FIG. 34B illustrates a second embodiment of a heat transfer structure.
FIG. 34C illustrates a third embodiment of a heat transfer structure.

FIG. 34 illustrates three non-limiting examples of heat spreading systems implementing the above-described hybrid mesh. Each of the three systems includes a hybrid mesh 3406 coupled to one or more thermal or heat inputs 3402. Each hybrid mesh 3406 is also in contact with a liquid (e.g., water) source 3404, where capillary effects draw the liquid into the hybrid mesh 3406.

Theory

Figure 18:
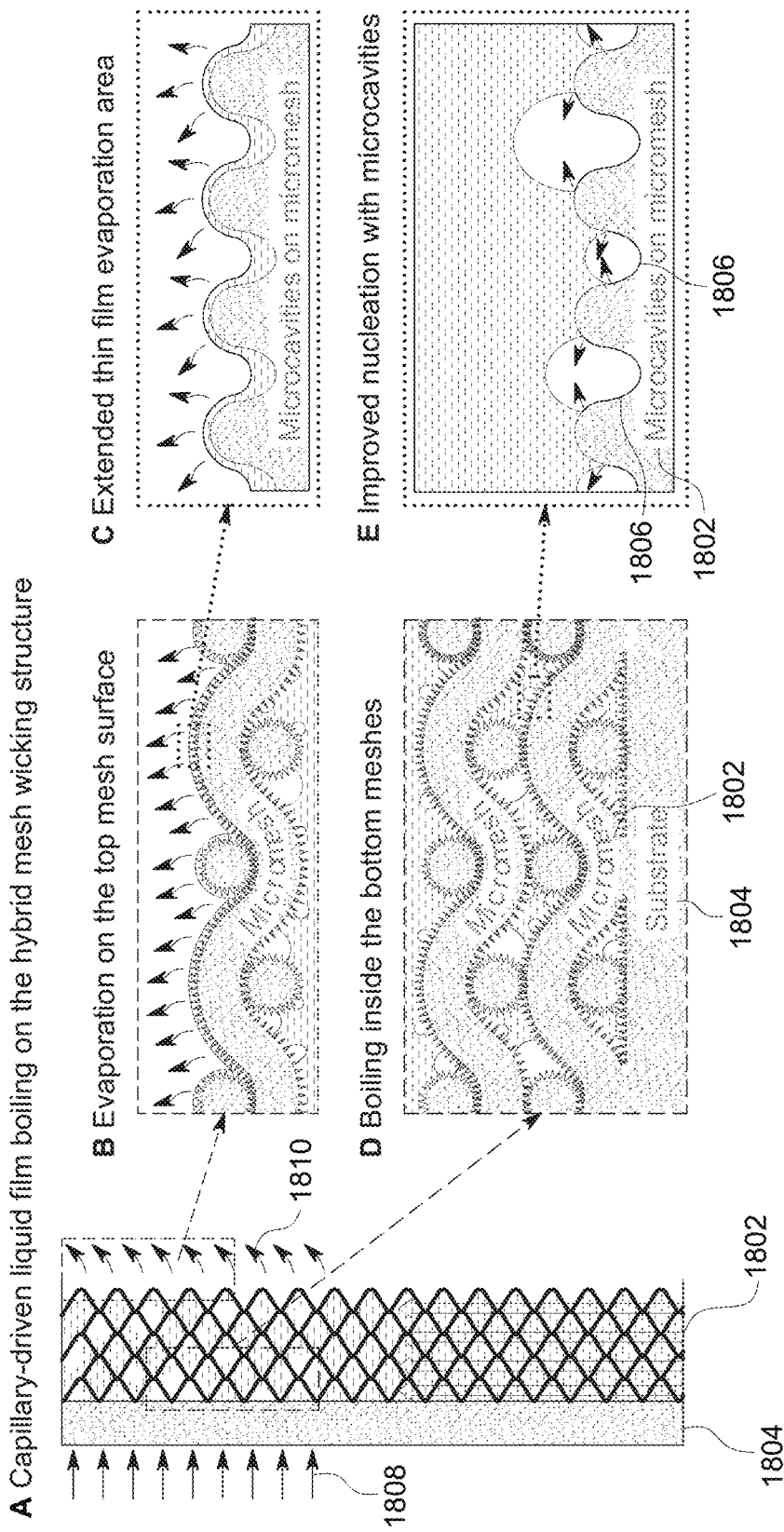
FIG. 18A illustrates simultaneous capillary evaporation and nucleate boiling on the thick multilayer copper woven meshes, with high mass flow rate of the liquid supply and increased nucleation sites within the wicking structure.
FIG. 18B illustrates liquid evaporation on the second side or surface of the hybrid mesh.
FIG. 18C illustrates the microcavities that enhance capillary evaporation due to the extended thin liquid film area near the tri-phase contact line.
FIG. 18D illustrates nucleate boiling inside the hybrid mesh.
FIG. 18E illustrates microcavities serving as nucleation sites on the mesh surface inside the hybrid mesh and promote boiling.

At a fundamental level, this multi-layer micro-mesh structure with microcavities, or hybrid mesh, enhances capillary-driven liquid film boiling heat transfer through promoting early onset of nuclear boiling (ONB) and sustaining the liquid supply (FIG. 18). Within the hybrid mesh, the interconnected microchannels act as the flow passages for supplying the liquid to the heated area by capillary wicking (see FIG. 18A where fluid is wicked vertically toward the heated area as indicated by the vertical arrows in the hybrid mesh). The liquid supply is further enhanced by increasing surface wettability for higher CHFs through creating microcavities on the mesh wires and optionally the substrate. When a heat source is applied on the hybrid mesh, liquid evaporation happens on the top, or the second side, of the mesh layers (FIG. 18B). Due to the expanded meniscus area and the thin film region near the tri-phase contact line on the microcavities (FIG. 18C), the liquid-vapor interfacial area for liquid evaporation is greatly increased. More importantly, when applied heat flux increases, liquid film boiling within the mesh layers is activated to create additional channels inside the hybrid mesh for liquid evaporation (FIG. 18D). The high-density microcavities with a feature size of 3-10 μm covering on the mesh wires and optionally the substrate provide a large number of effective nucleation sites for early ONB (FIG. 18E). By enhancing the liquid film boiling within the hybrid mesh (the bottom mesh layers) with the microcavities, the hybrid mesh creates a large area of liquid-to-vapor interface for evaporation and sufficient flow passages for sustaining the liquid supply, which provides an opportunity to simultaneously enhance both the CHF and HTC on the same wicking structure.

FIG. 18A illustrates simultaneous capillary evaporation and nucleate boiling on the thick multilayer copper woven meshes 1802, with high mass flow rate of the liquid supply and increased nucleation sites within the wicking structure. FIG. 18B illustrates liquid evaporation on the second side or surface of the hybrid mesh. FIG. 18C illustrates the microcavities 1806 that enhance capillary evaporation due to the extended thin liquid film area near the tri-phase contact line. FIG. 18D illustrates nucleate boiling inside the hybrid mesh. FIG. 18E illustrates microcavities 1806 serving as nucleation sites on the mesh surface inside the hybrid mesh and promote boiling. A first side of the hybrid mesh can be an outer surface of the substrate 1804 and can be in contact with the thermal or heat input 1808. The second side, or top surface, of the hybrid mesh can be an opposing side to the first side, and can be in contact with or in thermal communication with a thermal or heat output 1810. Movement of liquid from within the mesh structure up toward the second side can carry thermal energy between the thermal input 1808 and the thermal output 1810.

Figure 20:
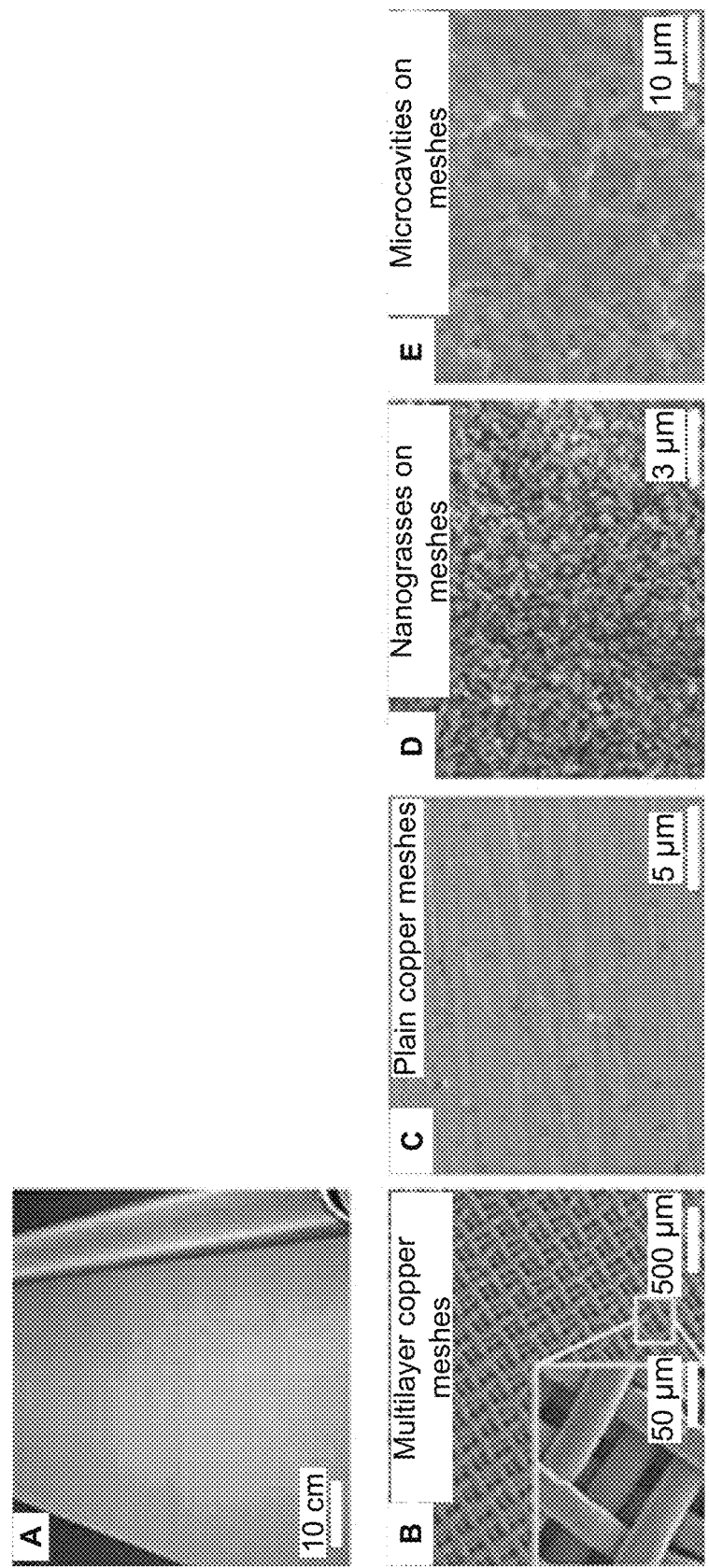
FIG. 20A illustrates a woven micromesh (commercial copper) used for low-cost and scalable manufacturing of hybrid meshes.
FIG. 20B is an SEM image showing a mesh wicking structure formed from multilayer woven meshes bonded to a copper plate or substrate.
FIG. 20C shows an SEM image of the wire surface of FIG. 20B with a plain copper surface topology.
FIG. 20D shows an SEM image of the wire surface of FIG. 20B with a nanograss surface topology.
FIG. 20E shows an SEM image of the wire surface of FIG. 20B with a microcavity surface topology.

FIG. 20B shows scanning electron microscopy (SEM) images of a hybrid mesh composed of multilayer copper woven micromeshes. The micro openings (30-130 μm in width) surrounded by the mesh wires (65 μm in diameter) serve as low-resistance flow passages and vapor/bubble channels from the substrate to the top of the hybrid mesh (i.e., the second side or surface of the hybrid mesh). Within the hybrid mesh, the interconnected channels act as the flow passages for supplying the liquid to the heated area. When multilayer woven meshes are bonded to the substrate, the effective pore size among mesh wires is reduced due to the stack of mesh layers (inset of FIG. 20B). Compared to the plain mesh wicking structures without obvious surface roughness (FIG. 20C), mesh surfaces with high-density nanograsses (e.g., knife-like copper oxide) (feature size of 1 μm) in FIG. 20D can greatly enhance the wetting and wicking capability of the hybrid mesh for capillary pumping. Compared to the plain (FIG. 20C) and nanograss-covered (FIG. 20D) mesh wicking structures, the mesh surfaces (e.g., metal such as copper) with microcavities (feature size of 3-10 μm) (FIG. 20E) provide a large number of potential nucleation sites to promote early ONB, which can greatly enhance liquid film boiling within the hybrid mesh.

FIG. 20A illustrates a woven micromesh (e.g., commercial copper) used for low-cost and scalable manufacturing of hybrid meshes.

FIG. 20B is an SEM image showing a mesh wicking structure formed from multilayer woven meshes bonded to a copper plate or substrate.

FIGS. 20C-E show SEM images of the wire surfaces of FIG. 20B with three different surface topologies: (c) plain copper; (d) with nanograsses; and (e) with microcavities.

Methods of Fabrication

Figure 19:
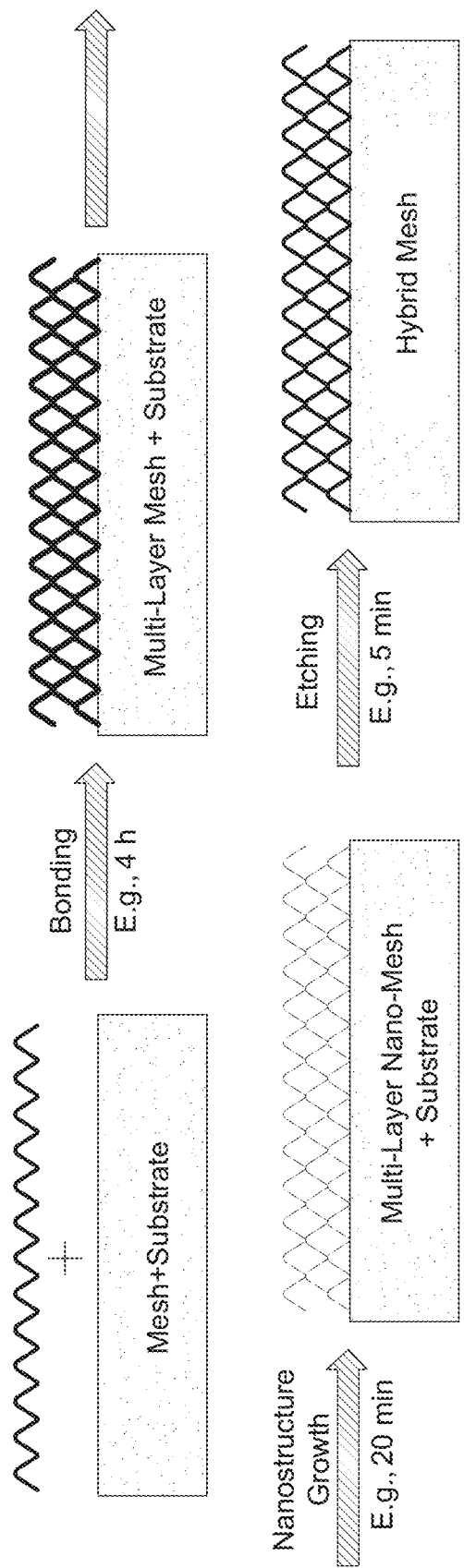
FIG. 19 shows a process for fabricating various test samples.

To fabricate the hybrid mesh, commercially available woven micromeshes (e.g., copper), or other porous layers, can be used as the starting materials (FIG. 19). FIG. 19 shows a process for fabricating various testing samples. The copper woven micromeshes (one or multiple layers) are stacked and bonded onto a plain thermally conductive (e.g., metal such as copper) plate (Block 3302 in FIG. 33). Nanograsses can then be grown on micromeshes and optionally on the plate (Block 3304). Microcavities can then be formed on the plate and micromeshes through etching (Block 3308). Etching can include, but is not limited to, chemical etching, sandblasting, electrodeposition, and machining.

In an embodiment, bonding can be preceded by cleaning of the substrate and woven micromeshes, for instance via an ultrasonic solvent bath (e.g., acetone) to remove the organic residues and can then be rinsed. In an embodiment, the ultrasonic bath can be performed for ~15 minutes, and the rinse can be ultrasonic and use isopropanol and can last for 5 minutes. The meshes and plates can then be soaked in an acidic solution (e.g., 5 wt. % dilute sulfuric acid) to remove native oxide (e.g., copper oxide where copper mesh and/or copper substrate are used) and rinsed in water (e.g., deionized (DI)). The cleaned meshes and plate can be stacked together, clamped (e.g., by two stainless steel flanges) and placed into a vacuum oven. After between 4 hours and 10 hours in the oven, the meshes can be bonded to the plate and form the thick mesh wicking structure (Block 3302).

To further increase the liquid wicking capability of the thick mesh wicking structure, nanograsses (e.g., copper oxide) can be fabricated on the mesh wire surfaces and optionally the substrate/plate by dipping the plain thick mesh wicking structure into, for instance, an alkaline solution (e.g., $NaClO_2$, NaOH, $Na_3PO_4 \cdot 12H_2O$ and DI water (3.75:5:10:100 wt. %)). This dipping can occur at, for instance, 90° C. After between 15 minutes and 30 minutes (e.g., 20 minutes), the thick mesh wicking structures can be removed, now with a nanograss coating all available surfaces of the meshes and optionally the plate (Block 3304).

To further enhance the liquid film boiling, the nanograsses can be removed via chemical cleaning or etching to form high-density microcavities (Block 3308). This cleaning can be performed at 30° C., in a 5 wt. % dilute sulfuric acid solution, and for around 5 minutes.

In some embodiments, the microcavity formation can be followed by the creation of a hydrophilic coating (optional Block 3310). For instance, plasma polymerization or etching, electrochemical deposition, or solvent-mediated phase separation, to name three, can be used to create a hydrophilic coating.

Test Results

Figure 21:
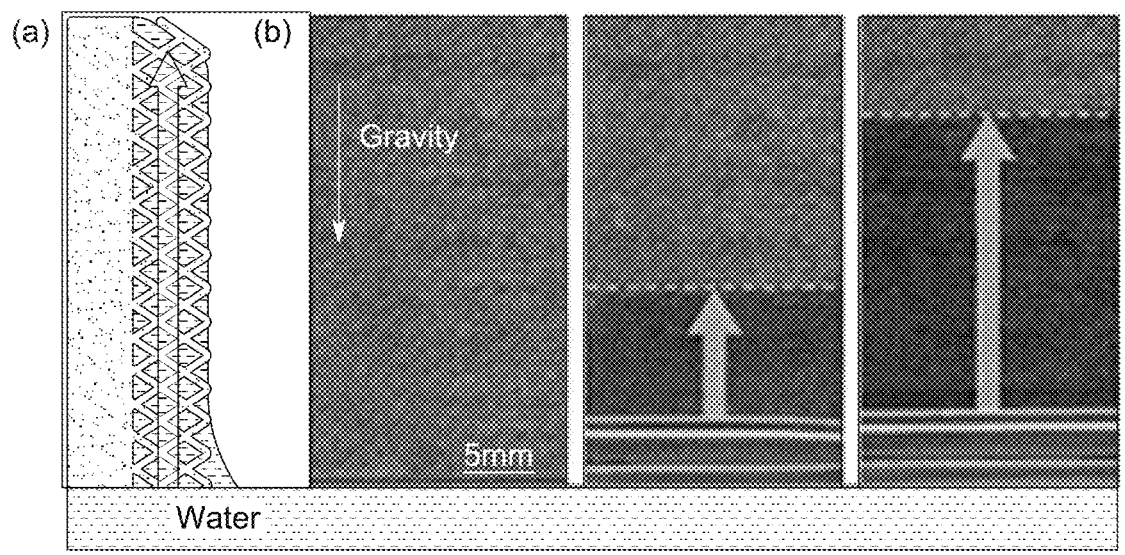
FIG. 21A shows a cross-sectional view of a micromesh wicking structure.
FIG. 21B shows snapshots of the water wicking experiments on vertically mounted mesh wicking samples.
FIG. 21C shows structural parameters of various test sample with different layers.

This section begins with a description of the test setup and samples used to characterize the multi-layer structures herein disclosed. Prior to heat transfer experiments, wicking experiments are conducted to evaluate water supply capability (capillary pumping) of the plain, nanograss-covered and microcavity-covered multilayer mesh wicking structures that are vertically mounted (FIG. 21A). The length and width of the test samples are 25 mm and 10 mm, respectively. Once the bottom of the sample is in contact with the surface of bulk water (FIG. 21B), the front line of the wicking process on each sample is recorded to quantitatively evaluate the instantaneous wicking velocity, $\bar{v}_w = dl_w/dt$, where $l_w$ is the distance between the front line of the wicking liquid and the water level. During heat transfer experiments, liquid supply is determined by the flow rate of liquid flow from the water level to the heated area (top of test sample). The average wicking velocity for the water flowing through the sample is calculated, $v_w = l_w/t$. The average volumetric flow rate of liquid supply by capillary wicking can be calculated, $u_w = v_w \delta_l w_l \varepsilon_l$, where $\delta_l$, $\varepsilon_l$, and $w_l$ are the thickness, porosity, and width of mesh wicking structures, respectively. FIG. 21B shows snapshots of the water wicking experiments on vertically mounted mesh wicking samples.

The structural parameters of various test sample with different layers are shown in FIG. 21C. The porosity is obtained by the measured thickness of the sample and the diameter of mesh wires. With the increase of mesh layers, the thickness increases from 85 μm (1-layer) to 370 μm (5-layer) while the porosity of wicking structures decreases from 57.3% (1-layer) to 50.9% (5-layer) due to the stacking of multilayer meshes.

Figure 22:
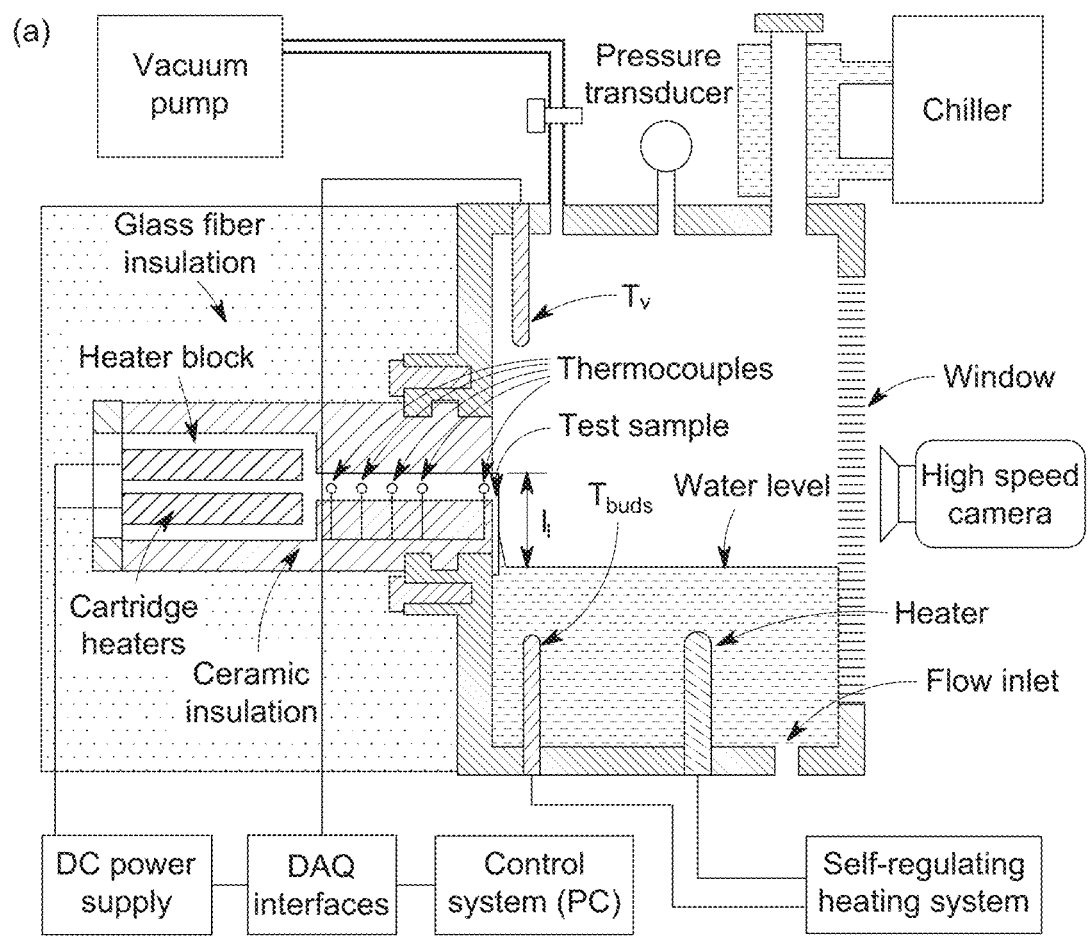
FIG. 22 shows the experimental setup used in measurements of the multi-layer samples.
Figure 23:
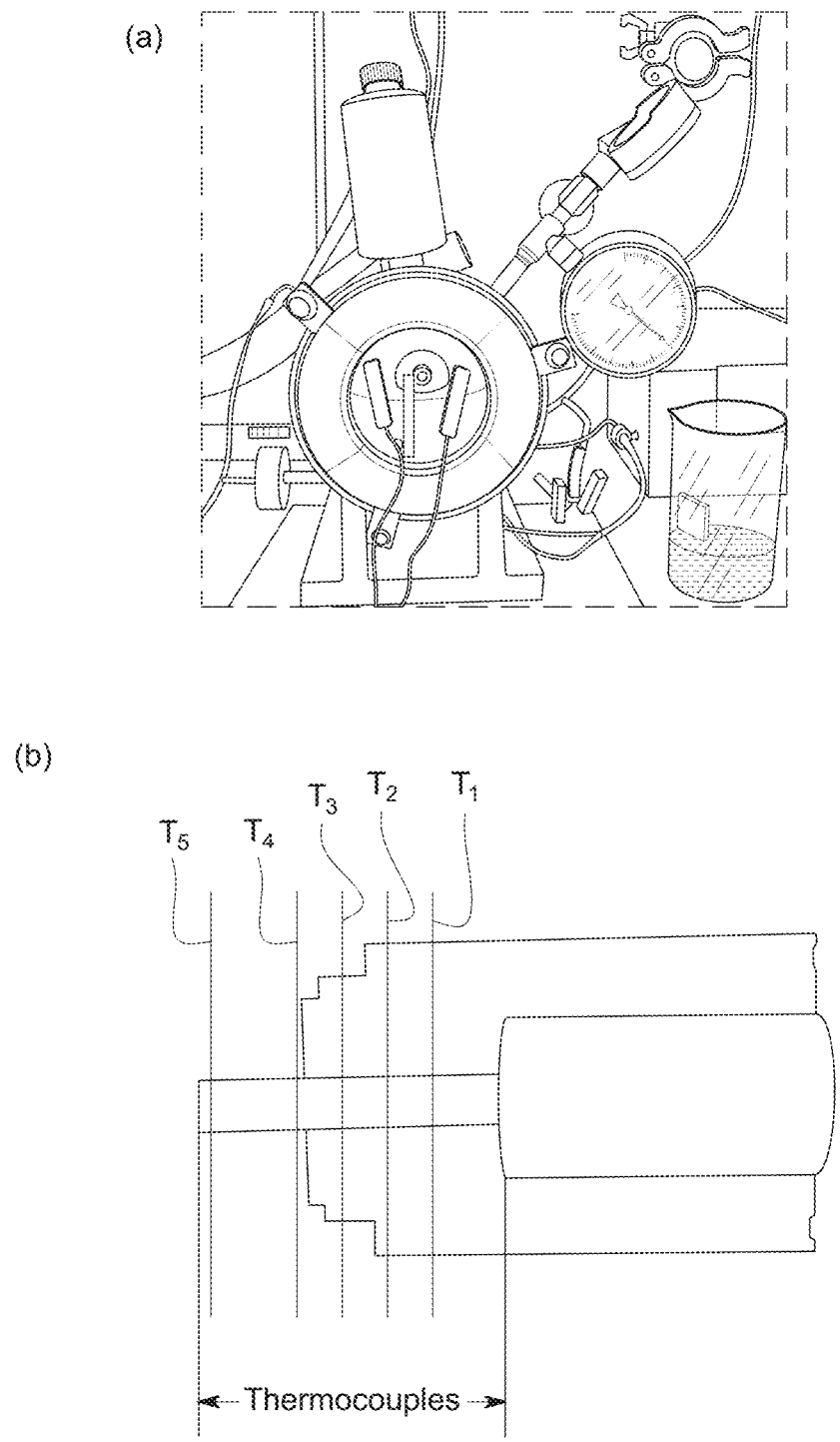
FIG. 23A shows a photograph of a portion of the test structure shown in FIG. 22.
FIG. 23B illustrates the heater-thermocouple block assembly along with the thermal insulation.

Measurement of the heat transfer performance and the visualization of the liquid-vapor interface were conducted using a custom-built experimental system, which consists of an evaporation chamber, a heater block, a condenser, and a visualization system (FIGS. 22 and 23A). The evaporation chamber provided a saturated environment for heat transfer measurements where in Boulder the atmospheric pressure is 84.5 kPa due to the high altitude with a saturated water temperature of 95° C. The DI water in the chamber as vigorously boiled to degas for 4 hours. The saturated environment as created by repelling the air through water vapor generated by boiling water in the chamber. The test sample was vertically mounted on the copper heater block, which was connected with the evaporation chamber and tightly sealed with silicone O-rings. The water level as maintained at a fixed height from the top of test samples of $l_j = 20$ mm throughout each measurement. The condenser installed on the top of evaporation chamber as connected with a chilled water bath (Thermo Electron Corporation, HAAKE Phoenix II) to condense the vapor back to the chamber.

FIG. 23B illustrates the heater-thermocouple block assembly along with the thermal insulation. The heat input with an area of 10 mm×10 mm was provided by four cartridge heaters (Watlow FIREROD) embedded into the back end of the copper block. Each test sample was attached to the heater block by a solder joint. The cartridge heaters in the block were used to heat the block assembly to a temperature of 200° C., allowing the solder to fill the voids. Post-test destructive inspection of this solder joint revealed no obvious void areas between the tip of heater block and test samples. Five T-type thermocouples (Omega) were inserted into 0.1 mm diameter holes at a separation distance of 10 mm. The last thermocouple, $T_5$ was 20 mm from $T_4$ and 0.5 mm from the top of the heat block. The entire heater block was insulated by the ceramics with 20 mm in thickness. The DC power supply gradually increased the heat flux input (applied power) to the test sample. Each heat flux was maintained for more than 60 min until the temperatures and heat flux reach the steady state where the temperature changes at a rate of less than 0.2 K over a period of 10 min. As the voltage increases, the experimental data were recorded until the dryout condition was reached. Visualization of liquid-vapor interface characteristics was conducted using a high-speed camera (Photron FASTCAM SA4) through a window where a fiber optic illuminator (TechniQuip) was used as the light source.

The heat flow q" through the heater block was obtained from the temperature measured using thermocouples and found to be one-dimensional for all the heat transfer experiments. Here, $$q'' = \frac{1}{3} k_{Cu} \left( \frac{T_1 - T_3}{\Delta x_{13}} + \frac{T_2 - T_4}{\Delta x_{24}} + \frac{T_4 - T_5}{\Delta x_{45}} \right),$$

where $k_{Cu}$ is the thermal conductivity of copper (398 W/m K, measured using a laser flash apparatus) and $\Delta x_{ij}$ refers the distance between the thermocouples of $T_i$ and $T_j$. The superheat $\Delta T$, defined as the temperature difference between the substrate temperature $T_w$ and saturated vapor temperature $T_v$, can be calculated by the extrapolation of the measured linear temperature gradient in the block, $$\Delta T = T_w - T_v = T_4 - q'' \left( \frac{\Delta x_{45}}{k_{Cu}} + \frac{\delta_s}{k_s} \right) - T_v,$$

where the solder joint thickness $\delta_s$ was 0.1 mm and the thermal conductivity of the solder $k_s$ is 50 W/m K. The heat transfer coefficient h of the test sample is calculated as, $$h = \frac{q''}{\Delta T}.$$

The uncertainties of heat flux, superheat, and heat transfer coefficient, are determined using standard procedures, $$U_S = \sqrt{\Sigma_1^N \left(\left(\frac{\partial S}{\partial a_i}\right) U_{a_i}\right)^2},$$

where S is a calculated parameter, Us is the uncertainty in S, $a_i$ is a measured parameter, and $U_{ai}$ is the uncertainty in parameter $a_i$. The uncertainties of temperature are ±0.2 K, which is determined by the thermocouples. The uncertainties of distance measurements are ±0.5 mm, which is estimated by the diameter of thermocouple holes. The uncertainty of solder joint thickness is ±0.025 mm.

The following paragraphs describe the results of the above-described experiments. Liquid wicking performance is a key factor that determines the capillary pumping (liquid supply) capability and the resulting CHF of the wicking structure. To gain a quantitative understanding, the wicking capabilities of the vertically mounted wicking samples were characterized. FIG. 26A shows a time evolution of water wicking distances on the plain mesh wicking structures having two layers. For all the wicking structures with mesh layers from 1 to 5, water can wick through the 25 mm distance (the length of test samples). The instantaneous wicking velocity, $\bar{v}_w = dl_w/dt$, for the five test samples all decreased with the increase of wicking distance. This is because as the wicking distance increases, the weight of liquid film and the liquid flow resistance increase while the capillary driving force remains almost unchanged. As the mesh layer increases from 1 to 5, the time for the liquid flow through the 25 mm test sample reduces from 1.59 s to 0.57 s. Such reduced wicking time for thicker samples is attributed to more interconnected channels between mesh layers, which provide high flow rate liquid supply to push the front contact line forward.

Figure 24:
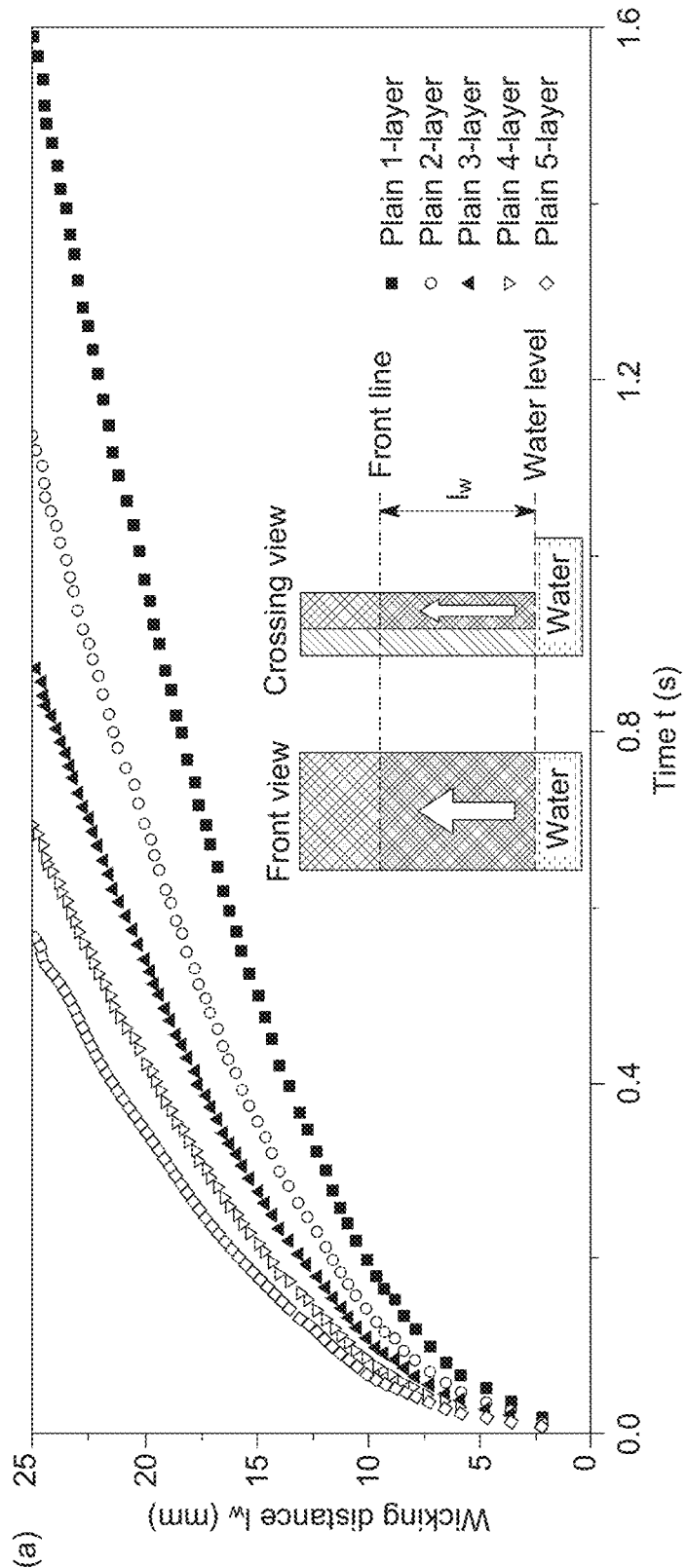
FIG. 24A shows water wicking distance as a function of time t for the plain mesh wicking structures with different mesh layers.
FIG. 24B shows the average wicking velocity and average volumetric flow rate as a function of mesh layers for the five plain mesh wicking structures.
FIG. 24C shows that nanograsses and microcavities further improve the liquid supply capability.
Figure 24:
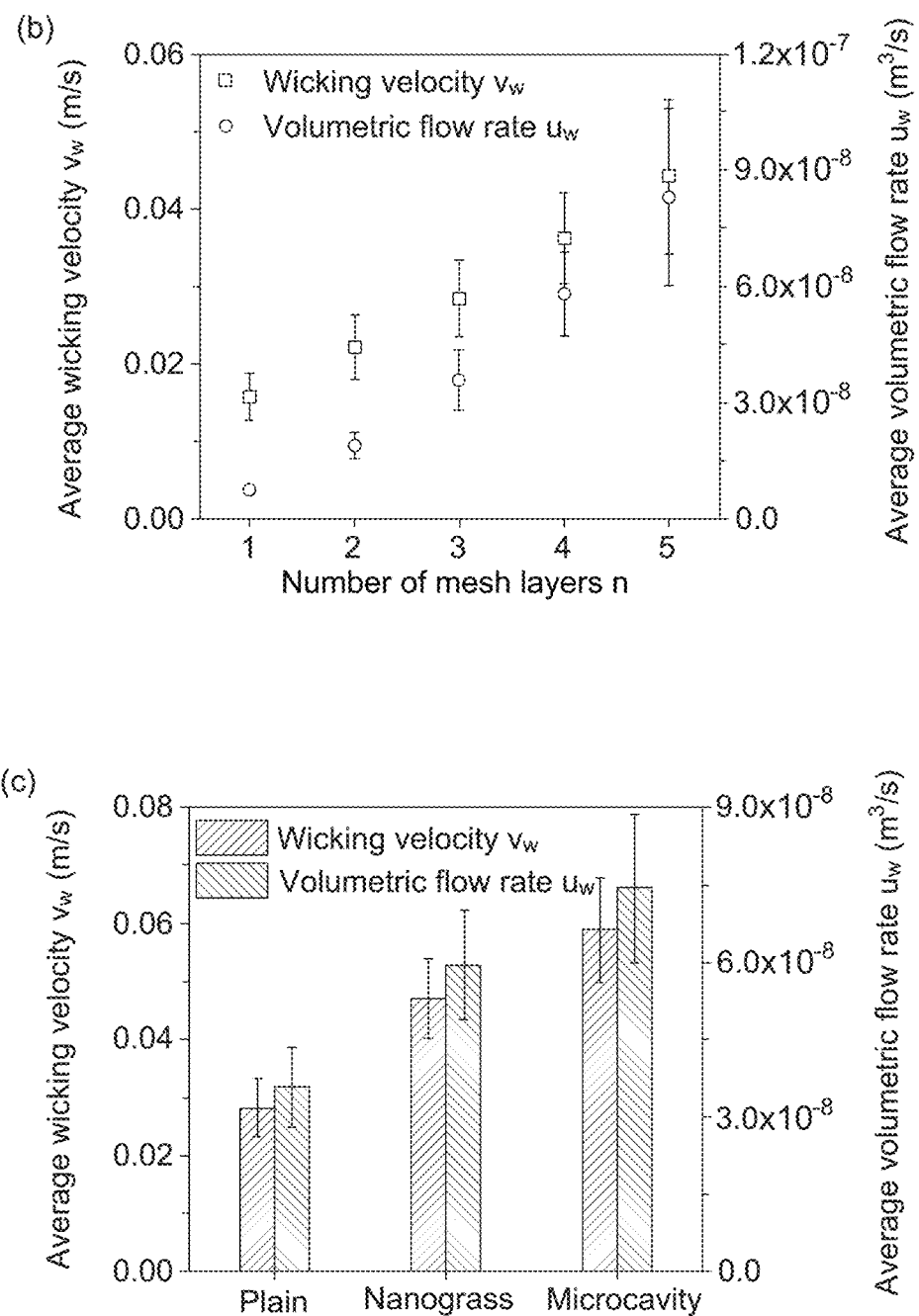

FIG. 24 shows liquid supply (capillary pumping) capability of various mesh wicking structures. FIG. 24A shows water wicking distance $l_w$ as a function of time t for the plain mesh wicking structures with different mesh layers. FIG. 24B shows the average wicking velocity ($v_w = l_w/t$) and average volumetric flow rate ($u_w = \delta_t \varepsilon_l l_w/t$) as a function of mesh layers n for the five plain mesh wicking structures. When the mesh layer is increased from 1 to 5, the average wicking velocity increases from 0.015 m/s to 0.044 m/s and the average volumetric flow rate increases tenfold from 7.6×$10^{-9}$ m$^3$/s to 8.3×$10^{-8}$ m$^3$/s, respectively. The more than tenfold increase in the volumetric flow rate can provide rapid liquid supply to the heated area for high CHF. FIG. 24C shows that nanograsses and microcavities further improve the liquid supply capability. Compared to the plain mesh wicking structures (3-layer mesh as an example), the wicking velocity in the mesh wicking structures with nanograsses is improved from 0.028 m/s to 0.047 m/s and the volumetric flow rate from 3.6×$10^{-8}$ m$^3$/s to 6.0×$10^{-8}$ m$^3$/s, respectively. This is attributed to the higher surface wettability and wicking capability by increased surface roughness. The largest liquid wicking velocity (0.059 m/s) and highest volumetric flow rate (7.4×$10^{-8}$ m$^3$/s) are obtained on the mesh wicking structure with microcavities. Compared to nanograsses (feature size<1 µm), the microcavities (feature size of 3-10 µm) on the mesh wicking structures can not only increase surface wettability for large wicking capability but also increase liquid supply through the interconnected channels between the substrate and mesh wires.

Figure 25:
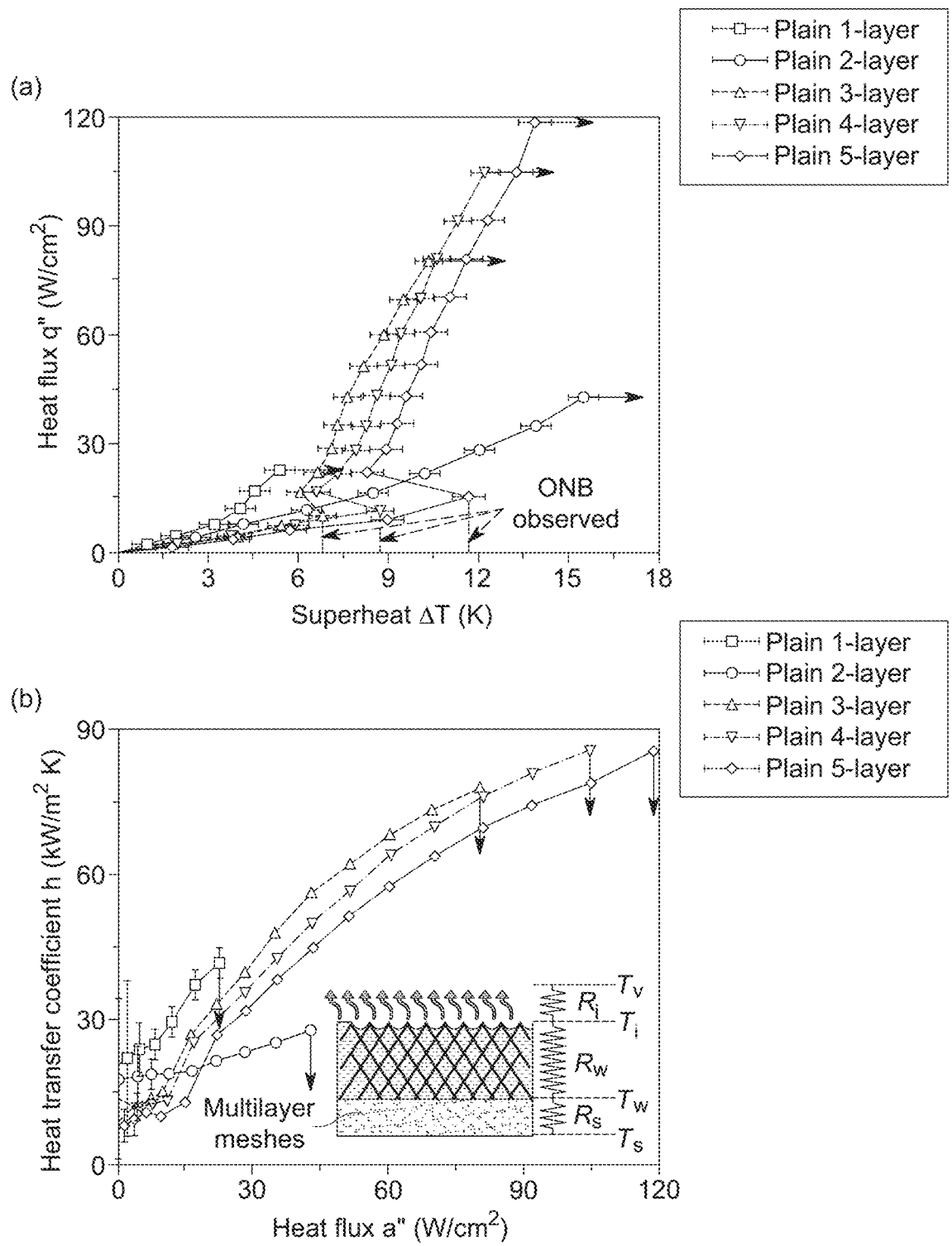
FIG. 25 shows the heat transfer performance and liquid-vapor interface characteristics of the capillary evaporation and liquid film boiling heat transfer on the plain mesh wicking structures with different number of mesh layers.

An enhancement to heat transfer performance occurs when the mechanism transitions from capillary evaporation to liquid film boiling. FIG. 25 shows the heat transfer performance and liquid-vapor interface characteristics of the capillary evaporation and liquid film boiling heat transfer on the plain mesh wicking structures with different number of mesh layers. For the thin wicking structures with 1-layer and 2-layer copper meshes, the evaporation heat flux slowly increases with the increase of superheat until dryout occurs at CHF of 22.5 W/cm$^2$ for 1-layer mesh and 44.7 W/cm$^2$ for 2-layer meshes, respectively (arrows in FIG. 25A). This is attributed to the capillary evaporation heat transfer mode at the liquid-vapor interface on the top of the statured wicking structure. Compared to the 1-layer mesh wicking structure, the increased thickness of the 2-layer mesh wicking structure improves the liquid supply from the bulk liquid to the heated area for larger CHF. Compared to the capillary evaporation on the 2-layer mesh wicking structure, however, the HTC of the 1-layer mesh wicking structure is larger at various superheat points before dryout (FIG. 25B), which is due to the smaller thermal resistance of the thinner 1-layer saturated wicking structures $R_w$ (inset of FIG. 25B). It can be seen from the visualization results that with the increase of superheat, the evaporation heat flux increases rapidly. However, the liquid cannot be sufficiently supplied to the heated area due to the thin wicking structures, resulting in a much-widened dryout region (FIG. 26A).

Figure 26:
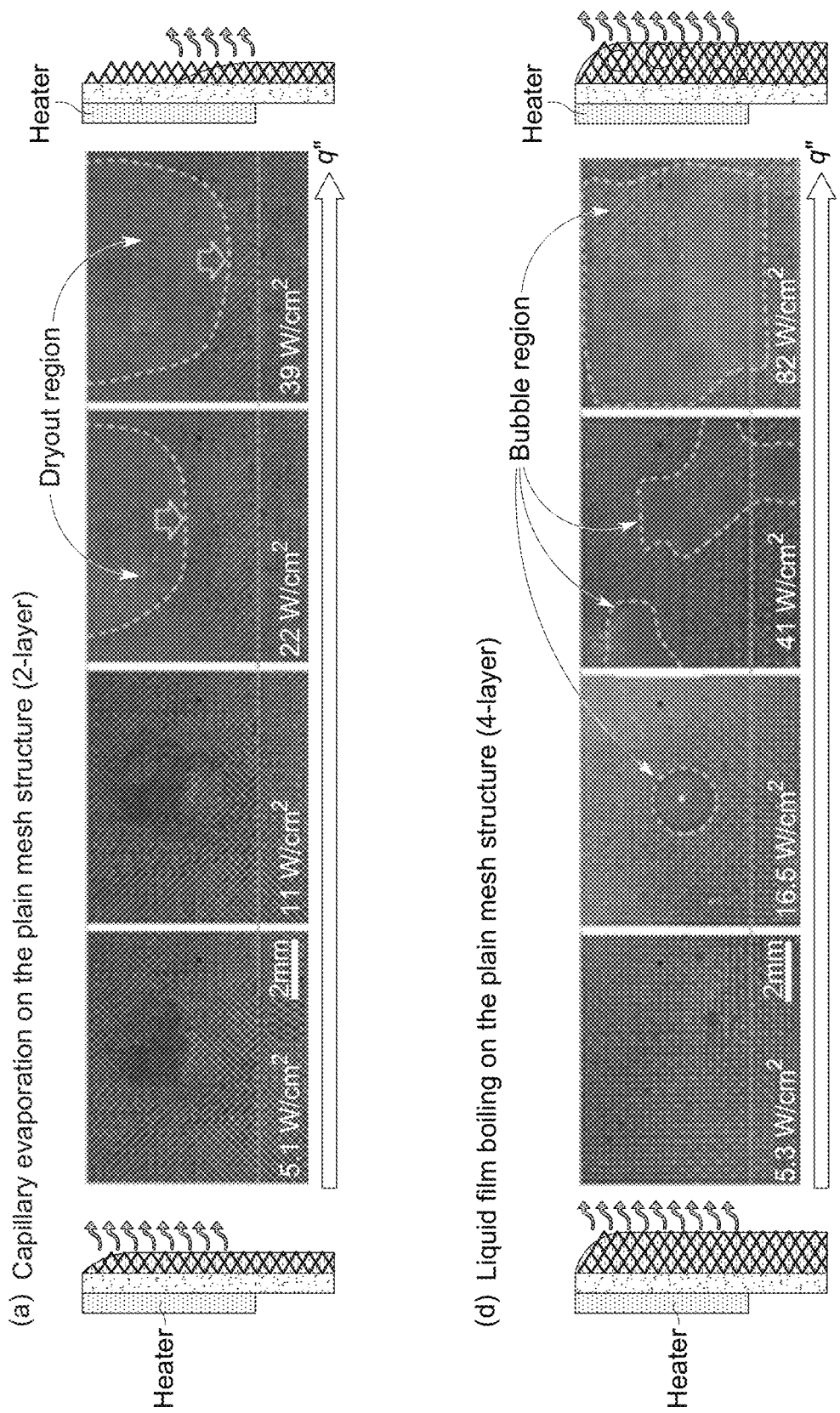
FIG. 26A shows capillary evaporation on the 2-layer mesh wicking structure.
FIG. 26B shows the transition from capillary evaporation to liquid film boiling on the 4-layer mesh wicking structure with the increase of heat flux input (or superheat)

FIGS. 25 and 26 show the transition from capillary evaporation to liquid film boiling on the plain mesh wicking structures. FIG. 25A shows heat flux as a function of superheat for the plain wicking structures with different mesh layers. The arrows indicate the CHFs. FIG. 25B shows heat transfer coefficient h as a function of heat flux q" for the plain wicking structures with different mesh layers. Thermal resistance network for a typical "saturated" mesh wicking structures. FIG. 26A shows capillary evaporation on the 2-layer mesh wicking structure. FIG. 26B shows the transition from capillary evaporation to liquid film boiling on the 4-layer mesh wicking structure with the increase of heat flux input (or superheat).

While capillary evaporation is seen for 1 and 2-layer meshes, 3-layer, 4-layer, 5-layer and thicker meshes see liquid film boiling. The ONB occurs at the superheat of 6.8 K, 8.8 K, and 11.6 K on the 3-layer, 4-layer, and 5-layer mesh wicking structures, respectively. The activation of liquid film boiling leads to a sharp reduction of superheat (FIG. 25A), which results in a significantly enhanced HTC (FIG. 25B) for the heat flux beyond ONB. This is due to the additional heat transfer area (thin film region near the tri-phase contact line) created by the nucleated bubbles for liquid-to-vapor evaporation within the mesh wicking structures when compared to the single evaporation channel at the liquid-vapor interface on the top of mesh wicking structures. In addition, the dynamic behaviors of the bubbles can disturb the heated liquid within the wicking structures and decrease the temperature gradient of the liquid film, thereby reducing the thermal resistance for heat transfer through the wicking structures (inset of FIG. 25B). Also, the CHFs on the thick mesh (greater than 2 layers) wicking structures are greatly increased compared to that of thin mesh wicking structures (FIG. 25A). Specifically, the CHF on 3-layer, 4-layer, and 5-layer mesh wicking structures is significantly improved from 22.5 W/cm² on 1-layer and 42.7 W/cm² on 2-layer to 80.2 W/cm², 104.6 W/cm², and 118.6 W/cm², respectively. This is because the thicker wicking structures can provide more flow passages (channels between mesh layers) for liquid supply to rewet the heated area, in accordance with FIG. 24. Moreover, liquid film boiling dominates the heat transfer performance of thick wicking structures after the ONB, which takes heat directly away from the heated surface by vapor bubbles rather than being limited by the thermal resistance of the saturated wicking structures. Due to the activation of liquid film boiling, the superheat of thick wicking structures is also greatly reduced, which leads to higher evaporation heat flux at various superheat, i.e., higher heat transfer coefficient for the thick wicking structures. However, a thick mesh alone can still lead to dry out.

As noted earlier, to enhance the liquid film boiling heat transfer on the thick meshes, nanograsses and microcavities can be fabricated through an etching process to cover the mesh wire and substrate surfaces for improved liquid supply and increased nucleation sites. FIGS. 20D,E and 27A,B show heat flux as a function of superheat and the heat transfer coefficient as a function of heat flux on the test samples, respectively, including the plain, nanograss-covered, and microcavity-covered 3-layer mesh wicking structures. For all of mesh wicking structures, the ONB is observed and the liquid film boiling induces a sharp increase in heat transfer efficiency. Compared to the plain mesh wicking structures, the superheat required for the ONB on the thick mesh with nanograsses remains the same (6.8 K) while the CHF on the plain mesh structure, 80.2 W/cm², is increased to 114.8 W/cm² on the thick meshes with nanograsses. The enhanced CHF is attributed to the significantly increased surface roughness that the nanograsses provide. This roughness helps to improve the capillary wicking capability of the mesh structure, which enhances the volume of fluid that can be provided to the heated region of the mesh structure.

To activate liquid film boiling within thick meshes, the pressure difference between the nucleation sites and surrounding liquid should be larger than $\Delta P = 2\sigma_l/r_b$, where $\sigma_l$ and $r_b$ are the surface tension of the liquid and the radius of the bubble, respectively. For the saturated environment in the evaporation chamber, the range of effective nucleation diameter $d_n$ can be calculated as $$\{d_{n,min}, d_{n,max}\} = \frac{\delta_t C_2}{2C_1} \frac{\Delta T_w}{\Delta T_w + \Delta T_{sub}} [1\{\begin{array}{c}-\\+\end{array}\}\sqrt{1 - \frac{8C_1\sigma_1 T_{sat}(\rho_1)(\Delta T_w + \Delta T_{sub})}{\rho_v h_{fg} \delta_t (\Delta T_w)^2}}.$$

$d_{n,min}$ and $d_{n,max}$ are the minimum and maximum diameter of effective nucleation sites, respectively. $\delta_t$, $\Delta T_w$, $\Delta T_{sub}$, $T_{sat}$, $\rho_l$, $\rho_v$, and $h_{fg}$ are the thermal boundary layer thickness (~1 mm), wall superheat, degree of subcooling for the water (0° C., saturated environment in this study), water saturation temperature, water density, vapor density, and latent heat of the water, respectively. The wetting characteristics of test samples are reflected by two terms: $C_1 = 1 + \cos\theta$, and $C_2 = \sin\theta$, where $\theta$ is the apparent contact angle of the test sample. The diameter of effective nucleation sites is governed by both the surface wettability and the surface superheat.

Figure 27:
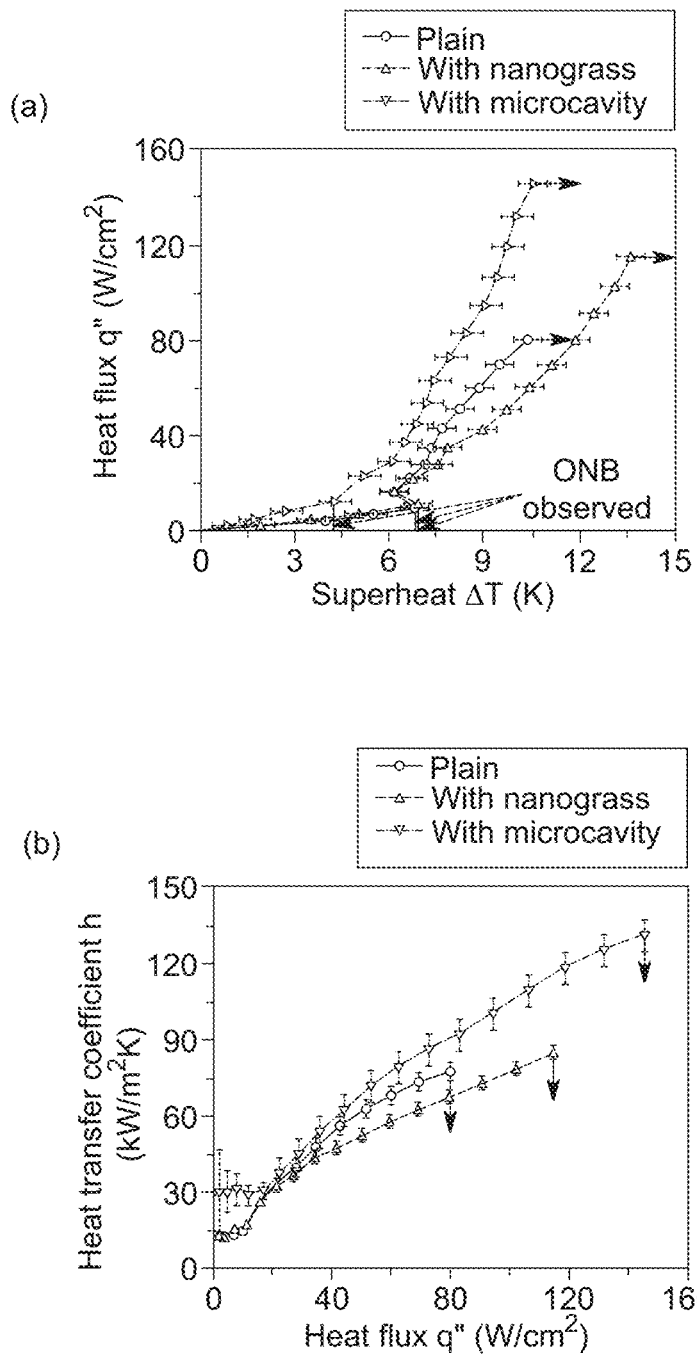
FIG. 27 shows enhanced liquid film boiling on the thick meshes (3-layer)
Figure 27:
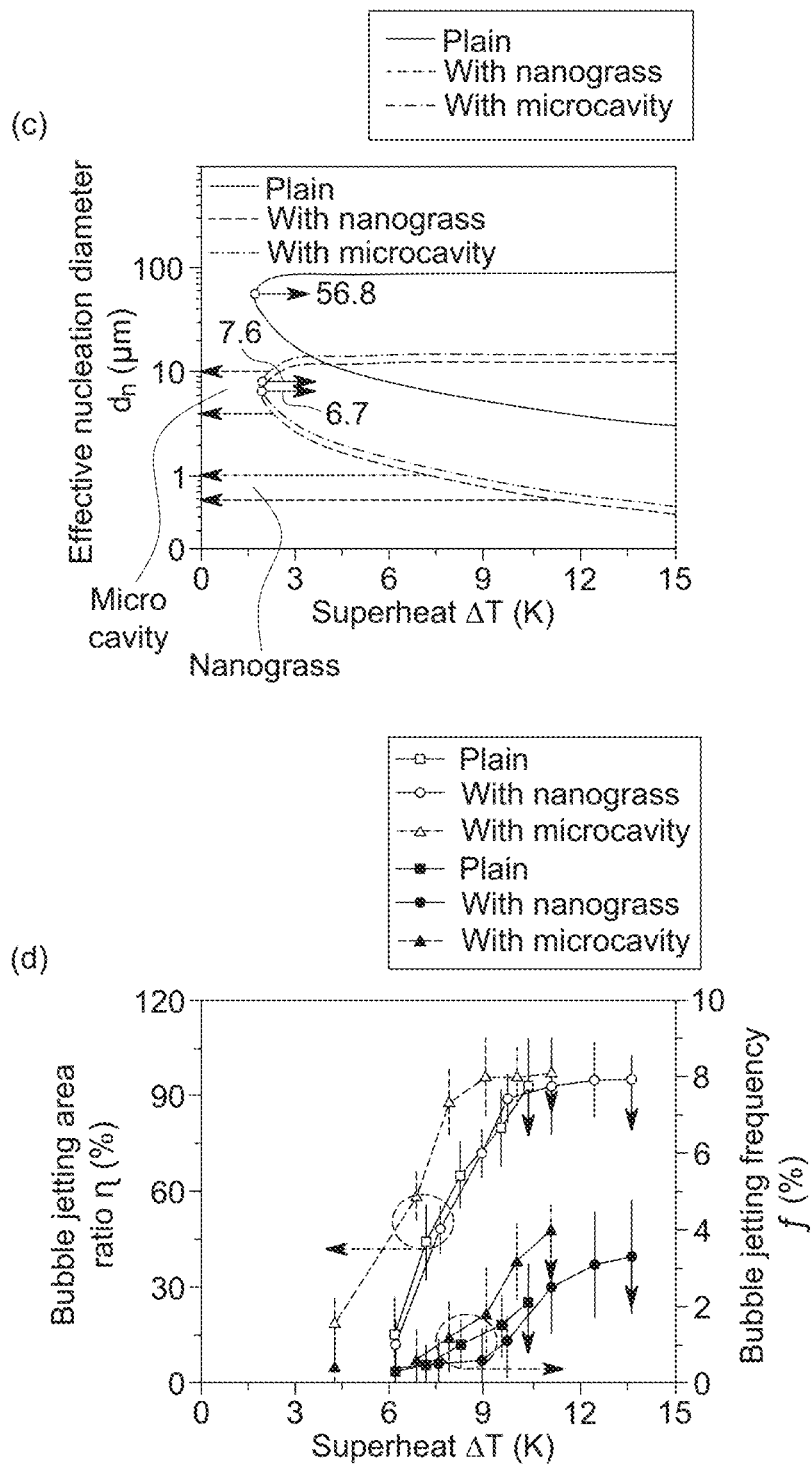

FIG. 27 shows enhanced liquid film boiling on the thick meshes (3-layer). FIG. 27A shows heat flux q" as a function of superheat $\Delta T$ for the plain, nanograss-covered, and microcavity-covered mesh wicking structures. The arrows indicate the CHFs. FIG. 27B shows heat transfer coefficient as a function of heat flux for the mesh wicking structures. FIG. 27C shows effective nucleation diameter $d_n$ as a function of superheat $\Delta T$ for the mesh wicking structures. Compared to the nanograsses, the microcavities can provide a large number of effective nucleation sites for earlier ONB. FIG. 27D shows bubble jetting area ratio and bubble jetting frequency as a function of superheat for the mesh wicking structures.

Although the effective nucleation diameter decreases from 56.8 μm to 6.7 μm due to the improved surface wettability (smaller contact angle) as shown in FIG. 27C, the characteristic size of the nanograsses (<1 μm) is still much smaller than the scale of effective nucleation sites (6.7 μm) in the liquid film boiling process. Thus, these high-density nanograsses do not increase the effective nucleate sites for enhancing liquid film boiling heat transfer when compared to the plain mesh wicking structures. Instead, mesh wicking structures with microcavities, see improved ONB and CHF compared to the plain and nanograss-covered mesh wicking structures (FIG. 27A). In particular, the superheat for the ONB is reduced from 6.8 K to 4.2 K while the CHF is increased from 80.2 W/cm² to 145.7 W/cm². FIG. 27B shows a significant improvement in HTC after the ONB is activated on the hybrid meshes. Among the three test wicking structures, the largest HTC of 133 kW/m² K is obtained at the heat flux of 145.7 W/cm² on the hybrid meshes. The enhanced heat transfer performance is attributed to the greatly increased number effective nucleation sites by the high-density microcavities with feature size of 3-10 μm covering the surfaces of the mesh wires and substrate (FIG. 27C). The microcavities can activate the liquid film boiling at a smaller superheat to achieve higher HTC and CHF, compared to the plain and nanograss-covered thick meshes.

FIG. 27D shows the quantitative liquid film boiling characteristics as a function of superheat on the three test mesh wicking structures including the bubble jetting area ratio $\eta = A_{jet}/A_{heat}$ and bubble jetting frequency f, where $A_{jet}$ and $A_{heat}$ are the bubble jetting area and heated area on the test sample, respectively. Once the ONB is activated on the three test samples at the superheat of 4.2-6.8 K, the bubble jetting area ratio rapidly increases up to more than 90% and the bubble jetting frequency increases slowly. As the superheat further increases (>9 K), the bubble jetting area ratio remains almost constant (92%-95%) and the bubble jetting frequency increases rapidly until the whole heated area dries out. Compared to the plain and nanograss-covered wicking structures, larger bubble jetting area ratio and higher bubble jetting frequency are obtained on the hybrid mesh due to the increased effective nucleation sites, resulting in enhanced CHF and HTC.

Multi-Layer Micro-Meshes with Gradient Channels for Capillary Liquid Film Boiling Enhancement Intro Through manipulating liquid wicking flow and vapor bubble escape on a hybrid mesh having varying grid sizes, thin film boiling is demonstrated to have a heat removal capability of at least 552 W/cm² from an area of 25 mm² with a surface temperature rise less than 8 K, corresponding to a heat transfer coefficient of 732.5 kW/m²·K.

This portion of the disclosure presents systems, methods, and apparatus for a capillary-driven thin film boiling heat transfer mechanism on a hybrid mesh that exploits the benefits of both thin film evaporation and nucleate boiling, with an unprecedentedly high CHF and HTC.

Structure

Figure 28:
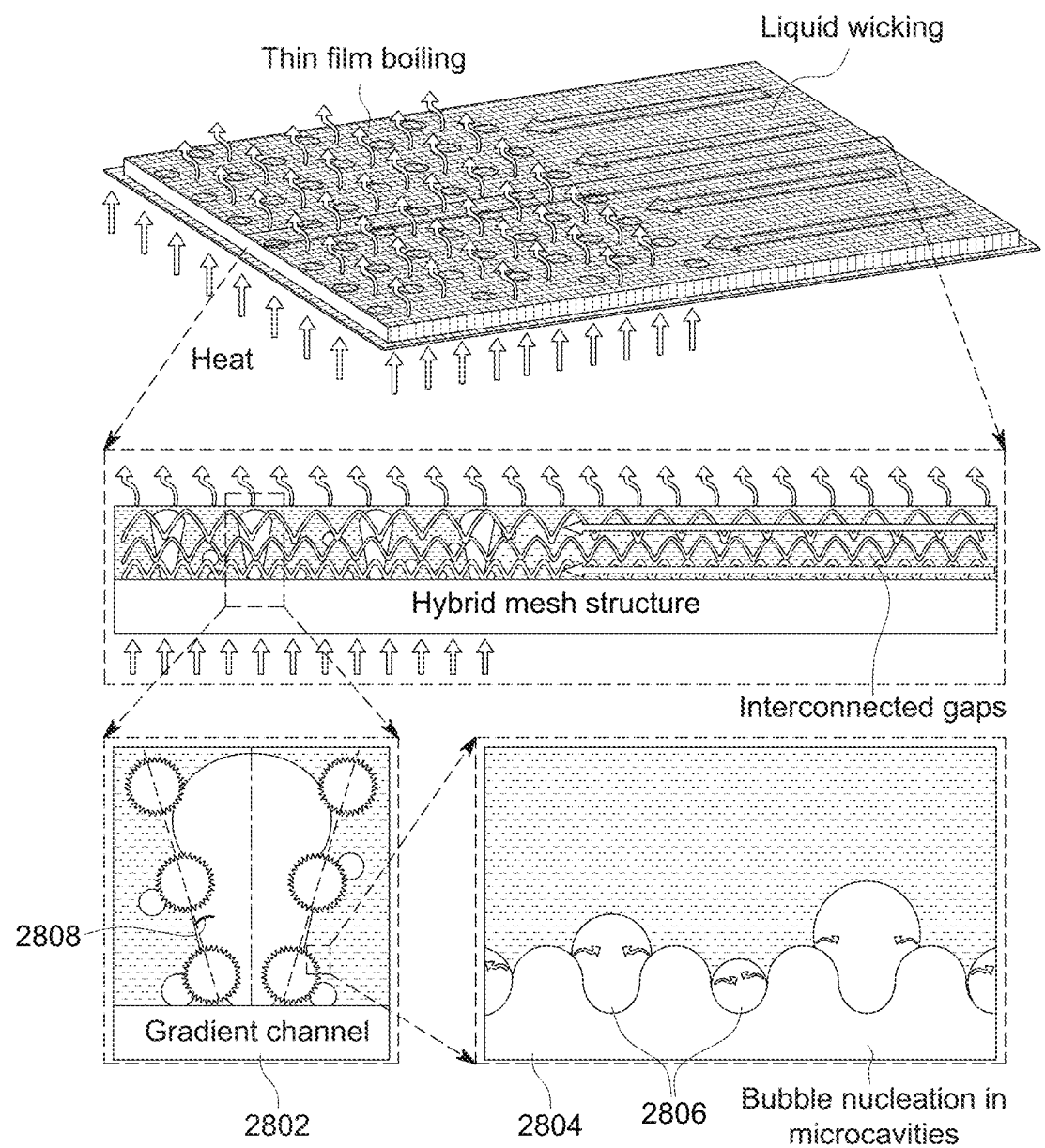
FIG. 28 shows a micro-grad-mesh for capillary driven thin film boiling heat transfer.

FIG. 28 summarizes the key idea in achieving ultra-high-performance capillary-driven thin film boiling through the combination of a high-flux liquid supply along the wicking structure, rapid vapor bubble nucleation in the wicking structure, and directional vapor removal from the wicking structure. The wicking structures consist of bonded multi-layer woven copper meshes with increasing micropore sizes, forming interconnected gaps between mesh layers and self-aligned gradient channels perpendicular to the mesh layers. High-permeability interconnected gaps, or multi-layer interconnected microchannels, between the mesh layers, and between the mesh and the substrate, serve as the low-resistance liquid flow channels with large capillarity for delivering liquid to re-wet the heated area. High-density microcavities, or other microstructures, can be created on exposed mesh wire surfaces to further enhance the capillary pumping capability for driving liquid flow along the wicking structure (e.g., by increasing boiling nucleation sites). In addition to improving liquid delivery, the microcavities on mesh wire surfaces act as a large number of effective bubble nucleation sites to activate nucleate boiling within the wicking structure at small surface superheat. After the vapor bubbles nucleate and grow in the microcavities, further growth and coalescence of the bubbles can push the growing bubbles out of the gradient channels perpendicular to the mesh layers.

Figure 29:
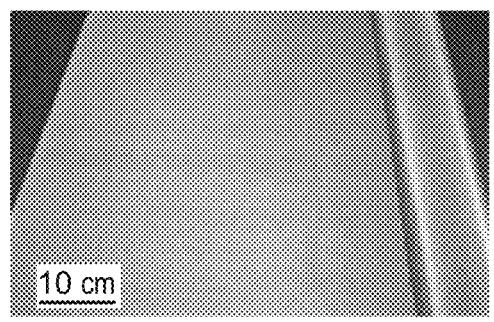
FIG. 29A shows a woven copper mesh.
FIG. 29B shows an SEM image of gradient channels in a multi-layer mesh.
FIG. 29C shows an SEM image of microcavities on the mesh.
Figure 29:
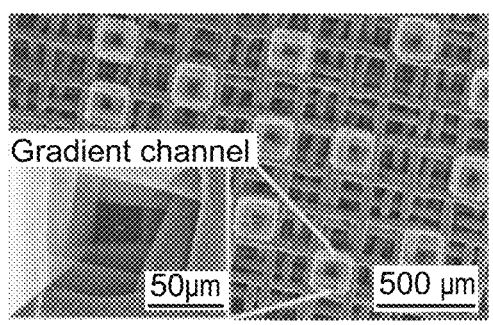
Figure 29:
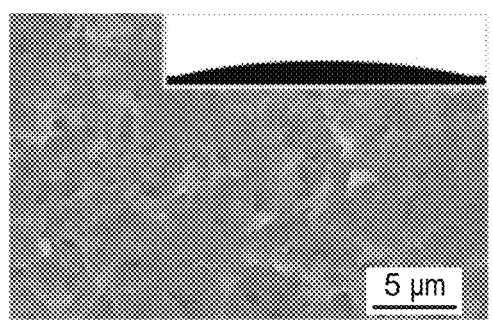

FIGS. 28 and 29 show a micro-grad-mesh for capillary driven thin film boiling heat transfer. FIG. 28 shows thin film boiling heat transfer on a hybrid mesh with gradient channels. Interconnected gaps between woven mesh layers, or other porous materials, can leverage high capillarity with high permeability for large liquid supply capability. The high-density microcavities covered on mesh wire surfaces provide a large number of nucleation sites for bubble nucleation at smaller superheat. The self-aligned gradient channels across the hybrid mesh can push vapor bubbles to escape from the wicking structure and thus suppress surface dry-out. One can see that the hybrid mesh can be arranged in proximity or contact with a heat or thermal input such as a surface of an integrated circuit. The thermal input can be in contact with a first side of the hybrid mesh. The thermal energy can be transported through the hybrid mesh via sucking flow condensation and then removed by either or both of evaporation or droplet falling on the second side of the hybrid mesh. As liquid is removed from that portion of the hybrid mesh where the thermal energy is greatest, cooler liquid from portions of the hybrid mesh remote from the thermal input can be wicked toward the thermal transport region to replenish the lost liquid (e.g., see "liquid wicking" in FIG. 28). The illustrated hybrid mesh includes three layers, but more than three layers can also be implemented while still achieving gradients and the benefits of boiling within the gradients. The lower left detail view of FIG. 28 shows a single gradient, formed from increasing micropores of three different mesh layers each having an increasing mesh size. The mesh can be arranged on a substrate 2802, and the wires in the mesh 2804, can include microcavities 2806 where nucleation of boiling occurs. Depending on the mesh sizes used, the gradient channels can have a range of opening angles 2808 relative to a perpendicular to the substrate, of between 30° and 90° and a density of between $10^5$-$10^6$/m$^2$.

It should be understood that the grad-mesh is a supplement to the hybrid mesh, and thus the discussion of hybrid meshes relative to FIGS. 18-27 is also applicable to the micro-grad-meshes of FIGS. 28-32.

Methods of Fabrication

The hybrid meshes can be formed by bonding multiple layers of commercially available meshes or other porous materials, such as copper woven meshes (FIG. 28B, #200, #145, and #100 meshes with mesh pores of 65, 130, and 195 µm respectively. The meshes of FIG. 29A have a 65 µm wire diameter) onto a substrate, such as a thin copper substrate, using a bonding method such as thermal diffusion or electroplating. The thickness $\delta_w$ and porosity $\varepsilon_w$ of the bonded three-layer mesh wicking structures in this example are 235-246 µm and 51%-53.7%, respectively. Due to the increasing mesh pore size of the three mesh layers (#200, #145, and #100 meshes from the bottom to top layer), about 20-25% of the overlapping mesh pores are self-aligned to form gradient channels perpendicular to the mesh layers (FIG. 29B). These gradient channels (inset of FIG. 29B) can facilitate directional vapor bubble escape from the wicking structure during the growth and coalescence of bubbles nucleated inside the wicking structure. High-density copper microcavities with a feature size of 3-10 µm are fabricated on the surface of all mesh wires through a two-step chemical etching process. Increasing surface roughness with such micrometer features can both improve surface wettability for higher capillary pumping capability and increase effective nucleation site density for bubble nucleation. Such a microcavity-covered mesh structure with gradient channels is herein referred to as a "micro-grad-mesh". For comparison, a plain-mesh sample is formed by bonding three-layers of plain #145 meshes, and a micro-mesh sample is formed by bonding three-layer microcavity-covered #145 meshes. These mesh wicking structures, including the plain-mesh, micro-mesh, and micro-grad-mesh all show excellent superhydrophilicity for liquid water wicking with an apparent contact angle smaller than κ° (inset of FIG. 29C).

FIG. 29A shows optical image of a commercially-available woven copper mesh used to develop the herein-disclosed micro-grad-mesh. FIG. 29B shows scanning electron microscopy (SEM) image showing an embodiment of the micro-grad-mesh. Three copper mesh layers with increasing mesh pore sizes are bonded together, resulting in self-aligned gradient channels for vapor bubble escape. FIG. 29C shows an SEM image showing high-density microcavities covering all the mesh wire surfaces of the embodiment in FIG. 29B. The inset shows an embodiment of the superhydrophilicity of liquid water on the micro-grad-mesh.

Prior to heat transfer experiments, liquid water supply capability is tested for the three example mesh wicking samples (FIG. 30A). During the wicking test, all the mesh wicking samples with a size of 10 mm×20 mm are vertically mounted and immersed in liquid water for $L_i$=2 mm. The wicking time Δt for water flowing from the water level to a distance of $L_w$=13 mm is recorded to quantitatively evaluate the wicking velocity, $v_w$=$L_w$/Δt and wicking volumetric flow rate, $u_w$=$W_w\delta_w v_w\varepsilon_w$, where $W_w$, $\delta_w$, and $\varepsilon_w$ are the width, thickness, and porosity of the test samples, respectively. Both the wicking velocity $v_w$ and volumetric flow rate $u_w$ are greatly increased for the micro-mesh and micro-grad-mesh structures when compared to the plain-mesh structure (FIG. 28A). Specifically, the wicking velocity is improved from 0.028 m/s to 0.059 m/s and 0.061 m/s, and the volumetric flow rate is enhanced from $3.6\times10^{-8}$ m$^3$/s to $7.4\times10^{-8}$ m$^3$/s and $7.7\times10^{-8}$ m$^3$/s for the micro-mesh and micro-grad-mesh structures, respectively. The wicking capability enhancement is attributed to the microcavity-increased capillary for driving water wicking flow through the mesh wicking structure with a higher flow rate. The larger wicking capability can supply more liquid water to the heated area during heat transfer experiments.

The heat transfer performance of the example hybrid mesh wicking structures was measured using a custom-made experimental chamber. The chamber provides a saturated environment for water vaporization on the vertically mounted test samples with a size of 10×20 mm² (inset of FIG. 29B). Each test sample is attached to the heated block by a solder joint and immersed in degassed de-ionized (DI) water for $L_i$=2 mm throughout the experiments. The heat is input to the top of test samples with a heated area $A_H$ of 5×5 mm², 8×8 mm², and 10×10 mm², respectively. The distance from the center of heated area to the water level is maintained at $L_w$=13 mm for all the tests. In Boulder, Colo., USA, the atmospheric pressure is 84.5 kPa due to the high altitude, leading to a low saturated temperature for water at 95° C. During the experiments, each heat input power is maintained for more than 60 min until the steady state is reached where the temperature changes at a rate of less than 0.2 K over a period of 10 min. The experimental data are recorded with increasing heat input power until the dry out condition is reached. The heat flux q" through heated area is obtained from the one-dimensional temperature distribution in the heater block measured using thermocouples. The superheat ΔT is defined as the temperature difference between surface temperature $T_W$ and vapor temperature $T_v$. The heat transfer coefficient h is calculated as, h=q"/ΔT.

Figure 30:
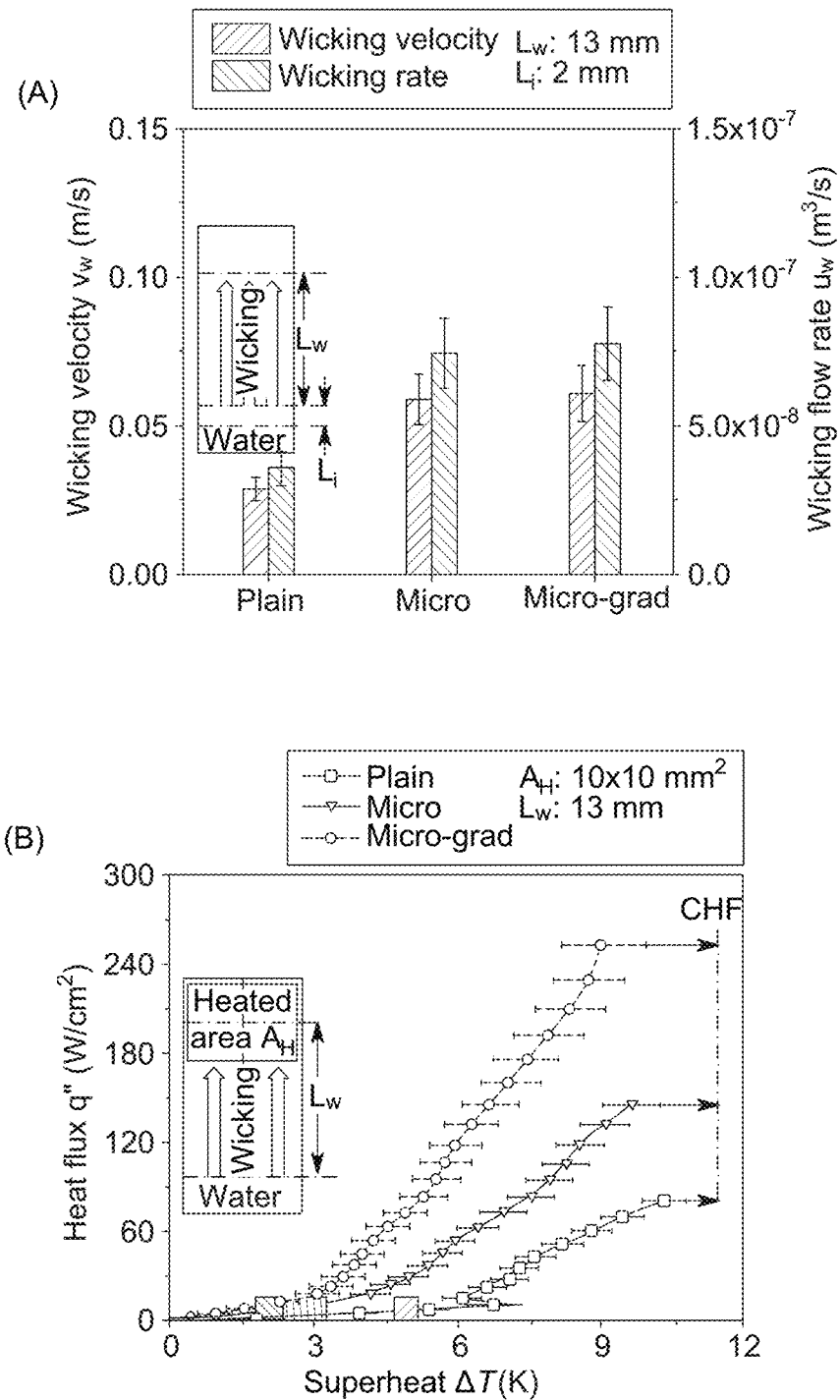
FIG. 30A shows water wicking velocity and volumetric flow rate for three vertical mesh wicking structures.
FIG. 30B shows heat flux as a function of superheat for the three tested wicking structures with a heated area of $10 \times 10$ mm$^2$.
FIG. 30C shows the heat transfer coefficient (HTC) as a function of heat flux for the three test surfaces.
FIG. 30D shows a comparison of CHF and maximum HTC for the three wicking structures with a heated area of $5 \times 5$ mm$^2$, $8 \times 8$ mm$^2$, $10 \times 10$ mm$^2$, respectively.
Figure 30:
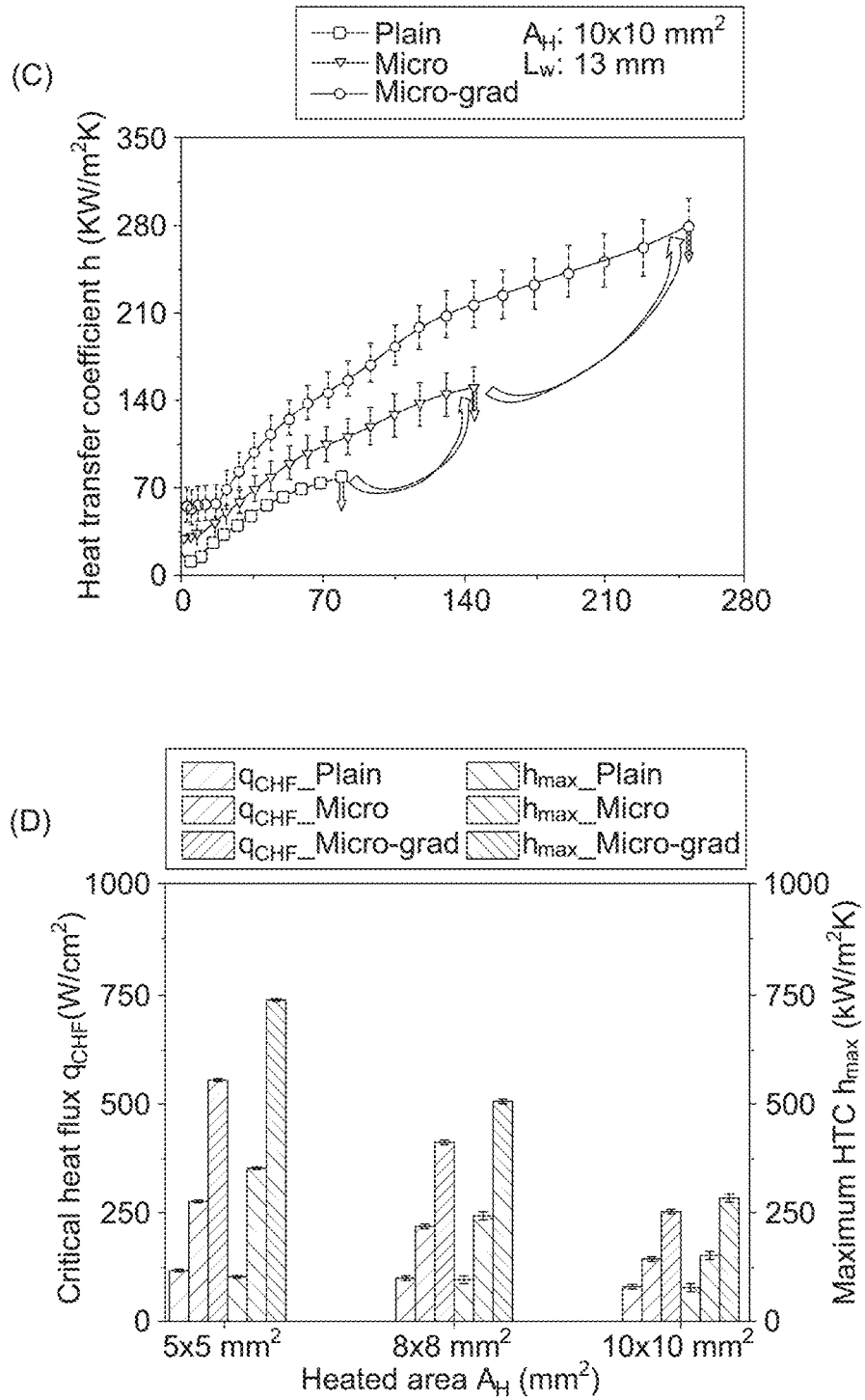

FIG. 30 shows thin film boiling heat transfer performance. FIG. 30A shows water wicking velocity $v_w$ and volumetric flow rate $u_w$ for three vertical mesh wicking structures. Hybrid mesh wicking structures with a size of 10×20 mm² are vertically mounted and immersed in liquid water for $L_i$=2 mm. Liquid water is supplied to wet the mesh structure with a distance of $L_w$=13 mm by capillary wicking. FIG. 30B shows heat flux q" as a function of superheat ΔT for the three tested wicking structures with a heated area $A_H$ of 10×10 mm². The distance between the water level and the center of the heated area $L_w$ in this experiment is 13 mm. The superheat for the onset of nucleate boiling (ONB) on the micro-mesh and micro-grad-mesh wicking structures are significantly reduced due to the increased nucleation sites with microscale roughness. A largest critical heat flux (CHF) can be obtained at smallest superheat on the micro-grad-mesh wicking structure. FIG. 30C shows heat transfer coefficient (HTC) h as a function of heat flux q" for the three test surfaces. A threefold-higher HTC is achieved on the example micro-grad-mesh structure due to both the improved liquid supply and the gradient channels for vapor escape. FIG. 30D shows a comparison of CHF $q_{CHF}$ and maximum HTC $h_{max}$ for the three wicking structures with a heated area $A_H$ of 5×5 mm², 8×8 mm², 10×10 mm², respectively.

FIG. 30B shows the heat flux q" as a function of superheat ΔT for the three test samples with a heated area $A_H$ of 10×10 mm², including the plain-mesh, micro-mesh, and micro-grad-mesh structures. For all the tested mesh wicking structures, the heat transfer process transitions from capillary evaporation to nucleate boiling with the increase of superheat (heat flux). This is evidenced by a sharp increase in the slope of heat flux, indicating a significant improvement in heat transfer efficiency. Compared with pure evaporation occurring just on the top of saturated wicking structures, the liquid-vapor interface area is significantly expanded due to the nucleation of vapor bubbles within mesh wicking structures. In addition, the dynamic behaviors of vapor bubbles can disturb the liquid film and decrease the temperature gradient across the liquid film, thereby significantly reducing the thermal resistance of liquid film confined in the wicking structure. Compared with the plain-mesh structure, the superheat for the onset of nucleate boiling (ONB) is decreased from 6.1-6.7 K to 2.7-3.4 K for the micro-mesh and micro-grad-mesh structures. This is because the high-density microcavities (3-10 μm) provide effective nucleation sites to facilitate vapor bubble formation at smaller superheat. More interestingly, the CHF of the micro-mesh structure is also greatly improved from 80.2 to 145.7 W/cm² compared with plain-mesh structure, which is attributed to the microcavity-enhanced liquid delivery through improved capillary pumping capability. For the micro-grad-mesh structure, CHF is further enhanced to an unprecedented value of 253.2 W/cm² with a heated area of 10×10 mm², which is a threefold-higher CHF of the plain-mesh structure. Such a significant enhancement of CHF on the micro-grad-mesh wicking structure is due to the accelerated vapor bubble escape driven by the asymmetric surface tension in the gradient liquid channels, which suppresses vapor flooding within the wicking structure, especially under large heat flux input.

FIG. 30C shows the HTC as a function of heat flux for the three mesh wicking structures with a heated area $A_H$ of 10×10 mm². Before the ONB, the HTCs are almost constant and remain at small values for all the tested mesh wicking structures. This is due to the same liquid film evaporation heat transfer mode for the three mesh wicking structures under small heat flux where the HTC is determined by the liquid film thickness and evaporation area. Compared to the plain-mesh structure, the microcavities on mesh wires of the micro-mesh and micro-grad-mesh structures can expand the meniscus area near the tri-phase contact line to increase the liquid-vapor interfacial area for liquid evaporation. Additionally, the larger opening of the gradient channels on the micro-grad-mesh structure can further increase the meniscus area between the mesh wires, resulting in the largest HTC of 53-56.5 kW/m²·K in the liquid film evaporation regime before the ONB. Once nucleate boiling occurs, the HTC increases rapidly until the heated area dries out. Similar to the enhancement of CHF, a largest HTC of 280.7 kW/m²·K is obtained on the micro-grad-mesh structure when compared to the HTCs of 77.4 and 150.5 kW/m²·K on the plain-mesh and micro-mesh structures, respectively. Such an enhanced heat transfer efficiency is attributed to both the additional heat dissipation carried by vapor bubbles and the delayed vapor flooding of dry out. Considering that hotspots vary in size in electronics, the effect of heated area $A_H$ on the CHF $q_{CHF}$ and maximum HTC $h_{max}$, defined as the HTC before surface dry out, is studied for the three example mesh wicking surfaces (FIG. 30D). With the decrease of the heated area from 10×10 mm² to 5×5 mm², the CHF and maximum HTC are significantly increased for all the mesh wicking structures. A largest CHF of 552.7 W/cm² and maximum HTC of 732.5 kW/m²·K are achieved on the micro-grad-mesh wicking structure with a heated area of 5×5 mm². The increased CHF and maximum HTC with the reduced size of the heated area are likely due to the reduction of liquid flow distance from the edges to the center of the heated area, facilitating liquid supply and delaying the dry out.

A Two-Phase Heat Spreader

Intro

Passive two-phase heat spreaders such as heat pipes and vapor chambers, enabled by efficient liquid-vapor phase-change heat transfer processes taking advantage of latent heat but without requiring power input, are attractive due to its high performance but potentially low-cost. However, the passive strategies in common two-phase heat spreaders based on liquid film evaporation are limited by capillary dry-out, a phenomenon that occurs when capillary pumping capability of the wicking structure cannot overcome the viscous flow resistance. A considerable amount of bi-porous wicking structures have been developed to address the conflicting demands on large capillarity and high permeability, however, liquid film evaporation is still limited by the liquid supply and the thermal resistance through the saturated wicking structures. Even for water, the highest performance fluid with high surface energy and high latent heat relative to its viscosity, the CHF and HTC of thin film evaporation are far below the requirements of high power electronics.

In an embodiment, ultra-thin two-phase heat spreaders can be formed using the herein disclosed hybrid mesh wicking structures. Ultra-thin heat spreaders with high conductance and high flux are urgently in need for electronic packaging. The ultra-thin heat spreaders disclosed herein have the same external geometry with a size of L×W×H=50 mm×30 mm×1 mm and they are composed of a 3-layer mesh wicking structure for liquid supply and a grid structure for vapor reflux, which are sandwiched between two pieces of thin copper plates (FIG. 31A). However, other sizes and numbers of layers are also envisioned. The thickness of the mesh wicking structure, grid structure, and copper plates (upper and lower), while not limiting, are 0.24, 0.52, and 0.12 mm, respectively in this test. The assembled chamber (heat spreader) has an evaporation section and a condensation section, namely evaporator and condenser, respectively. Three 3-layer mesh wicking structures studied in the previous section, plain-mesh, micro-mesh and micro-grad-mesh, are integrated to form three two-phase heat spreaders, three examples of which are referred to as HP_plain, HP_micro, and HP_micro-grad, respectively. A copper plate with the same size as the two-phase heat spreaders is also measured for comparison. The heat is input to the evaporator by a DC power supplier with a heated area $A_e$ of 5×5 mm², 8×8 mm², and 10×10 mm², respectively. After spreading, the heat is dissipated by a water cooling loop from the condenser with a cooled area $A_c$ of 25×25 mm². The mesh wicking structure serves as a liquid water flow passage from the condenser to evaporator while the grid structure acts as the vapor reflux channel from the evaporator to condenser. The distance between the centers of the evaporator and condenser is 27.5 mm. The thermal resistance, $R_{HS}=(T_e-T_c)/P_{in}$, and effective thermal conductivity, $k_{eff}=P_{in}L_{ec}/A_{cross}(T_e-T_c)$, are used to evaluate the heat spreading performance along the two-phase heat spreaders, where $T_e$ and $T_c$ are the temperatures at the centers of evaporator and condenser, $P_{in}$, $L_{ec}$, and $A_{cross}$=WH are the heat power input, distance between the centers of evaporator and condenser, and the cross-section area of heat spreaders, respectively. The maximum heat flux input is defined as, $q_{max}=P_{in,max}/A_c$, where $P_{in,max}$ is the maximum heat power input when heat spreader is dry out.

Figure 31:
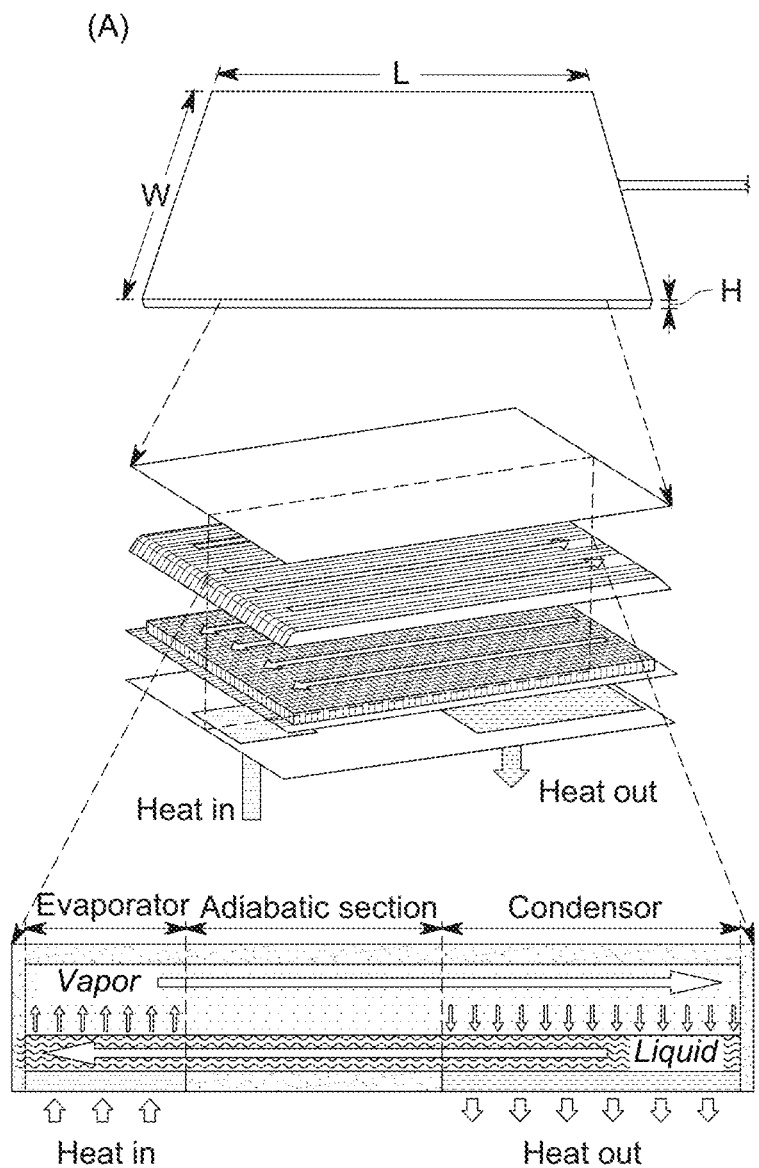
FIG. 31A shows thin heat spreaders with a size of 50 mm$\times$30 mm$\times$1 mm are fabricated to obtain these non-limiting test results.
FIG. 31B shows thermal resistance of heat spreaders $R_HS$ from the evaporator to condenser as a function of heat power input in the evaporator section for different mesh wicking structures.
FIG. 31C shows a comparison of maximum heat flux input and thermal resistance for the HP_micro-grad heat spreader with an evaporator area of $5 \times 5$ mm$^2$, $8 \times 8$ mm$^2$, $10 \times 10$ mm$^2$, respectively.
Figure 31:
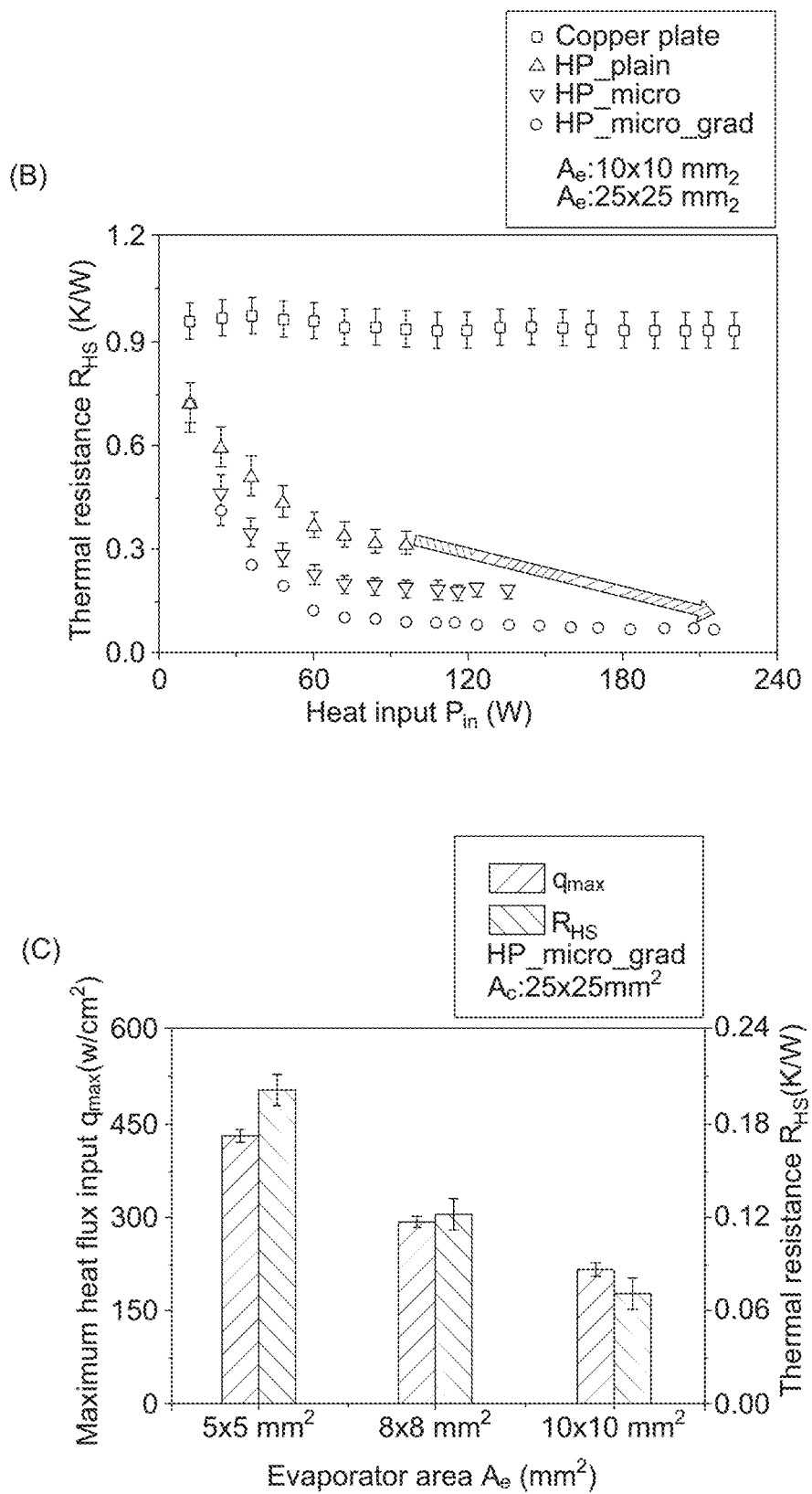

FIG. 31 shows thermal performance of an exemplary two-phase heat spreader. FIG. 31A shows ultra-thin heat spreaders with a size of L×W×H=50 mm×30 mm×1 mm are fabricated to obtain these non-limiting test results. The copper mesh wicking structure serves as the liquid flow passages from the condenser to evaporator. A copper grid structure covered on the mesh wicking structure acts as flow channels for vapor reflux from the evaporator to the condenser. The distance between the centers of evaporator and condenser $L_{ce}$ is 27.5 mm. FIG. 31B shows thermal resistance of heat spreaders $R_{HS}$ from the evaporator to condenser as a function of heat power input $P_{in}$ in the evaporator section for different mesh wicking structures. For two-phase heat spreaders, the thermal resistance is significantly decreased after thin film boiling is activated. The thermal resistance for the ultra-thin heat spreader with micro-grid-mesh wicking structure is only one-tenth of that of a same-size copper plate. FIG. 31C shows a comparison of maximum heat flux input $q_{max}$ and thermal resistance $R_{HS}$ for the HP_micro-grad heat spreader with an evaporator area $A_e$ of 5×5 mm², 8×8 mm², 10×10 mm², respectively.

FIG. 31B shows thermal resistance as a function of heat power input for the example copper plate and two-phase heat spreaders with a heated (evaporator) area $A_e$ of 10×10 mm² and a condenser area $A_c$ of 25×25 mm². Compared to the almost constant thermal resistance of the copper plate, the thermal resistances of all the two-phase heat spreaders decrease rapidly with the increase of heat power input and then slow down before dry out. For two-phase heat spreaders, the dependence of thermal resistance on the heat power input is due to the phase change in the evaporator. Under the small heat input of less than 12 W, pure evaporation heat transfer occurs in all the three heat spreaders, resulting in a similar thermal resistance of 0.7-0.72 K/W due to the heat dissipation through saturated mesh structures with similar thickness. As heat power input increases, the thermal resistance of HP_plain heat spreaders is decreased due to the thinning of water film in the wicking structure. For the HP_micro and HP_micro-grad heat spreaders, the thermal resistances are drastically reduced with the increase of heat input power. Compared to the HP_plain heat spreader, the microcavities on the mesh wires in HP_micro and HP_micro-grad heat spreaders induce efficient nucleate boiling at a smaller heat input and increase the heat transfer efficiency of evaporator, leading to a smaller overall thermal resistance of the heat spreaders. Benefiting from the directional escape of vapor bubble from the wicking structures, a smallest thermal resistance of 0.07-0.1 K/W is sustained with the increase of heat input power from 72 W to 215.8 W for the HP_micro-grad heat spreader. FIG. 31C further compares the effect of evaporator size $A_e$ on the maximum heat flux input $q_{max}$ and thermal resistance $R_{HS}$ for the HP_micro-grad heat spreaders. With the decrease of evaporator area from 10×10 mm² to 5×5 mm², the maximum heat flux input is significantly increased from 215.8 W/cm² to 428.6 W/cm². Again, these examples are exemplary only and non-limiting.

Figure 32:
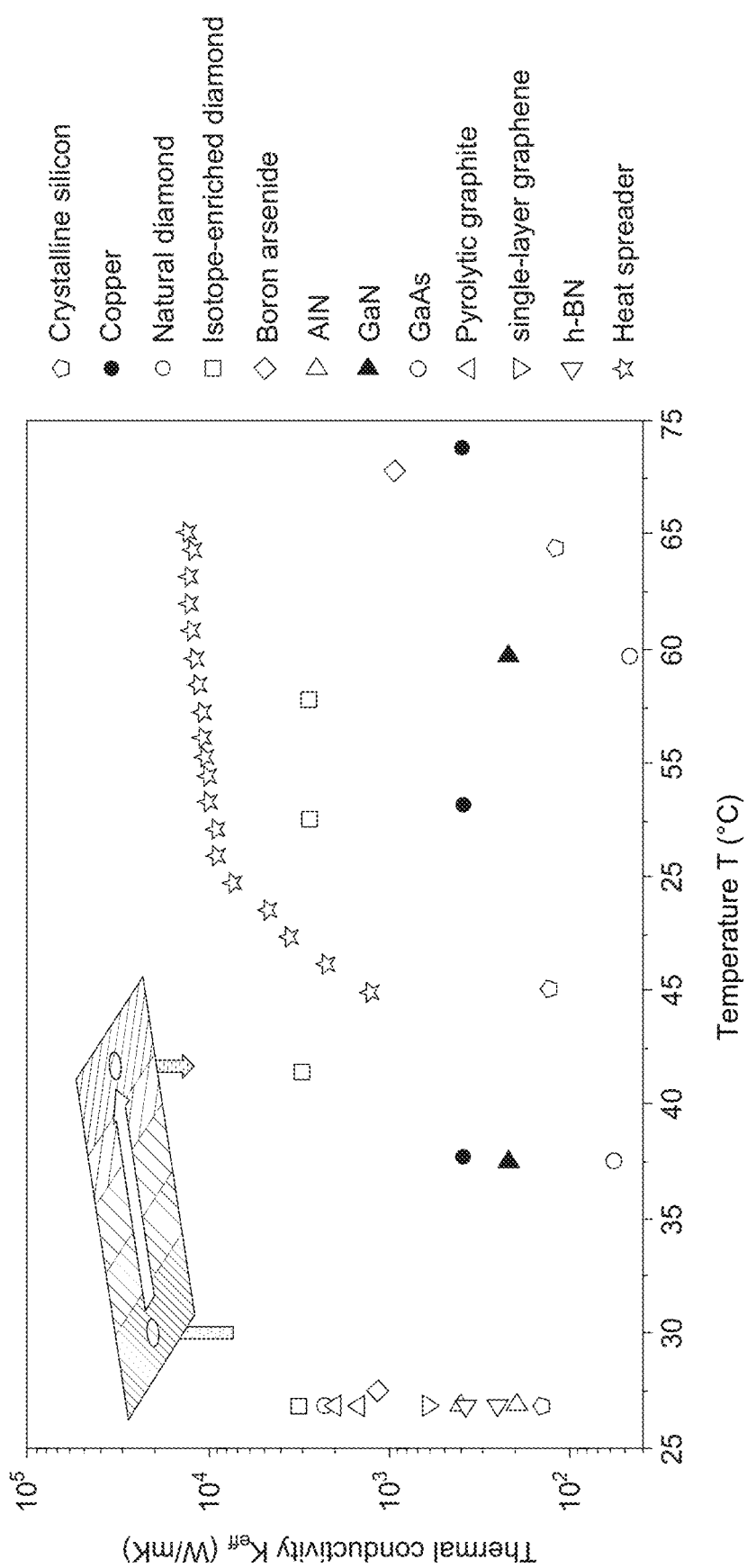
FIG. 32 compares the effective thermal conductivity of HP_micro-grad heat spreaders with other commercially available and potential high-performance heat spreader materials, including crystalline silicon, copper, natural diamond, isotope-enriched diamond, AlN, GaN, GaAs, pyrolytic graphite, graphene, h-BN, and boron arsenide recently discovered.

FIG. 32 compares the effective thermal conductivity of HP_micro-grad heat spreaders with other commercially available and potential high-performance heat spreader materials, including crystalline silicon, copper, natural diamond, isotope-enriched diamond, AlN, GaN, GaAs, pyrolytic graphite, graphene, h-BN and boron arsenide recently discovered. Compared to the solid-state heat spreader materials, the ultra-thin HP_micro-grad heat spreader shows obvious temperature-dependent effective thermal conductivity due to the phase-change heat transfer nature. The exemplary HP-micro-grad heat spreader shows an effective thermal conductivity from 1288.5 W/m·K at 45° C. to 13095.2 W/m·K at 65° C., far exceeding the solid heat spreader materials, such as 391.1 W/m·K of copper at 53.3° C. and 217.5 W/m·K of GaN at 59.7° C. Once the thin film boiling is activated in the HP_micro-grad heat spreader, an ultra-high effective thermal conductivity, larger than 10⁴ W/m·K, can be sustained from 53.3° C. to 65° C., which is even larger than the thermal conductivity of isotope-enriched diamond of 2793.5 W/m·K at 57.7° C.

FIG. 32 shows effective thermal conductivity of two-phase heat spreaders. This chart shows exemplary temperature-dependent effective thermal conductivity of two-phase heat spreaders in comparison with various solid heat spreader materials such as the following: crystalline silicon, copper, natural diamond, isotope-enriched diamond, boron arsenide, AlN, GaN, GaAs, pyrolytic graphite, single-layer graphene, and h-BN.

In summary, an unprecedented enhancement of heat dissipation capability and efficiency is demonstrated with embodiments of the herein-disclosed hybrid mesh wicking structure by realizing capillary-driven thin film boiling heat transfer. Through creating high-density nucleation sites for bubble formation and self-aligned gradient channels for vapor escape, an ultra-high CHF of at least 552 W/cm$^2$ and HTC of 732.5 kW/m$^2$·K can be achieved on a hybrid mesh wicking structure with a heated area of 25 mm$^2$. Alternative CHFs will be possible given alternative heated areas. The integration of hybrid mesh wicking structures into an ultra-thin two-phase heat spreader can provide the capability to spread very high heat flux (e.g., 429 W/cm$^2$ from a hotspot with 25 mm$^2$). Benefiting from the activated thin film boiling at small superheat, the effective thermal conductivity of the heat spreader can reach and exceed than 10$^4$ W/m·K, far exceeding that of any available solid-state heat spreader materials. This demonstration of ultra-high conductance and high flux heat spreaders can be applied to high-power electronics cooling.

Although both the single and multi-layer mesh structures have been described as using thermally conducting materials such as metal, since thermal transport is increased by the new phase-change heat transfer schemes, (e.g., sucking flow condensation and capillary liquid film boiling), less conductive wires could also be used (e.g., polymers and other thermal materials).

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

This work has been financially supported by the National Institute of Food and Agriculture under Grant No. 2017-07652.

What is claimed is:

1. A single-layer mesh system for vapor condensation, the system comprising:
    a woven mesh bonded onto a thermally conducting substrate and having a plurality of nanostructured features to increase condensation nucleation sites;
    an interconnected microchannel formed between the woven mesh and the substrate for the sucking flow of liquid condensate to be removed from the surface; and
    a thin hydrophobic coating covering the surface of the mesh layer and the substrate;
    whereby thermal transport from the vapor outside the mesh to the substrate is increased via sucking flow condensation in a wide range of surface subcooling.

2. The system of claim 1, wherein the mesh is diffusion bonded on the substrate, and the mesh is made of a material selected from copper, brass, bronze, aluminum, and stainless steel.

3. The system of claim 1, wherein the mesh has a diameter of 20-100 µm, and a center-to-center spacing between neighboring parallel mesh wires of 10-500 µm.

4. The system of claim 1, wherein a height of the interconnected microchannel between the woven mesh and the substrate is less than 100 µm.

5. The system of claim 1, wherein the nanostructured features include elongated shapes selected from a sheet, a tube, a pore, and a gap.

6. The system of claim 5, wherein the nanostructured features have a height of larger than 200 nm and a height-to-width ratio of larger than 2.

7. The system of claim 1, wherein the hydrophobic coating has a thickness of 1 nm, 3 nm, 5 nm, 10 nm, 20 nm, 50 nm, or 100 nm.

8. The system of claim 1, wherein the liquid condensate in the interconnected microchannel is drained through the mesh in the form of droplets and a vapor condensation heat transfer on the mesh is increased.

9. A multi-layer mesh system for capillary thin film boiling, the system comprising:
    three or more layers of woven mesh bonded to each other and to a thermally conducting substrate and having a plurality of microstructured features to increase boiling nucleation sites;
    multi-layer interconnected microchannels formed within the three or more layers and between the mesh and the substrate for capillary liquid wicking; and
    microchannels comprising mesh pores in the three or more layers, the mesh pores arranged substantially perpendicularly to a surface of the substrate for vapor to escape from the multi-layer mesh system;
    whereby a critical heat flux and a heat transfer coefficient are increased via capillary liquid film boiling with an onset of nucleate boiling at a small surface superheat.

10. The system of claim 9, wherein the three or more layers are diffusion bonded to each other and diffusion bonded to the thermally conducting substrate, and the woven mesh is made of a material selected from copper, brass, bronze, aluminum, and stainless steel.

11. The system of claim 9, wherein the wires forming the woven mesh have a diameter of 20-100 µm, and a center-to-center spacing between neighboring parallel mesh wires of 10-500 µm.

12. The system of claim 9, wherein there are three to six layers of woven mesh.

13. The system of claim 9, wherein the plurality of microstructured features include a group of shapes selected from a cavity, a pore, and a gap, and the plurality of microstructured features has a height of 1-10 µm, and a height-to-width ratio larger than 2.

14. The system of claim 9, further comprising a hydrophilic coating on at least a portion of the three or more layers.

15. A multi-layer mesh system with gradient channels for capillary liquid film boiling enhancement, the system comprising:
    three or more layers of woven mesh with increasing mesh pore size bonded to each other and to a thermally conducting substrate and having a plurality of microstructured features to increase boiling nucleation sites;
    multi-layer interconnected microchannels formed within the three or more layers and between the mesh and the substrate for capillary liquid wicking; and
    self-aligned gradient microchannels, each gradient microchannel comprising mesh pores of increasing size from the three or more layers, the gradient microchannels arranged substantially perpendicularly to a surface of the substrate to promote vapor escape from the multi-layer mesh system;

whereby a critical heat flux and a heat transfer coefficient are further increased via capillary liquid film boiling enhancement with accelerated vapor escape for delaying surface dry out.

16. The system of claim 15, wherein wires forming the woven mesh have a diameter of 20-100 μm and the mesh wire is spaced by 10-500 μm.

17. The system of claim 15, wherein there are three to six layers of woven mesh.

18. The system of claim 15, wherein the gradient microchannels have an opening angle between 30° and 90°.

19. The system of claim 15, wherein the plurality of microstructured features includes a group of shapes selected from a cavity, a pore, and a gap, and the plurality of microstructured features have a height of 1-10 μm, and a height-to-width ratio larger than 2.

20. The system of claim 15, further comprising a hydrophilic coating on at least a portion of the three or more layers.

* * * * *